US012633651B2

(12) United States Patent
Iimura et al.

(10) Patent No.: US 12,633,651 B2
(45) Date of Patent: May 19, 2026

(54) WIRING BOARD, MODULE, AND IMAGE DISPLAY APPARATUS

(71) Applicant: DAI NIPPON PRINTING CO., LTD., Tokyo-to (JP)

(72) Inventors: Keita Iimura, Tokyo-to (JP); Kazuki Kinoshita, Tokyo-to (JP); Masashi Sakaki, Tokyo-to (JP); Seiji Take, Tokyo-to (JP); Shuji Kawaguchi, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 235 days.

(21) Appl. No.: 18/624,600

(22) Filed: Apr. 2, 2024

(65) Prior Publication Data

US 2024/0258690 A1 Aug. 1, 2024

Related U.S. Application Data

(63) Continuation of application No. PCT/JP2022/037193, filed on Oct. 4, 2022.

(30) Foreign Application Priority Data

| | | |
|---|---|---|
| Oct. 4, 2021 | (JP) | ................................. 2021-163750 |
| Mar. 31, 2022 | (JP) | ................................. 2022-061244 |
| Mar. 31, 2022 | (JP) | ................................. 2022-061304 |

(51) Int. Cl.
 *H05K 1/02* (2006.01)
 *H01Q 1/22* (2006.01)
 (Continued)

(52) U.S. Cl.
 CPC ................. *H01Q 1/38* (2013.01); *H01Q 1/22* (2013.01); *H05K 1/0296* (2013.01); *H05K 1/18* (2013.01);
 (Continued)

(58) Field of Classification Search
 CPC ....... H05K 1/0296; H05K 2201/10098; H05K 2201/0108; H05K 2201/09681
 See application file for complete search history.

(56) References Cited

U.S. PATENT DOCUMENTS

| | | | | |
|---|---|---|---|---|
| 8,570,225 B2 * | 10/2013 | Shoji | ...................... | H01Q 1/243 343/702 |
| 2006/0088690 A1 * | 4/2006 | Arakawa | ................. | B32B 27/08 428/138 |

(Continued)

FOREIGN PATENT DOCUMENTS

| | | |
|---|---|---|
| JP | 2011-066610 A | 3/2011 |
| JP | 5636735 B2 | 12/2014 |

(Continued)

OTHER PUBLICATIONS

Apr. 9, 2024 International Preliminary Report on Patentability issued in International Patent Application No. PCT/JP2022/037193.
Dec. 13, 2022 International Search Report issued in International Patent Application No. PCT/JP2022/037193.

*Primary Examiner* — Sherman Ng
(74) *Attorney, Agent, or Firm* — Oliff PLC

(57) ABSTRACT

A wiring board includes a substrate and a mesh wiring layer and has an electromagnetic wave transceiver function. The substrate is transparent. The mesh wiring layer serves as an antenna and includes a wiring line. Two or more opening portions are formed by being surrounded by the wiring line. A planar shape of each opening portion is polygonal that has opposing sides parallel with each other. 95% or more opening portions among 100 opening portions or all of the opening portions satisfy a relationship of $0.70D \le d \le 0.98D$ or satisfy a relationship of $1.02D \le d \le 1.30D$, where d is distances between sides that extend in a first direction regarding the opening portions, and D is an average value of the distances between the sides that extend in the first direction (Continued)

regarding the 100 opening portions continuously adjacent to each other or all of the opening portions.

19 Claims, 34 Drawing Sheets

(51) Int. Cl.
    *H01Q 1/38*        (2006.01)
    *H05K 1/18*        (2006.01)

(52) U.S. Cl.
    CPC .............. *H05K 2201/09781* (2013.01); *H05K 2201/10098* (2013.01); *H05K 2201/10128* (2013.01)

(56) References Cited

U.S. PATENT DOCUMENTS

| | | | |
|---|---|---|---|
| 2017/0199412 A1* | 7/2017 | Suto ......................... | H05K 1/02 |
| 2019/0235672 A1* | 8/2019 | Ichiki ................... | G06F 3/0446 |

FOREIGN PATENT DOCUMENTS

| | | | |
|---|---|---|---|
| JP | 5695947 | B2 | 4/2015 |
| JP | 2016-81257 | A | 5/2016 |
| WO | 2019/107476 | A1 | 6/2019 |

* cited by examiner 24a　21a　24a

20

23　23

23　23　23

240

210

23　23　23

240　210　240　210

WIRING BOARD, MODULE, AND IMAGE DISPLAY APPARATUS

TECHNICAL FIELD

An embodiment of the present disclosure relates to a wiring board, a module, and an image display apparatus.

BACKGROUND ART

Mobile terminal devices such as a smart phone and a tablet are currently being developed for higher functionality, smaller sizes, thinner bodies, and lighter weights. These mobile terminal devices use multiple communication bands. For this reason, multiple antennas that support the communication bands are needed. For example, a mobile terminal device includes multiple antennas such as a telephone antenna, a WiFi (Wireless Fidelity) antenna, a 3G (Generation) antenna, a 4G (Generation) antenna, a LTE (Long Term Evolution) antenna, a Bluetooth (registered trademark) antenna, and a NFC (Near Field Communication) antenna. However, since the mobile terminal device has a smaller size, a space in which the antennas are installed is limited, and the degree of freedom of antenna design reduces. Since the antennas are contained in the limited space, radio wave sensitivity is not necessarily satisfactory.

For this reason, a film antenna that can be installed in a display region of a mobile terminal device is developed. The film antenna is a transparent antenna that is obtained by forming an antenna pattern on a transparent base material. The antenna pattern is formed by using a conductive mesh layer in the form of mesh. The conductive mesh layer includes a conductive portion that serves as a formation portion for an opaque conductive layer and a large number of opening portions that serve as non-formation portions.

CITATION LIST

Patent Literature

Patent Literature 1: Japanese Unexamined Patent Application Publication No. 2011-66610
Patent Literature 2: Japanese Patent No. 5636735
Patent Literature 3: Japanese Patent No. 5695947

An existing film antenna has a region in which an antenna pattern is formed on a transparent base material and a region in which no antenna pattern is formed. As for, for example, a mobile terminal device that includes the film antenna, however, there is a possibility that the period of a conductive mesh layer (the antenna pattern) and the period of a pixel interfere with each other, and consequently, a stripe pattern (a moire pattern, or interference stripes) is formed. As for, for example, the mobile terminal device in the case where the moire pattern is thus formed, there is a possibility that the visibility of an image reduces.

It is thought that the periodicity of the antenna pattern is eliminated to remove the moire pattern. In the case where the periodicity of the antenna pattern is eliminated, however, there is a possibility that the directions of wiring lines are changed into various directions, and flicker due to light reflection occurs.

It is an object of the present embodiment to provide a wiring board, a module, and an image display apparatus that reduce the formation of a moire pattern and that enables flicker due to reflected light to be reduced.

The present embodiment also provides a wiring board, a module, and an image display apparatus that enable both of the formation of a moire pattern and the occurrence of flicker to be reduced.

SUMMARY OF INVENTION

According to a first aspect of the present disclosure, a wiring board includes a substrate that has a first surface and a second surface that is opposite the first surface, and a mesh wiring layer that is disposed on the first surface of the substrate. The wiring board has an electromagnetic wave transceiver function. The substrate is transparent. The mesh wiring layer serves as an antenna and includes a wiring line. Two or more opening portions are formed by being surrounded by the wiring line. A planar shape of each of the opening portions is a polygonal shape that has opposing sides parallel with each other. 95% or more opening portions among 100 opening portions or all of the opening portions
satisfy a relationship of
$0.70D \leq d \leq 0.98D$ or
satisfy a relationship of
$1.02D \leq d \leq 1.30D$, where
d is distances between sides that extend in a first direction regarding the opening portions, and D is an average value of the distances between the sides that extend in the first direction regarding the 100 opening portions continuously adjacent to each other or all of the opening portions.

According to a second aspect of the present disclosure, the 95% or more opening portions among the 100 opening portions or all of the opening portions
may satisfy a relationship of
$0.85D \leq d \leq 0.98D$ or
may satisfy a relationship of
$1.02D \leq d \leq 1.15D$,
as for the wiring board according to the first aspect described above.

According to a third aspect of the present disclosure, the 95% or more opening portions among the 100 opening portions or all of the opening portions
may satisfy a relationship of
$0.90D \leq d \leq 0.98D$ or
may satisfy a relationship of
$1.02D \leq d \leq 1.10D$,
as for the wiring board according to the first aspect described above or the second aspect described above.

According to a fourth aspect of the present disclosure, the polygonal shape may be a quadrilateral shape, as for the wiring board according to any one of the first aspect described above to the third aspect described above.

According to a fifth aspect of the present disclosure, the polygonal shape may be a hexagonal shape, as for the wiring board according to any one of the first aspect described above to the third aspect described above.

According to a sixth aspect of the present disclosure, the average value D may be 50 µm or more and 500 µm or less, as for the wiring board according to any one of the first aspect described above to the fifth aspect described above.

According to a seventh aspect of the present disclosure, a linewidth of the wiring line may be 0.5 µm or more and 3 µm or less, as for the wiring board according to any one of the first aspect described above to the sixth aspect described above.

According to an eighth aspect of the present disclosure, an aperture ratio of the mesh wiring layer as a whole may be 95% or more and less than 100%, as for the wiring board according to any one of the first aspect described above to the seventh aspect described above.

According to a ninth aspect of the present disclosure, a sheet resistance value of the mesh wiring layer may be $4\Omega/\square$ or less, as for the wiring board according to any one of the first aspect described above to the eighth aspect described above.

According to a tenth aspect of the present disclosure, the wiring board may have a millimeter wave transceiver function, and the mesh wiring layer may serve as an array antenna that includes two or more antenna elements, as for the wiring board according to any one of the first aspect described above to the ninth aspect described above.

According to an eleventh aspect of the present disclosure, four or more of the antenna elements may be provided, and distances between the antenna elements may be 1 mm or more and 5 mm or less, as for the wiring board according to the tenth aspect described above.

According to a twelfth aspect of the present disclosure, a dummy wiring layer that is electrically separated from the mesh wiring layer may be provided around the mesh wiring layer, as for the wiring board according to any one of the first aspect described above to the eleventh aspect described above.

According to a thirteenth aspect of the present disclosure, the dummy wiring layer may include two or more dummy wiring lines, and the dummy wiring lines may be parallel with the wiring line, as for the wiring board according to the twelfth aspect described above.

According to a fourteenth aspect of the present disclosure, two or more of the dummy wiring layers may be provided, and aperture ratios of the mesh wiring layer and the dummy wiring layers may increase stepwise in order from the mesh wiring layer to the dummy wiring layers far from the mesh wiring layer, as for the wiring board according to the twelfth aspect described above or the thirteenth aspect described above.

According to a fifteenth aspect of the present disclosure, a wiring board includes a substrate that has a first surface and a second surface that is opposite the first surface, a mesh wiring layer that is disposed on the first surface of the substrate, and a power supply portion that is electrically connected to the mesh wiring layer. The substrate is transparent. The mesh wiring layer includes a transmission portion that is connected to the power supply portion and a transceiver portion that is connected to the transmission portion. The mesh wiring layer includes a wiring line that serves as the transmission portion and the transceiver portion. Two or more opening portions are formed by being surrounded by the wiring line. A planar shape of each of the opening portions is a polygonal shape that has opposing sides parallel with each other. 95% or more opening portions among 100 opening portions or all of the opening portions satisfy a relationship of $0.70D \leq d \leq 0.98D$ or satisfy a relationship of $1.02D \leq d \leq 1.30D$, where d is distances between sides that extend in a first direction regarding the opening portions, and D is an average value of the distances between the sides that extend in the first direction regarding the 100 opening portions continuously adjacent to each other or all of the opening portions.

According to a sixteenth aspect of the present disclosure, a module includes the wiring board according to any one of the first aspect described above to the fifteenth aspect described above, and a power supply line that is electrically connected to the wiring board.

According to a seventeenth aspect of the present disclosure, an image display apparatus includes the module according to the sixteenth aspect described above, and a display device that is stacked with the wiring board of the module.

According to an eighteenth aspect of the present disclosure, a wiring board includes a substrate that has a first surface and a second surface that is opposite the first surface, and a mesh wiring layer that is disposed on the first surface of the substrate. The wiring board has an electromagnetic wave transceiver function. The substrate is transparent. The mesh wiring layer serves as an antenna and includes multiple first wiring lines and multiple second wiring lines that intersect with the first wiring lines. Nine or more intersection points A among ten intersection points A nearest to respective ten intersection points B satisfy at least a relationship of $0.02D_X \leq d_X < 0.3D_X$ or a relationship of $0.02D_Y \leq d_Y < 0.3D_Y$, where A is intersection points between the first wiring lines and the second wiring lines, B is intersection points between first regression lines that are obtained from the multiple intersection points A that are located on the respective first wiring lines and second regression lines that are obtained from the multiple intersection points A that are located on the respective second wiring lines, $d_X$ is distances from the intersection points A to the nearest intersection points B in a width direction of the mesh wiring layer, $d_Y$ is distances from the intersection points A to the nearest intersection points B in a longitudinal direction of the mesh wiring layer, $D_X$ is an average value of pitches of the ten intersection points B continuously adjacent to each other in the width direction, and $D_Y$ is an average value of pitches of the ten intersection points B continuously adjacent to each other in the longitudinal direction.

According to a nineteenth aspect of the present disclosure, the nine or more intersection points A among the ten intersection points A nearest to the respective ten intersection points B may satisfy a relationship of $0.02D_X \leq d_X < 0.3D_X$ and a relationship of $0.02D_Y \leq d_Y < 0.3D_Y$, as for the wiring board according to the eighteenth aspect described above.

According to a twentieth aspect of the present disclosure, the average value $D_X$ and the average value $D_Y$ may be 50 µm or more and 500 µm or less, as for the wiring board according to the eighteenth aspect described above or the nineteenth aspect described above.

According to a twenty-first aspect of the present disclosure, linewidths of the first wiring lines and linewidths of the second wiring lines may be 0.5 µm or more and 3 µm or less, as for the wiring board according to any one of the eighteenth aspect described above to the twentieth aspect described above.

According to a twenty-second aspect of the present disclosure, an aperture ratio of the mesh wiring layer as a whole may be 95% or more and less than 100%, as for the wiring board according to any one of the eighteenth aspect described above to the twenty-first aspect described above.

According to a twenty-third aspect of the present disclosure, a sheet resistance value of the mesh wiring layer may be 4Ω/□ or less, as for the wiring board according to any one of the eighteenth aspect described above to the twenty-second aspect described above.

According to a twenty-fourth aspect of the present disclosure, angles that are formed between the first regression lines and the second regression lines may be 30° or more and 150° or less, as for the wiring board according to any one of the eighteenth aspect described above to the twenty-third aspect described above.

According to a twenty-fifth aspect of the present disclosure, the wiring board may have a millimeter wave transceiver function, and the mesh wiring layer may serve as an array antenna that includes two or more antenna elements, as for the wiring board according to any one of the eighteenth aspect described above to the twenty-fourth aspect described above.

According to a twenty-sixth aspect of the present disclosure, four or more of the antenna elements may be provided, and distances between the antenna elements may be 1 mm or more and 5 mm or less, as for the wiring board according to the twenty-fifth aspect described above.

According to a twenty-seventh aspect of the present disclosure, a dummy wiring layer that is electrically separated from the mesh wiring layer may be provided around the mesh wiring layer, as for the wiring board according to any one of the eighteenth aspect described above to the twenty-sixth aspect described above.

According to a twenty-eighth aspect of the present disclosure, the dummy wiring layer may include multiple dummy wiring lines, and the dummy wiring lines may be parallel with the first wiring lines or the second wiring lines, as for the wiring board according to the twenty-seventh aspect described above.

According to a twenty-ninth aspect of the present disclosure, a plurality of the dummy wiring layers may be provided, and aperture ratios of the mesh wiring layer and the dummy wiring layers may increase stepwise in order from the mesh wiring layer to the dummy wiring layers far from the mesh wiring layer, as for the wiring board according to the twenty-seventh aspect described above or the twenty-eighth aspect described above.

According to a thirtieth aspect of the present disclosure, the wiring board according to any one of the eighteenth aspect described above to the twenty-ninth aspect described above may further include a power supply portion that is electrically connected to the mesh wiring layer. The mesh wiring layer may include a transmission portion that is connected to the power supply portion and a transceiver portion that is connected to the transmission portion. The transceiver portion may include a central portion and an edge portion that is located around the central portion. The distances $d_X$ at the edge portion may be shorter than the distances $d_X$ at the central portion. The distances $d_Y$ at the edge portion may be shorter than the distances $d_Y$ at the central portion.

According to a thirty-first aspect of the present disclosure, the distances $d_X$ at the edge portion may be 20% or more and 80% or less of the distances $d_X$ at the central portion, and the distances $d_Y$ at the edge portion may be 20% or more and 80% or less of the distances $d_Y$ at the central portion, as for the wiring board according to the thirtieth aspect described above.

According to a thirty-second aspect of the present disclosure, a 50% or more region of the central portion near the transmission portion may be surrounded by the edge portion in the longitudinal direction, as for the wiring board according to the thirtieth aspect described above or the thirty-first aspect described above.

According to a thirty-third aspect of the present disclosure, a width of the edge portion may be equal to or more than 2 times the average value $D_X$ at the central portion, as for the wiring board according to any one of the thirtieth aspect described above to the thirty-second aspect described above.

According to a thirty-fourth aspect of the present disclosure, a wiring board includes a substrate that has a first surface and a second surface that is opposite the first surface, and a mesh wiring layer that is disposed on the first surface of the substrate. The substrate is transparent. The mesh wiring layer includes a transmission portion that is connected to the power supply portion and a transceiver portion that is connected to the transmission portion. The mesh wiring layer includes first wiring lines and second wiring lines that serve as the transmission portion and the transceiver portion. Nine or more intersection points A among ten intersection points A nearest to respective ten intersection points B satisfy at least a relationship of
$0.02D_X{\leq}d_X{<}0.3D_X$ or
a relationship of
$0.02D_Y{\leq}d_Y{<}0.3D_Y$, where
A is intersection points between the first wiring lines and the second wiring lines,
B is intersection points between first regression lines that are obtained from the multiple intersection points A that are located on the respective first wiring lines and second regression lines that are obtained from the multiple intersection points A that are located on the respective second wiring lines,
$d_X$ is distances from the intersection points A to the nearest intersection points B in a width direction of the mesh wiring layer,
$d_Y$ is distances from the intersection points A to the nearest intersection points B in a longitudinal direction of the mesh wiring layer,
$D_X$ is an average value of pitches of the ten intersection points B continuously adjacent to each other in the width direction, and
$D_Y$ is an average value of pitches of the ten intersection points B continuously adjacent to each other in the longitudinal direction.

According to a thirty-fifth aspect of the present disclosure, a module includes the wiring board according to any one of the eighteenth aspect described above to the thirty-fourth aspect described above, and a power supply line that is electrically connected the wiring board.

According to a thirty-sixth aspect of the present disclosure, an image display apparatus includes the module according to the thirty-fifth aspect described above, and a display device that is stacked with the wiring board of the module.

According to a thirty-seventh aspect of the present disclosure, the display device may include multiple pixels that are repeatedly arranged in the width direction and the longitudinal direction. The average value $D_X$ may be equal to or less than (N−0.05) times (N is a natural number), or equal to or more than (N+0.05) times pitches of the pixels in the width direction. The average value $D_Y$ may be equal to or less than (M−0.05) times (M is a natural number), or equal to or more than (M+0.05) times pitches of the pixels in the longitudinal direction, as for the image display apparatus according to the thirty-sixth aspect described above.

According to a thirty-eighth aspect of the present disclosure, the average value $D_X$ may be equal to or more than (N−0.2) times and equal to or less than (N−0.05) times, or equal to or more than (N+0.05) times and equal to or less than (N+0.2) times the pitches of the pixels in the width direction, as for the image display apparatus according to the thirty-seventh aspect described above.

According to a thirty-ninth aspect of the present disclosure, the average value $D_Y$ may be equal to or more than (M−0.2) times and equal to or less than (M−0.05) times, or equal to or more than (M+0.05) times and equal to or less than (M+0.2) times the pitches of the pixels in the longitudinal direction, as for the image display apparatus according to the thirty-seventh aspect described above or the thirty-eighth aspect described above.

According to a fortieth aspect of the present disclosure, N and M may be a natural number of 1 or more and 6 or less, as for the image display apparatus according to any one of the thirty-seventh aspect described above to the thirty-ninth aspect described above.

According to a forty-first aspect of the present disclosure, a wiring board includes a substrate, and a mesh wiring layer that is disposed on the substrate. The substrate is transparent. The mesh wiring layer includes multiple intersection points and wiring lines that are located between the intersection points. An opening portion is formed by being surrounded by the wiring lines. Regarding each of the multiple wiring lines that surround the opening portion, when a ratio of a length of the wiring line between the intersection points to a minimum distance between the intersection points is obtained, an average value thereof is 1.01 times or more and 1.82 times or less. Being transparent means that the transmittance of light that has a wavelength of 400 nm or more and 700 nm or less is 85% or more.

According to a forty-second aspect of the present disclosure, linewidths of the wiring lines may be 0.1 μm or more and 5.0 μm or less, as for the wiring board according to the forty-first aspect described above.

According to a forty-third aspect of the present disclosure, a planar shape of each of the wiring lines may be a sine curve, as for the wiring board according to the forty-first aspect described above or the forty-second aspect described above.

According to a forty-fourth aspect of the present disclosure, an aperiodic planar structure that the mesh wiring layer has may be a Voronoi pattern, as for the wiring board according to any one of the forty-first aspect described above to the forty-third aspect described above.

According to a forty-fifth aspect of the present disclosure, in the aperiodic planar structure that the mesh wiring layer has, intersection points that are periodically arranged may be randomly shifted in various directions at a distance shorter than a predetermined distance, as for the wiring board according to any one of the forty-first aspect described above to the forty-third aspect described above.

According to a forty-sixth aspect of the present disclosure, an aperture ratio of the mesh wiring layer as a whole may be 96% or more and less than 100%, as for the wiring board according to any one of the forty-first aspect described above to the forty-fifth aspect described above.

According to a forty-seventh aspect of the present disclosure, a dummy wiring layer that is electrically separated from the mesh wiring layer may be provided around the mesh wiring layer, as for the wiring board according to any one of the forty-first aspect described above to the forty-sixth aspect described above.

According to a forty-eighth aspect of the present disclosure, a module includes the wiring board according to any one of the forty-first aspect described above to the forty-seventh aspect described above, and a power supply line that is electrically connected to the wiring board.

According to a forty-ninth aspect of the present disclosure, an image display apparatus includes the module according to the forty-eighth aspect described above.

According to a fiftieth aspect of the present disclosure, the mesh wiring layer may function as an antenna, as for the image display apparatus according to the forty-ninth aspect described above.

According to a fifty-first aspect of the present disclosure, the wiring board may further include a power supply portion that is electrically connected to the mesh wiring layer, and the mesh wiring layer may include a transmission portion that is connected to the power supply portion and a transceiver portion that is connected to the transmission portion, as for the image display apparatus according to the forty-ninth aspect described above or the fiftieth aspect described above.

According to an embodiment of the present disclosure, the formation of a moire pattern is reduced, and flicker due to reflected light can be reduced.

In addition, according to an embodiment according to the present disclosure, both of the formation of the moire pattern and the occurrent of the flicker can be reduced.

DESCRIPTION OF EMBODIMENTS

First Embodiment

A first embodiment will now be described with reference to FIG. 1 to FIG. 9. FIG. 1 to FIG. 9 illustrate the present embodiment.

The figures described below are schematically illustrated. For this reason, the sizes and shapes of components are appropriately exaggerated to make understanding easy. Modifications can be appropriately made without departing from a technical idea. In the figures described below, like components are designated by using like reference signs, and a detailed description is omitted in some cases. Material names and numerals such as dimensions of members described in the present specification are examples according to embodiments, are not limited thereto, and can be appropriately selected and used. In the present specification, words such as parallel, perpendicular, and vertical that specify shapes or geometrical conditions can be interpreted as substantially the same meaning in addition to strict meaning.

In the embodiments described below, an "X-direction" is a direction parallel with a side of an image display apparatus. A "Y-direction" is a direction perpendicular to the X-direction and parallel with another side of the image display apparatus. A "Z-direction" is a direction perpendicular to both of the X-direction and the Y-direction and parallel with the thickness direction of the image display apparatus. A "front surface" means a surface in a positive Z-direction that corresponds to a light emission surface of the image display apparatus that faces an observer. A "back surface" means a surface in a negative Z-direction that is opposite the light emission surface of the image display apparatus that faces the observer. In an example described according to the present embodiment, mesh wiring layers 20 have a radio wave transceiver function (that is, functions as an antenna). However, the mesh wiring layers 20 may not have the radio wave transceiver function.

The structure of the image display apparatus according to the present embodiment will be described with reference to FIG. 1 and FIG. 2.

Figure 1:
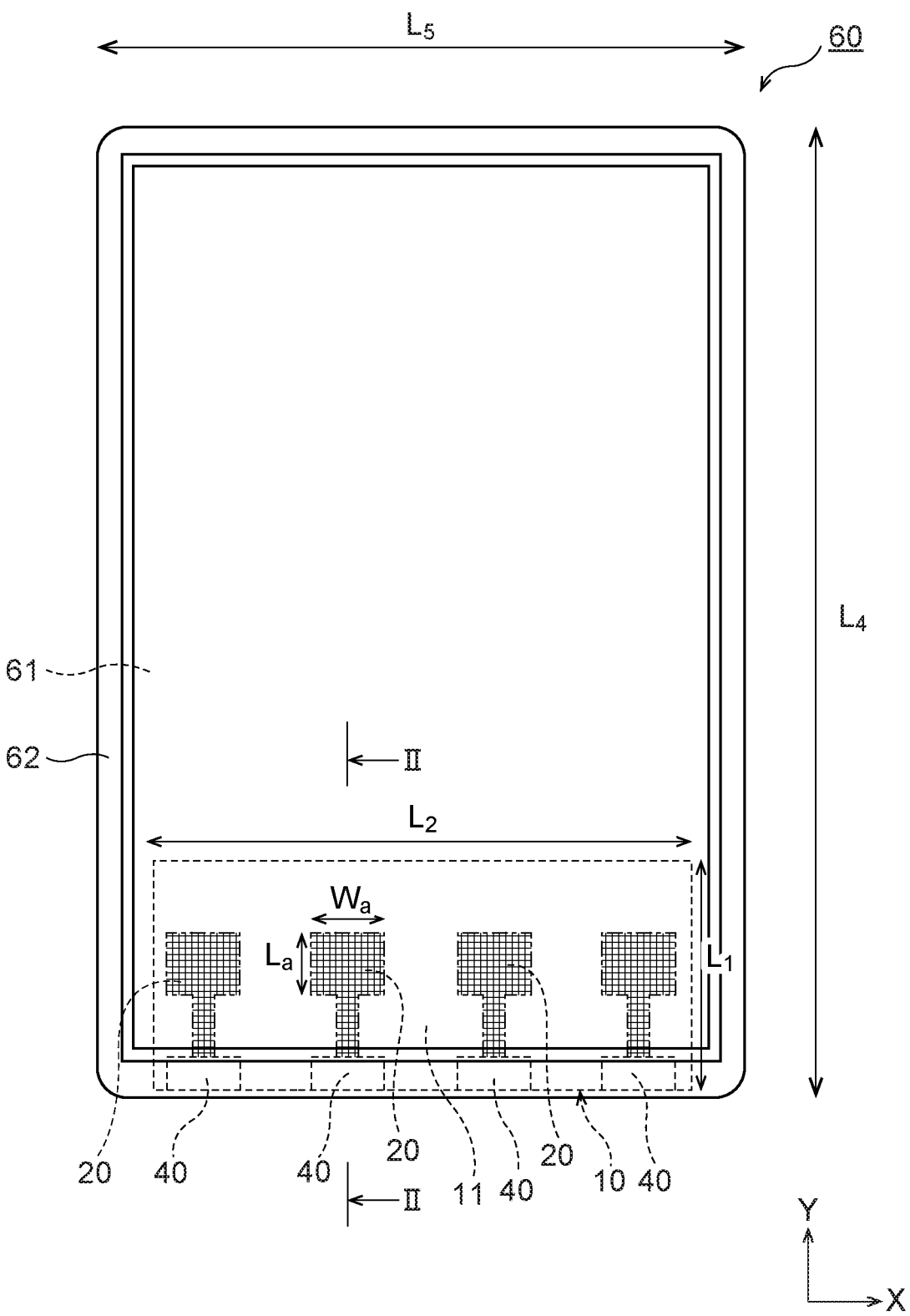
FIG. 1 is a plan view of an image display apparatus according to a first embodiment.
Figure 2:
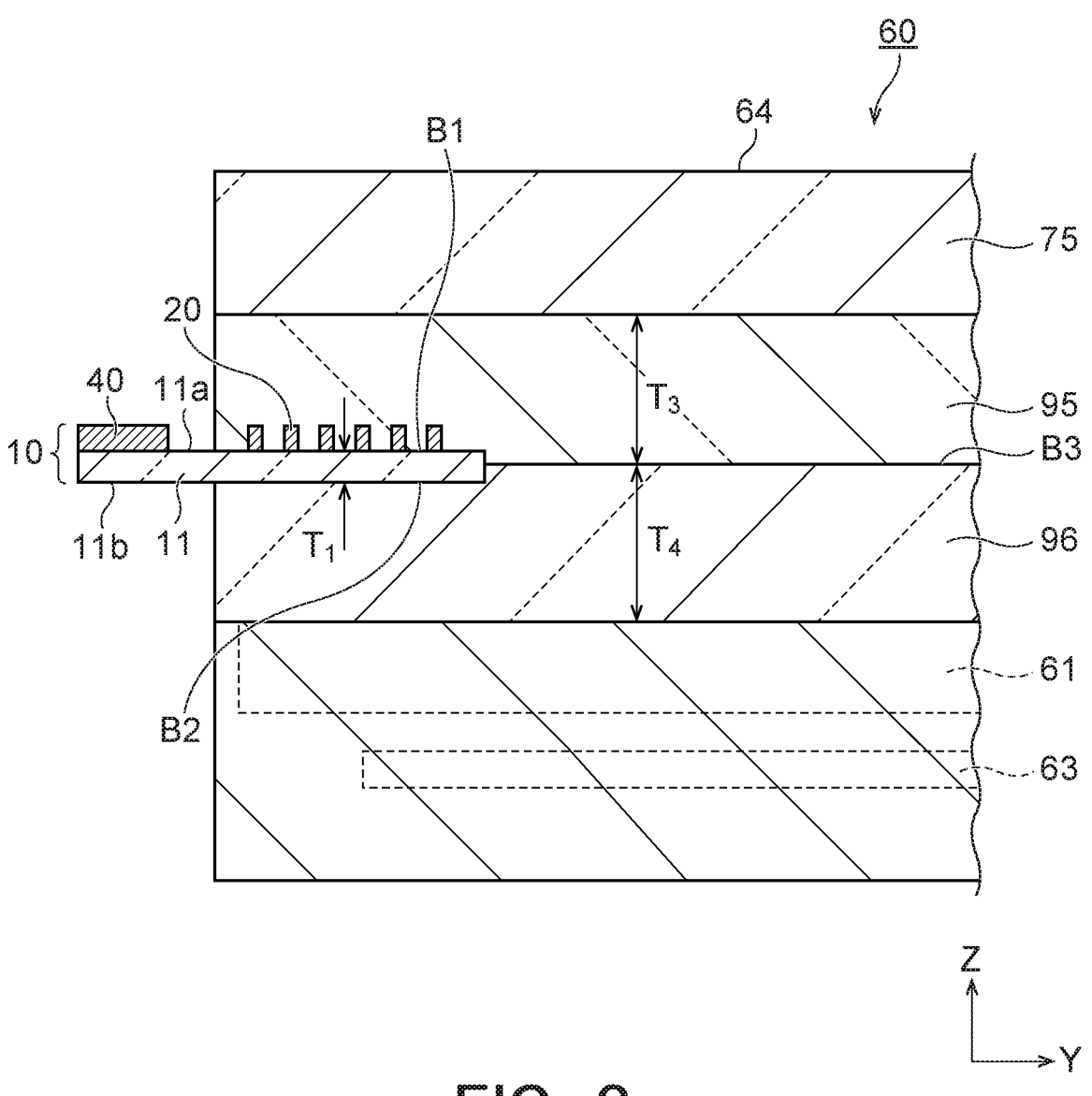
FIG. 2 is a sectional view (a sectional view taken along line II-II in FIG. 1) of the image display apparatus according to the first embodiment.

As illustrated in FIG. 1 and FIG. 2, an image display apparatus 60 according to the present embodiment includes a wiring board 10 and a display device 61 that is stacked with the wiring board 10.

The wiring board 10 includes a substrate 11, the mesh wiring layers 20, and power supply portions 40. As illustrated in FIG. 2, the substrate 11 has a first surface 11*a* and a second surface 11*b* that is opposite the first surface 11*a*. The number of the mesh wiring layers 20 that are disposed on the first surface 11*a* of the substrate 11 is two or more (multiple). The power supply portions 40 are electrically connected to the respective mesh wiring layers 20. A communication module 63 is disposed in the negative Z-direction with respect to the display device 61. An image display apparatus multilayer body 70, the display device 61, and the communication module 63 are contained in a housing 62.

The image display apparatus 60 illustrated in FIG. 1 and FIG. 2 can transmit and receive a radio wave at a predetermined frequency and enables communication by using the communication module 63. The communication module 63 may include an antenna such as a millimeter wave antenna, a telephone antenna, a WiFi antenna, a 3G antenna, a 4G antenna, a 5G antenna, a LTE antenna, a Bluetooth (registered trademark) antenna, or a NFC antenna. Examples of the image display apparatus 60 can include mobile terminal devices such as a smart phone and a tablet.

As illustrated in FIG. 2, the image display apparatus 60 has a light emission surface 64. The image display apparatus 60 includes the wiring board 10 that is nearer than the display device 61 to the light emission surface 64 (that is, in the positive Z-direction) and the communication module 63 that is nearer than the display device 61 to a surface opposite the light emission surface 64 (that is, in the negative Z-direction).

For example, the display device 61 includes an organic EL (Electro Luminescence) display device. The display device 61 includes multiple pixels P (see FIG. 3) that are repeatedly arranged in a first direction (for example, the Y-direction) and a second direction (for example, the X-direction). The pixels P will be described in detail later.

For example, the display device 61 may include a metal layer, a support base material, a resin base material, a thin film transistor (TFT), and an organic EL layer, not illustrated. A touch sensor, not illustrated, may be disposed on the display device 61. The wiring board 10 is disposed along the display device 61 with a second transparent adhesive layer 96 interposed therebetween. The display device 61 is not limited to an organic EL display device. For example, the display device 61 may be another display device that has a function of exhibiting luminescence itself or a micro LED display device that includes a micro LED element. The display device 61 may be a liquid-crystal display device that contains liquid crystal.

Cover glass 75 is disposed along the wiring board 10 with a first transparent adhesive layer 95 interposed therebetween. A decorative film and a polarizer, not illustrated, may be disposed between the first transparent adhesive layer 95 and the cover glass 75.

The first transparent adhesive layer 95 directly or indirectly sticks the wiring board 10 to the cover glass 75. The first transparent adhesive layer 95 faces the first surface 11a of the substrate 11. The first transparent adhesive layer 95 has optical transparency and may be an OCA (Optical Clear Adhesive) layer. The OCA layer is manufactured, for example, in the following manner. A curable adhesive layer composition liquid that contains a polymerizable compound is first applied to a releasing film such as polyethylene terephthalate (PET). Subsequently, this is cured by using, for example, ultraviolet (UV) rays, and consequently, an OCA sheet is obtained. The OCA sheet is stuck to an object, the releasing film is subsequently separated and removed, and consequently, the OCA layer described above is obtained. Examples of the material of the first transparent adhesive layer 95 may include acrylic resin, silicone resin and urethane resin. In particular, the first transparent adhesive layer 95 may contain acrylic resin. In this case, the second transparent adhesive layer 96 preferably contains acrylic resin. Consequently, the refractive index of the first transparent adhesive layer 95 and the refractive index of the second transparent adhesive layer 96 do not substantially differ from each other, and visible light can be inhibited from reflecting off an interface B3 between the first transparent adhesive layer 95 and the second transparent adhesive layer 96 with certainty.

As for the first transparent adhesive layer 95, the transmittance of visible light may be 85% or more and is preferably 90% or more. The upper limit of the transmittance of visible light in the first transparent adhesive layer 95 is not particularly limited but may be, for example, 100% or less. When the transmittance of visible light in the first transparent adhesive layer 95 ranges as described above, the transparency of the image display apparatus multilayer body 70 is enhanced, and the display device 61 of the image display apparatus 60 can be likely to be visible. Visible light means light that has a wavelength of 400 nm or more and 700 nm or less. The transmittance of visible light being 85% or more means that when absorbance is measured as for a member to be measured (for example, the first transparent adhesive layer 95), the transmittance thereof is 85% or more at any wavelength in the entire range of a wavelength of 400 nm or more and 700 nm or less. The absorbance can be measured by using a known spectrophotometer (such as V-670 made by JASCO Corporation).

The wiring board 10 is disposed nearer than the display device 61 to the light emission surface 64 as described above. In this case, the wiring board 10 is located between the first transparent adhesive layer 95 and the second transparent adhesive layer 96. More specifically, a region of the substrate 11 of the wiring board 10 is located in a region between the first transparent adhesive layer 95 and the second transparent adhesive layer 96. In this case, the areas of the first transparent adhesive layer 95, the second transparent adhesive layer 96, the display device 61, and the cover glass 75 are larger than that of the substrate 11 of the wiring board 10. The substrate 11 of the wiring board 10 is not disposed over the entire surface of the image display apparatus 60 but is thus disposed in the region in a plan view, and consequently, the image display apparatus 60 can be thinned as a whole.

The wiring board 10 includes the substrate 11 that is transparent and the mesh wiring layers 20 that are disposed on the first surface 11a of the substrate 11 as described above. The two or more (multiple) mesh wiring layers 20 are disposed on the first surface 11a of the substrate 11 so as to be separated from each other. The power supply portions 40 are electrically connected to the mesh wiring layers 20. The power supply portions 40 are electrically connected to the communication module 63 with power supply lines, not illustrated, interposed therebetween. A portion of the wiring board 10 is not disposed between the first transparent adhesive layer 95 and the second transparent adhesive layer 96 but protrudes outward from a position between the first transparent adhesive layer 95 and the second transparent adhesive layer 96 (that is, in the negative Y-direction). Specifically, a region of the wiring board 10 in which the power supply portions 40 are provided protrudes outward. This readily enables the power supply portions 40 and the communication module 63 to be electrically connected to each other. A region of the wiring board 10 in which mesh wiring layers 20 are provided is located between the first transparent adhesive layer 95 and the second transparent adhesive layer 96. The wiring board 10 will be described in detail later.

The second transparent adhesive layer 96 directly or indirectly sticks the display device 61 to the wiring board 10. The second transparent adhesive layer 96 faces the second surface 11b of the substrate 11. The second transparent adhesive layer 96 has optical transparency and may be an OCA (Optical Clear Adhesive) layer as in the first transparent adhesive layer 95. Examples of the material of the second transparent adhesive layer 96 may include acrylic resin, silicone resin, and urethane resin. In particular, the second transparent adhesive layer 96 may contain acrylic resin. Consequently, the refractive index of the first transparent adhesive layer 95 and the refractive index of the second transparent adhesive layer 96 do not substantially differ from each other, and visible light can be inhibited from reflecting off the interface B3 between the first transparent adhesive layer 95 and the second transparent adhesive layer 96 with certainty.

As for the second transparent adhesive layer 96, the transmittance of visible light (that is, light that has a wavelength of 400 nm or more and 700 nm or less) may be 85% or more and is preferably 90% or more. The upper limit of the transmittance of visible light in the second transparent adhesive layer 96 is not particularly limited but may be, for example, 100% or less. When the transmittance of visible light in the second transparent adhesive layer 96 ranges as described above, the transparency of the image display apparatus multilayer body 70 is enhanced, and the display device 61 of the image display apparatus 60 can be likely to be visible.

As for the image display apparatus 60, a difference between the refractive index of the substrate 11 and the refractive index of the first transparent adhesive layer 95 is 0.1 or less and is preferably 0.05 or less. A difference between the refractive index of the substrate 11 and the refractive index of the second transparent adhesive layer 96 is 0.1 or less and is preferably 0.05 or less. A difference between the refractive index of the first transparent adhesive layer 95 and the refractive index of the second transparent adhesive layer 96 is preferably 0.1 or less and is more preferably 0.05 or less. For example, in the case where the material of the first transparent adhesive layer 95 and the material of the second transparent adhesive layer 96 are acrylic resin the refractive index of which is 1.49, the refractive index of the substrate 11 is 1.39 or more and 1.59 or less. Examples of the materials can include fluorine resin, silicone resin, polyolefin resin, polyester resin, acrylic resin, polycarbonate resin, polyimide resin, and cellulose resin.

The difference between the refractive index of the substrate 11 and the refractive index of the first transparent adhesive layer 95 is thus reduced to 0.1 or less, visible light can be consequently inhibited from reflecting off an interface B1 between the substrate 11 and the first transparent adhesive layer 95, and the substrate 11 can be unlikely to be visible by the naked eye of the observer. The difference between the refractive index of the substrate 11 and the refractive index of the second transparent adhesive layer 96 is reduced to 0.1 or less, visible light can be consequently inhibited from reflecting off an interface B2 between the substrate 11 and the second transparent adhesive layer 96, and the substrate 11 can be unlikely to be visible by the naked eye of the observer. The difference between the refractive index of the first transparent adhesive layer 95 and the refractive index of the second transparent adhesive layer 96 is reduced to 0.1 or less, visible light can be consequently inhibited from reflecting off the interface B3 between the first transparent adhesive layer 95 and the second transparent adhesive layer 96. For this reason, the first transparent adhesive layer 95 and the second transparent adhesive layer 96 can be unlikely to be visible by the naked eye of the observer.

In particular, the material of the first transparent adhesive layer 95 and the material of the second transparent adhesive layer 96 are preferably the same material. This enables the difference between the refractive index of the first transparent adhesive layer 95 and the refractive index of the second transparent adhesive layer 96 to be reduced and enables visible light to be inhibited from reflecting off the interface B3 between the first transparent adhesive layer 95 and the second transparent adhesive layer 96.

In FIG. 2, at least the thickness $T_3$ of the first transparent adhesive layer 95 or the thickness $T_4$ of the second transparent adhesive layer 96 may be equal to or more than 1.5 times, is preferably equal to or more than 2 times, and is more preferably equal to or more than 2.5 times the thickness $T_1$ of the substrate 11. When the thickness $T_3$ of the first transparent adhesive layer 95 or the thickness $T_4$ of the second transparent adhesive layer 96 is thus sufficiently greater than the thickness $T_1$ of the substrate 11, the first transparent adhesive layer 95 or the second transparent adhesive layer 96 deforms in the thickness direction in an overlapping region with the substrate 11, and the thickness of the substrate 11 is absorbed. This enables the first transparent adhesive layer 95 or the second transparent adhesive layer 96 to be inhibited from having a step along the periphery of the substrate 11 and enables the substrate 11 to be unlikely to be recognized by the observer.

At least the thickness $T_3$ of the first transparent adhesive layer 95 or the thickness $T_4$ of the second transparent adhesive layer 96 is preferably equal to or less than 10 times, more preferably equal to or less than 5 times the thickness $T_1$ of the substrate 11. Consequently, the thickness $T_3$ of the first transparent adhesive layer 95 or the thickness $T_4$ of the second transparent adhesive layer 96 is not too great, and the image display apparatus 60 can be thinned as a whole.

In FIG. 2, the thickness $T_3$ of the first transparent adhesive layer 95 and the thickness $T_4$ of the second transparent adhesive layer 96 may be equal to each other. In this case, the thickness $T_3$ of the first transparent adhesive layer 95 and the thickness $T_4$ of the second transparent adhesive layer 96 may be equal to or more than 1.5 times, preferably equal to or more than 2.0 times the thickness $T_1$ of the substrate 11. That is, the sum (that is, $T_3+T_4$) of the thickness $T_3$ of the first transparent adhesive layer 95 and the thickness $T_4$ of the second transparent adhesive layer 96 is equal to or more than 3 times the thickness $T_1$ of the substrate 11. When the sum of the thicknesses $T_3$ and $T_4$ of the first transparent adhesive layer 95 and the second transparent adhesive layer 96 is thus sufficiently greater than the thickness $T_1$ of the substrate 11, the first transparent adhesive layer 95 and the second transparent adhesive layer 96 deform (shrink) in the thickness direction in the overlapping region with the substrate 11. Consequently, the first transparent adhesive layer 95 and the second transparent adhesive layer 96 absorb the thickness of the substrate 11. For this reason, the first transparent adhesive layer 95 or the second transparent adhesive layer 96 can be inhibited from having a step along the periphery of the substrate 11, and the substrate 11 can be unlikely to be recognized by the observer.

In the case where the thickness $T_3$ of the first transparent adhesive layer 95 and the thickness $T_4$ of the second transparent adhesive layer 96 are equal to each other, the thickness $T_3$ of the first transparent adhesive layer 95 and the thickness $T_4$ of the second transparent adhesive layer 96 may be equal to or less than 5 times, preferably equal to or less than 3 times the thickness $T_1$ of the substrate 11. Consequently, the thicknesses $T_3$ and $T_4$ of the first transparent adhesive layer 95 and the second transparent adhesive layer 96 are not too great, and the image display apparatus 60 can be thinned as a whole.

Specifically, for example, the thickness $T_1$ of the substrate 11 may be 2 μm or more or may be 10 μm or more, and is preferably 15 μm or more. When the thickness $T_1$ of the substrate 11 is 2 μm or more, the strength of the wiring board 10 is ensured, and first wiring lines 21 and second wiring lines 22 of the mesh wiring layers 20 described later can be unlikely to deform. For example, the thickness $T_1$ of the substrate 11 may be 200 μm or less or may be 50 μm or less, and is preferably 25 μm or less. When the thickness $T_1$ of the substrate 11 is 200 μm or less, the first transparent adhesive layer 95 and the second transparent adhesive layer 96 are inhibited from having a step along the periphery of the substrate 11, and the substrate 11 can be unlikely to be recognized by the observer. When the thickness $T_1$ of the substrate 11 is 50 μm or less, the first transparent adhesive layer 95 and the second transparent adhesive layer 96 are further inhibited from having a step along the periphery of the substrate 11, and the substrate 11 can be more unlikely to be recognized by the observer.

For example, the thickness $T_3$ of the first transparent adhesive layer 95 may be 15 μm or more and is preferably 20 μm or more. For example, the thickness $T_3$ of the first transparent adhesive layer 95 may be 500 μm or less, is preferably 300 μm or less, and is more preferably 250 μm or less. For example, the thickness $T_4$ of the second transparent adhesive layer 96 may be 15 µm or more and is preferably 20 µm or more. For example, the thickness $T_4$ of the second transparent adhesive layer 96 may be 500 µm or less, is preferably 300 µm or less, and is more preferably 250 µm or less.

Referring to FIG. 2 again, the cover glass 75 is directly or indirectly disposed along the first transparent adhesive layer 95. The cover glass 75 is a glass member that allows light to pass therethrough. The cover glass 75 has a plate shape. The shape of the cover glass 75 may be a rectangular shape in a plan view. For example, the thickness of the cover glass 75 may be 200 µm or more and 1000 µm or less and is preferably 300 µm or more and 700 µm or less. For example, the length of the cover glass 75 in the longitudinal direction (that is, the Y-direction) is 20 mm or more and 500 mm or less and is preferably 100 mm or more and 200 mm or less. The length of the cover glass 75 in the transverse direction (that is, the X-direction) may be 20 mm or more and 500 mm or less and is preferably 50 mm or more and 100 mm or less.

As illustrated in FIG. 1, the shape of the image display apparatus 60 is a substantially rectangular shape as a whole in a plan view, the longitudinal direction thereof is parallel with the Y-direction, and the transverse direction thereof is parallel with the X-direction. For example, the length $L_4$ of the image display apparatus 60 in the longitudinal direction (that is, the Y-direction) can be selected from a range of 20 mm or more and 500 mm or less and preferably from a range of 100 mm or more and 200 mm or less. For example, the length $L_5$ of the image display apparatus 60 in the transverse direction (that is, the X-direction) can be selected from a range of 20 mm or more and 500 mm or less and preferably from a range of 50 mm or more and 100 mm or less. The planar shape of the image display apparatus 60 may be a rectangular shape the corner portions of which are rounded.

The pixels P of the display device 61 will now be described with reference to FIG. 3.

Figure 3:
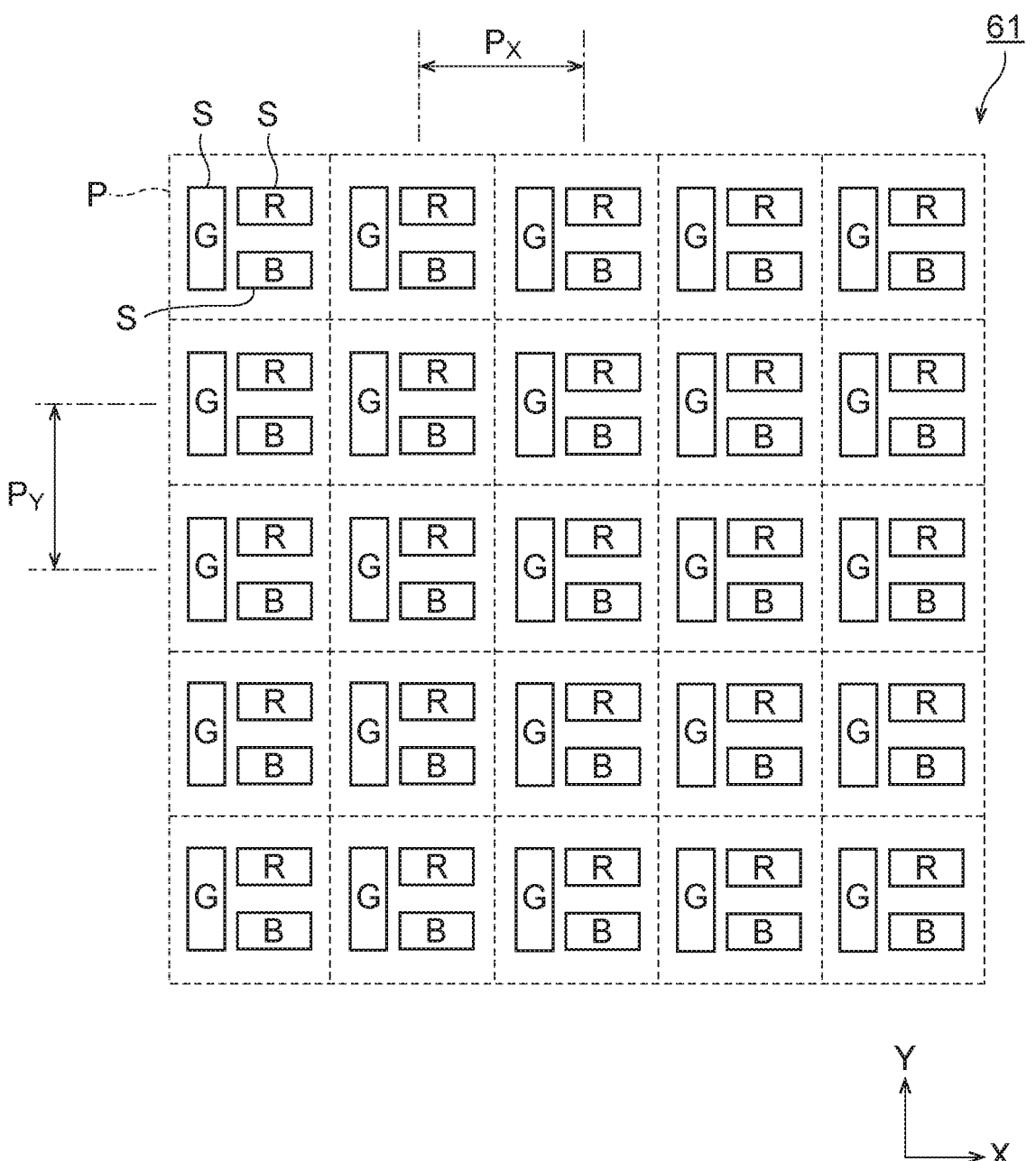
FIG. 3 is a plan view of pixels of a display device of the image display apparatus according to the first embodiment.

FIG. 3 is a plan view of an example of the arrangement of the pixels P and sub-pixels S that are included in the pixels P. In FIG. 3, sub-pixels S in which "R" is illustrated emit red light, sub-pixels S in which "G" is illustrated emit green light, and sub-pixels S in which "B" is illustrated emit blue light.

The display device 61 includes the multiple pixels P that are regularly arranged in the width direction (that is, the X-direction) and longitudinal direction (that is, the Y-direction) of the mesh wiring layers 20. The multiple pixels P are arranged in the X-direction at regular pitches $P_X$. For example, the pitches $P_X$ may be roughly in a range of 50 µm or more and 200 µm or less. The multiple pixels P are arranged in the Y-direction at regular pitches $P_Y$. For example, the pitches $P_Y$ may be roughly in a range of 50 µm or more and 200 µm or less.

Each pixel P includes multiple sub-pixels S. Each sub-pixel S includes an OLED (an organic light-emitting diode) that can emit light in corresponding color. In an example illustrated in FIG. 3, the pixels P include the sub-pixels S that can emit light in three colors (that is, red, green, and blue). The sub-pixels S that are included in the pixels P are arranged in both of the X-direction and the Y-direction. In the example illustrated in FIG. 3, the sub-pixels S that emit green light are arranged so as to be separated from the sub-pixels S that emit red light and the sub-pixels S that emit blue light in the X-direction. The sub-pixels S that emit red light and the sub-pixels S that emit blue light are arranged so as to be separated from each other in the Y-direction.

The kinds (that is, the color of emitted light) and number of the sub-pixels S that are included in the pixels P are not particularly limited. For example, the sub-pixels S that can emit light in two colors or four or more colors may be included in the pixels P. A relationship in relative position among the sub-pixels S in the pixels P is not particularly limited. For example, in the pixels P, the sub-pixels S may be arranged in only the X-direction or the Y-direction. The sub-pixels S in the pixels P may be adjacent to or in close contact with each other.

The sub-pixels S thus include respective light-emitting elements. The pixels P include sets of the multiple sub-pixels S that correspond to a repetitive unit. The arrangement of the pixels P and the sub-pixels S is not limited to the example illustrated in FIG. 3. The pixels P and the sub-pixels S may be arranged in a freely determined form. For example, in the example illustrated in FIG. 3, each set of the sub-pixels S for the respective colors (that is, red, green, and blue) is included in the square range of corresponding one of the pixels P. However, the shapes of the pixels P are not necessarily limited to a square shape. Multiple sets of the sub-pixels S for the respective colors may be included in each pixel P.

The structure of the wiring board will now be described with reference to FIG. 4 to FIG. 7. FIG. 4 to FIG. 7 illustrate the wiring board according to the present embodiment.

Figure 4:
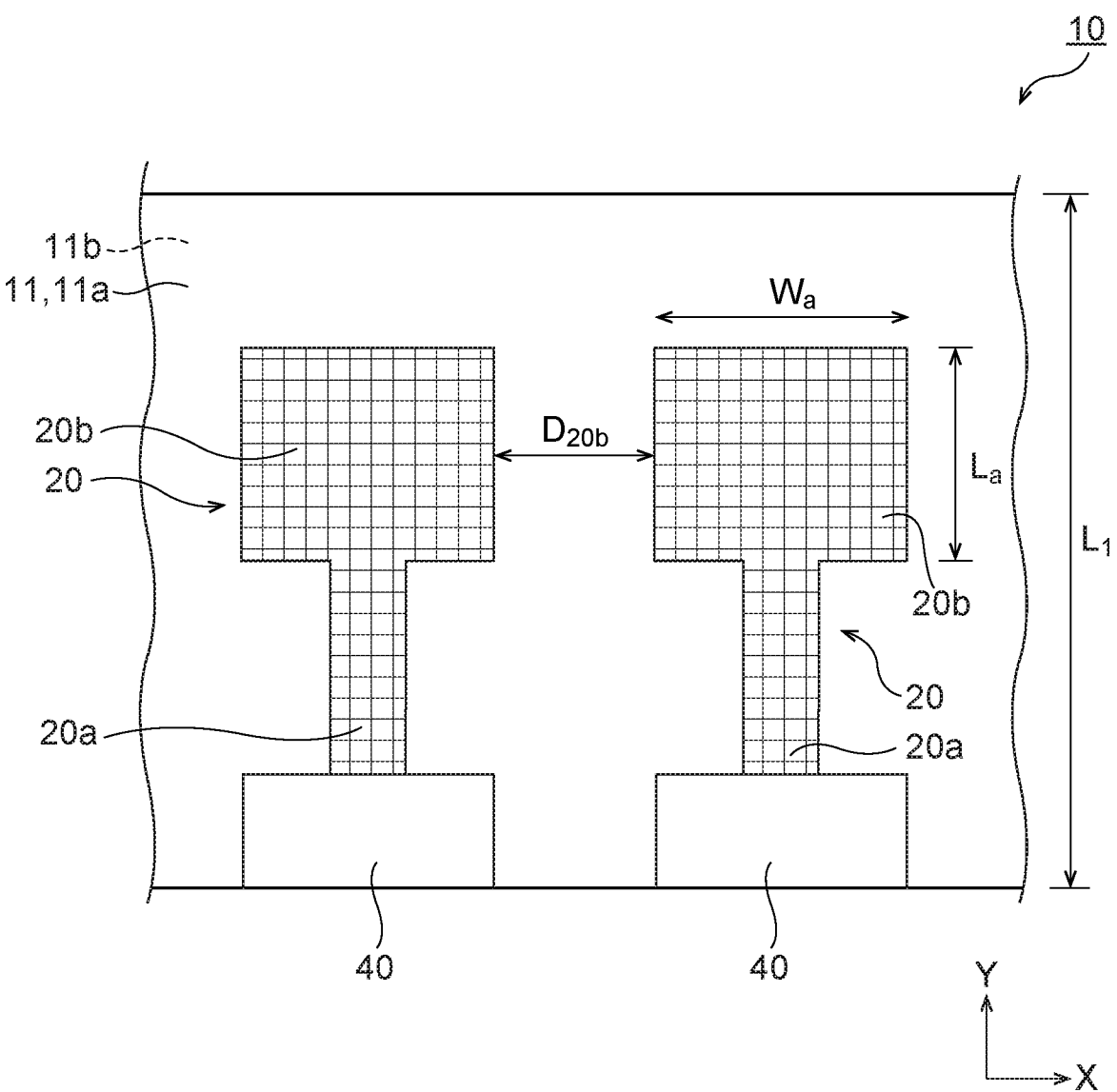
FIG. 4 is a plan view of a wiring board according to the first embodiment.

As illustrated in FIG. 4, the wiring board 10 according to the present embodiment is used for the image display apparatus 60 (see FIG. 1 and FIG. 2) described above. The wiring board 10 can be disposed between the first transparent adhesive layer 95 and the second transparent adhesive layer 96 at a position nearer than the display device 61 to the light emission surface 64. The wiring board 10 includes the substrate 11 that is transparent and the mesh wiring layers 20 that are disposed on the substrate 11 as described above. The power supply portions 40 are electrically connected to the mesh wiring layers 20.

The shape of the substrate 11 is a substantially rectangular shape in a plan view. In an illustrated example, the longitudinal direction thereof is parallel with the X-direction, and the transverse direction thereof is parallel with the Y-direction. The substrate 11 is transparent and has a substantially plate shape, and the thickness thereof is substantially uniform as a whole. For example, the length $L_1$ of the substrate 11 in the longitudinal direction (that is, the Y-direction) of the image display apparatus 60 can be selected from a range of 2 mm or more and 300 mm or less, a range of 10 mm or more and 200 mm or less, or a range of 100 mm or more and 200 mm or less. For example, the length $L_2$ of the substrate 11 in the transverse direction (that is, the X-direction) of the image display apparatus 60 can be selected from a range of 2 mm or more and 300 mm or less, a range of 3 mm or more and 100 mm or less, or a range of 50 mm or more and 100 mm or less. The planar shape of the substrate 11 may be a rectangular shape the corner portions of which are rounded.

The material of the substrate 11 is a material that is transparent and that has electrical insulation properties in a visible light region. Examples of the material of the substrate 11 preferably include polyester resin, acrylic resin, polycarbonate resin, polyimide resin, polyolefin resin, cellulose resin, and an organic insulating material such as a fluorine resin material. For example, the polyester resin may be polyethylene terephthalate. For example, the acrylic resin may be polymethyl methacrylate. For example, the polyolefin resin may be cyclic olefin polymer. For example, the cellulose resin may be triacetylcellulose. For example, the fluorine resin material may be PTFE or PFA. For example, the material of the substrate 11 may be an organic insulating material such as cyclic olefin polymer (for example, ZF-16 made by ZEON CORPORATION), or polynorbornene polymer (made by Sumitomo Bakelite Co., Ltd.). Glass or ceramics, for example, may be appropriately selected as the material of the substrate 11 depending on use. In an illustrated example, the substrate 11 has a single layer but is not limited thereto and may has a structure obtained by stacking multiple base materials or layers. The substrate 11 may be a film member or a plate member.

The dielectric tangent of the substrate 11 may be 0.002 or less and is preferably 0.001 or less. The lower limit of the dielectric tangent of the substrate 11 is not particularly limited but may be more than 0. When the dielectric tangent of the substrate 11 ranges as described above, particularly, in the case where an electromagnetic wave (for example, a millimeter wave) that is transmitted and received by the mesh wiring layers 20 is a radio-frequency wave, the loss of gain (that is, a reduction in sensitivity) caused due to transmission and reception of the electromagnetic wave can be reduced.

The relative dielectric constant of the substrate 11 is preferably 2 or more and 10 or less. When the relative dielectric constant of the substrate 11 is 2 or more, the material of the substrate 11 can be selected from many choices. When the relative dielectric constant of the substrate 11 is 10 or less, the loss of gain (sensitivity) caused due to transmission and reception of the electromagnetic wave can be reduced. That is, in the case where the relative dielectric constant of the substrate 11 increases, the influence of the thickness of the substrate 11 on the propagation of the electromagnetic wave increases. In the case where the propagation of the electromagnetic wave is negatively affected, the dielectric tangent of the substrate 11 increases, and the loss of gain caused due to transmission and reception of the electromagnetic wave can increase. When the relative dielectric constant of the substrate 11 is 10 or less, however, the influence of the thickness of the substrate 11 on the propagation of the electromagnetic wave can be reduced. For this reason, the loss of gain caused due to transmission and reception of the electromagnetic wave can be reduced. In particular, in the case where the electromagnetic wave (for example, a millimeter wave) that is transmitted and received by the mesh wiring layers 20 is a radio-frequency wave, the loss of gain caused due to transmission and reception of the electromagnetic wave can be reduced.

The dielectric tangent and relative dielectric constant of the substrate 11 can be measured in accordance with IEC 62562. Specifically, a portion of the substrate 11 at which the mesh wiring layers 20 are not formed is first cut, and a test piece is prepared. As for the dimensions of the test piece, the width is 10 mm or more and 20 mm or less, and the length is 50 mm or more and 100 mm or less. Subsequently, the dielectric tangent or the relative dielectric constant is measured in accordance with IEC 62562.

According to the present embodiment, the substrate 11 is transparent. In the present specification, "being transparent" means that the transmittance of visible light (that is, light that has a wavelength of 400 nm or more and 700 nm or less) is 85% or more. As for the substrate 11, the transmittance of visible light may be 85% or more and is preferably 90% or more. The upper limit of the transmittance of visible light in the substrate 11 is not particularly limited but may be, for example, 100% or less. When the transmittance of visible light in the substrate 11 ranges as described above, the transparency of the wiring board 10 is enhanced, and the display device 61 of the image display apparatus 60 can be likely to be visible.

According to the present embodiment, the mesh wiring layers 20 include an antenna pattern that functions as an antenna. The mesh wiring layers 20 may serve as an array antenna that includes two or more antenna elements (radiating elements (end portions 20b described later)). In the case where the mesh wiring layers 20 thus serve as the array antenna, millimeter wave antenna performance for transmitting and receiving a millimeter wave that tends to travel straight can be enhanced. An array antenna means an antenna in which multiple antenna elements are regularly arranged, and the amplitude and phase of excitation of each element can be individually controlled.

The two or more (multiple) mesh wiring layers 20 are formed on the substrate 11. The number of the mesh wiring layers 20 is preferably 4 or more. In this case, the wiring board 10 includes four or more antenna elements (the end portions 20b described later). In an illustrated example, the four mesh wiring layers 20 are formed on the substrate 11 (see FIG. 1). As illustrated in FIG. 4, the mesh wiring layers 20 may not spread over the entire surface of the substrate 11 but may be disposed in only a region of the substrate 11. The mesh wiring layers 20 may have the same shape. In this case, as for each mesh wiring layer 20, an error in a length (that is, a length in the Y-direction) $L_a$ and an error in a width (a length in the X-direction) $W_a$ of the end portion 20b described later are preferably within 10%. This enables the millimeter wave antenna performance can be effectively enhanced.

The mesh wiring layers 20 include base end portions (that is, transmission portions) 20a that face the power supply portions 40 and the end portions (that is, transceiver portions) 20b that are connected to the base end portions 20a. The base end portions 20a are connected to the power supply portions 40. The shape of each base end portion 20a and the shape of each end portion 20b are substantially rectangular shapes in a plan view. In this case, the lengths (that is, distances in the Y-direction) of the end portions 20b are longer than the lengths (that is, distances in the Y-direction) of the base end portions 20a, and the widths (that is, distances in the X-direction) of the end portions 20b are greater than the widths (that is, distances in the X-direction) of the base end portions 20a.

The end portions 20b of the mesh wiring layers 20 correlate with predetermined frequency bands. That is, the lengths (the lengths in the Y-direction) $L_a$ of the end portions 20b correlate with specific frequency bands. As the correlating frequency bands reduce, the lengths $L_a$ of the end portions 20b increase. The mesh wiring layers 20 may correspond to a millimeter wave antenna, a telephone antenna, a WiFi antenna, a 3G antenna, a 4G antenna, a 5G antenna, a LTE antenna, a Bluetooth (registered trademark) antenna, or a NFC antenna. The lengths of the multiple end portions 20b may differ from each other and may correlate with different frequency bands. In the case where the wiring board 10 does not have the radio wave transceiver function, for example, the mesh wiring layers 20 may fulfill a hovering function, or another function such as fingerprint authentication, heating, or noise cutting (shielding). A hovering function means a function of enabling a user to operate a display without a direct touch.

As for the end portions 20b, the longitudinal direction thereof is parallel with the X-direction, and the transverse direction thereof is parallel with the Y-direction. For example, the lengths $L_a$ of the end portions 20b in the Y-direction can be selected from a range of 1 mm or more and 100 mm or less. For example, the widths $W_a$ of the end portions 20b in the X-direction can be selected from a range of 1 mm or more and 100 mm or less. In particular, in the case where the mesh wiring layers 20 correspond to a millimeter wave antenna, the lengths $L_a$ of the end portions 20b can be selected from a range of 1 mm or more, more preferably 1.5 mm or more. In the case where the mesh wiring layers 20 correspond to a millimeter wave antenna, the lengths $L_a$ of the end portions 20b can be selected from a range of 10 mm or less, more preferably 5 mm or less.

As for the mesh wiring layers 20, distances between the antenna elements are preferably 1 mm or more and 5 mm or less. That is, a distance $D_{20b}$ (see FIG. 4) between the end portions 20b is preferably 1 mm or more and 5 mm or less. When the distance $D_{20b}$ between the end portions 20b is 1 mm or more, unintentional interference with an electromagnetic wave between the antenna elements can be reduced. When the distance $D_{20b}$ between the end portions 20b is 5 mm or less, the size of the entire array antenna that includes the mesh wiring layers 20 can be reduced. For example, in the case where the mesh wiring layers 20 correspond to a millimeter wave antenna at 28 GHZ, the distance $D_{20b}$ between the end portions 20b may be 3.5 mm. In the case where the mesh wiring layers 20 correspond to a millimeter wave antenna at 60 GHZ, the distance $D_{20b}$ between the end portions 20b may be 1.6 mm.

The patterns of the mesh wiring layers 20 are such that metal wires are disposed in the form of a lattice or mesh. The patterns are repeatedly formed in the X-direction and the Y-direction. That is, the patterns of the mesh wiring layers 20 include portions (that is, the first wiring lines 21) that extend in the first direction (for example, the Y-direction) and portions (that is, the second wiring lines 22) that extend in the second direction (for example, the X-direction).

Figure 5A:
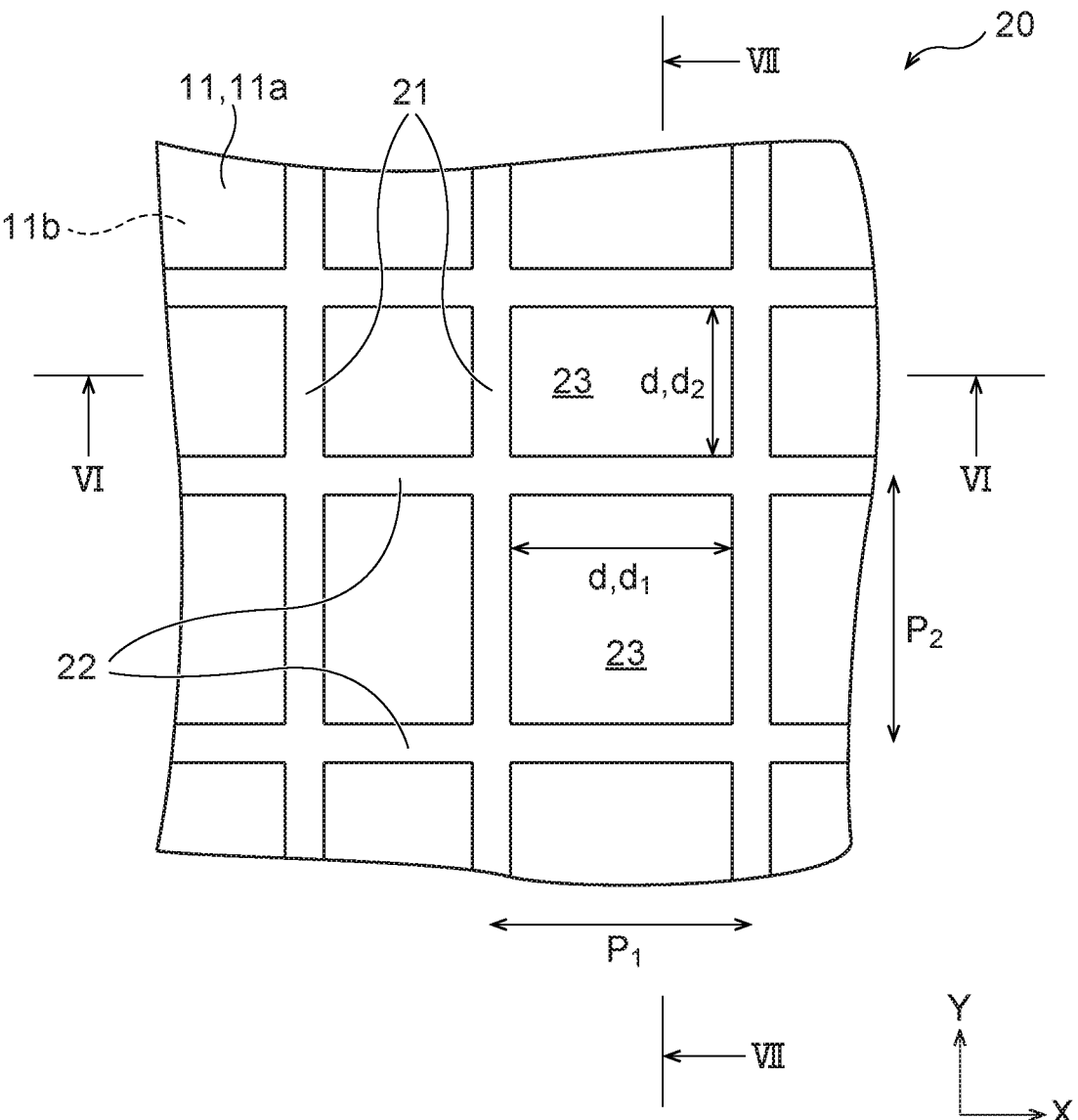
FIG. 5A is an enlarged plan view of a mesh wiring layer of the wiring board according to the first embodiment.

As illustrated in FIG. 5A, the mesh wiring layers 20 include the wiring lines. According to the present embodiment, the mesh wiring layers 20 include the two or more wiring lines. Specifically, the mesh wiring layers 20 include the multiple first wiring lines (that is, the wiring lines) 21 and the multiple second wiring lines (that is, the wiring lines) 22 that couple the multiple first wiring lines 21 with each other. The multiple first wiring lines 21 and the multiple second wiring lines 22 are formed into one piece as a whole in the form of a lattice or mesh. The first wiring lines 21 linearly extend in the Y-direction. The second wiring lines 22 linearly extend in the X-direction perpendicular to the first wiring lines 21.

As for the mesh wiring layers 20, two or more opening portions 23 are formed by being surrounded by the first wiring lines 21 and the second wiring lines 22. Specifically, as for the mesh wiring layers 20, the multiple opening portions 23 are formed by being surrounded by the first wiring lines 21 adjacent to each other and the second wiring lines 22 adjacent to each other. In the present specification, an opening portion means, among regions that are surrounded by the wiring lines (the first wiring lines 21 and the second wiring lines 22), a region in which no wiring lines for connecting the wiring lines that surround the regions are present. Specifically, in an example illustrated in FIG. 5B, each of an opening portion 23A to an opening portion 23E is a single opening portion 23. In other words, a combination of the opening portion 23A and the opening portion 23B, for example, is not a single opening portion 23.

The first wiring lines 21 and the second wiring lines 22 are irregularly arranged. Specifically, the multiple first wiring lines 21 are parallel with each other, and the pitches $P_1$ thereof are irregular. For example, the pitches $P_1$ may be in a range of 0.01 mm or more and 1 mm or less. The multiple second wiring lines 22 are parallel with each other, and the pitches $P_2$ thereof are irregular. For example, the pitches $P_2$ may be in a range of 0.01 mm or more and 1 mm or less.

According to the present embodiment, the pitches $P_1$ of the multiple first wiring lines 21 and the pitches $P_2$ of the multiple second wiring lines 22 are thus irregular. Consequently, the pitch of a moire pattern formed due to the regularity (periodicity) of the mesh wiring layers 20 and the regularity (periodicity) of the pixels P of the display device 61 can be reduced to such an extent that the pitch is invisible by the naked eye. The first wiring lines 21 are parallel with each other, and the second wiring lines 22 are parallel with each other as described above. For this reason, even in the case where the pitches $P_1$ and $P_2$ are irregular, flicker caused due to the reflection of visible light due to the mesh wiring layers 20 can be reduced.

The planar shape of each opening portion 23 is a polygonal shape that has opposing sides parallel with each other. According to the present embodiment, the first wiring lines 21 are parallel with each other, and the second wiring lines 22 are parallel with each other. Accordingly, the planar shape of each opening portion 23 is a quadrilateral shape (that is, a rectangular shape) that has opposing sides parallel with each other. The substrate 11 that is transparent is exposed from the opening portions 23. This enables the transparency of the wiring board 10 as a whole to be enhanced.

As for each opening portion 23, as illustrated in FIG. 5A, a distance between sides that extend in a predetermined direction (the first direction) is designated as d. As for 100 opening portions 23 continuously adjacent to each other, the average value of the distances d between the sides that extend in the predetermined direction is designated as D. According to the present embodiment, 95% or more opening portions 23 among the 100 opening portions 23 satisfy a relationship of $0.70D \leq d \leq 0.98D$ or satisfy a relationship of $1.02D \leq d \leq 1.30D$. According to the present embodiment, the pitches $P_1$ of the multiple first wiring lines 21 and the pitches $P_2$ of the multiple second wiring lines 22 are irregular as described above. For this reason, the distances d between the sides of the 100 opening portions 23 continuously adjacent to each other can differ from each other. In this case, the distances d between the sides of the 100 opening portions 23 continuously adjacent to each other preferably have three or more values. In the present specification, "100 opening portions continuously adjacent to each other" mean that as for all of the 100 opening portions 23, each opening portion 23 adjacent to at least one of the other opening portions 23 that are included in the 100 opening portions 23.

Figure 5B:
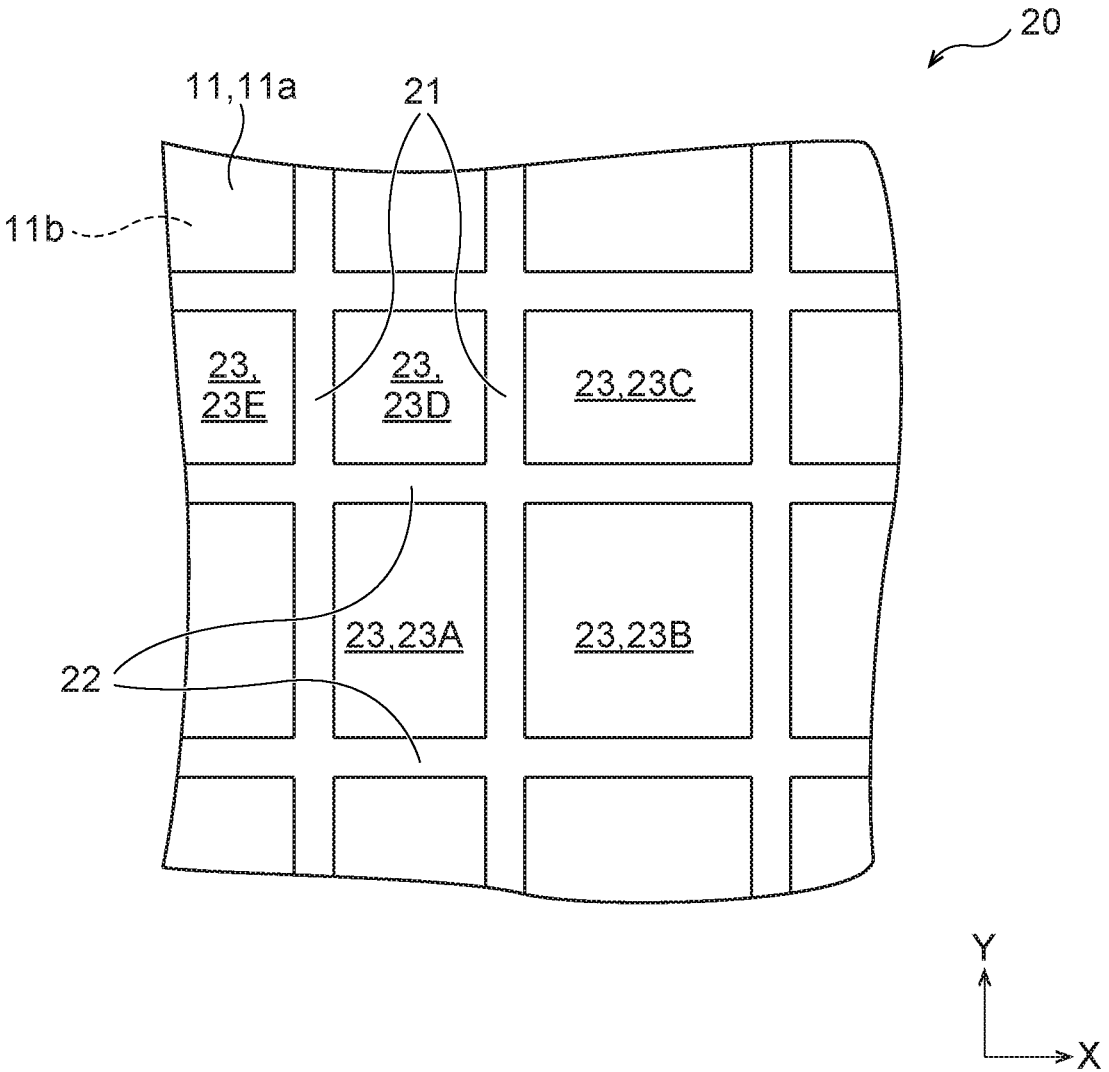
FIG. 5B is an enlarged plan view of the mesh wiring layer of the wiring board according to the first embodiment.

The "100 opening portions continuously adjacent to each other" may be selected, for example, in the following manner. For example, as illustrated in FIG. 5B, the opening portion 23A is freely selected. Subsequently, the opening portion 23B adjacent to the opening portion 23A is freely selected. In an illustrated example, the opening portion 23B is adjacent to the opening portion 23A in the positive X-direction. Subsequently, the opening portion 23C adjacent to at least the opening portion 23A or 23B is freely selected. In the illustrated example, the opening portion 23C is adjacent to the opening portion 23B in the positive Y-direction. Subsequently, the opening portion 23D adjacent to at least the opening portion 23A, 23B, or 23C is freely selected. In the illustrated example, the opening portion 23D is adjacent to the opening portion 23A in the positive Y-direction and is adjacent to the opening portion 23C in the negative X-direction. Subsequently, the opening portion 23E adjacent to at least the opening portion 23A, 23B, 23C, or 23D is freely selected. In the illustrated example, the opening portion 23E is adjacent to the opening portion 23D in the negative X-direction. In this way, the 100 opening portions 23 may be selected.

As for the wiring board 10, in the case where the number of the opening portions 23 is less than 100, the average value of the distances d between the sides that extend in the predetermined direction regarding all of the opening portions 23 may be designated as D. Also in this case, 95% or more opening portions 23 among all of the opening portions 23 satisfy the relationship of $0.70D \leq d \leq 0.98D$ or satisfy the relationship of $1.02D \leq d \leq 1.30D$.

The planar shape of each opening portion 23 is a quadrilateral shape as described above. In this case, the planar shape of each opening portion 23 has two sets of paired sides parallel with each other. The sides of the first set (that is, one of the sets) extend in the first direction (for example, the X-direction). The sides of the second set (that is, the other set) extend in the second direction (for example, the Y-direction) that differs from the first direction. In other words, in the case where the planar shape of each opening portion 23 is a 2N-gon (N is a natural number of 2 or more), the planar shape of each opening portion 23 has N sets of paired sides parallel with each other. The sides of each set extend in a direction that differs from a direction in which the sides of another set extend. That is, the sides of the M-th set (M is a natural number of 1 or more and N or less) extend in a M-th direction that differs from a direction in which the sides of another set extend.

For this reason, according to the present embodiment, 95% or more opening portions 23 among the 100 opening portions 23 satisfy a relationship of $0.70D_M \leq d_M \leq 0.98D_M$ or satisfy a relationship of $1.02D_M \leq d_M \leq 1.30D_M$, where $d_M$ is the distances between the sides that extend in the M-th direction regarding the opening portions 23, and $D_M$ is the average value of the distances $d_M$ between the sides regarding the 100 opening portions 23 continuously adjacent to each other.

As for the wiring board 10, in the case where the number of the opening portions 23 is less than 100, the average value of the distances $d_M$ between the sides that extend in the M-th direction regarding all of the opening portions 23 may be designated as $D_M$. Also in this case, 95% or more opening portions 23 among all of the opening portions 23 satisfy the relationship of $0.70D_M \leq d_M \leq 0.98D_M$ or satisfy the relationship of $1.02D_M \leq d_M \leq 1.30D_M$.

Specifically, as illustrated in, for example, FIG. 5A, the distances between sides of the first wiring lines 21 that extend in the longitudinal direction (that is, the Y-direction) are designated as $d_1$. The average value of the distances $d_1$ between the sides of the 100 opening portions 23 continuously adjacent to each other or all of the opening portions 23 are designated as $D_1$. According to the present embodiment, 95% or more opening portions 23 among the 100 opening portions 23 or all of the opening portions 23 satisfy a relationship of $0.70D_1 \leq d_1 \leq 0.98D_1$ or satisfy a relationship of $1.02D_1 \leq d_1 \leq 1.30D_1$. This enables the pitch of the moire pattern formed due to the regularity (periodicity) of the mesh wiring layers 20 and the regularity (periodicity) of the pixels P of the display device 61 to be reduced to such an extent that the pitch is invisible by the naked eye.

That is, as for the image display apparatus 60 described above, the mesh wiring layers 20 of the wiring board 10 overlap the pixels P of the display device 61 in the Z-direction. For this reason, the moire pattern can be formed due to the regularity (periodicity) of the mesh wiring layers 20 and the regularity (periodicity) of the pixels P. According to the present embodiment, however, 95% or more opening portions 23 among the 100 opening portions 23 described above or all of the opening portions 23 satisfy the relationship of $0.70D_1 \leq d_1 \leq 0.98D_1$ or satisfy the relationship of $1.02D_1 \leq d_1 \leq 1.30D_1$. Consequently, the first wiring lines 21 and the pixels P are irregularly arranged in the X-direction when viewed in the Z-direction. For this reason, the pitch of the moire pattern formed due to the regularity (periodicity) of the mesh wiring layers 20 and the regularity (periodicity) of the pixels P can be reduced to such an extent that the pitch is invisible by the naked eye. When the wiring board 10 satisfies the relationship described above, the sizes of the opening portions 23 in the mesh wiring layers 20 do not vary, and the mesh wiring layers 20 can be unlikely to be visible by the naked eye.

Similarly, for example, the distances between sides of the second wiring lines 22 that extend in the longitudinal direction (that is, the X-direction) are designated as $d_2$. The average value of the distances $d_2$ between the sides regarding the 100 opening portions 23 continuously adjacent to each other or all of the opening portions 23 are designated as $D_2$. According to the present embodiment, 95% or more opening portions 23 among the 100 opening portions 23 or all of the opening portions 23 satisfy a relationship of $0.70D_2 \leq d_2 \leq 0.98D_2$ or satisfy a relationship of $1.02D_2 \leq d_2 \leq 1.30D_2$. Consequently, the second wiring lines 22 and the pixels P are irregularly arranged in the Y-direction when viewed in the Z-direction. For this reason, the pitch of the moire pattern formed due to the regularity (periodicity) of the mesh wiring layers 20 and the regularity (periodicity) of the pixels P can be reduced to such an extent that the pitch is invisible by the naked eye. When the wiring board 10 satisfies the relationship described above, the sizes of the opening portions 23 in the mesh wiring layers 20 do not vary, and the mesh wiring layers 20 can be unlikely to be visible by the naked eye.

According to the present embodiment, 95% or more opening portions 23 among the 100 opening portions 23 described above or all of the opening portions 23 preferably satisfy a relationship of $0.85D \leq d \leq 0.98D$ or satisfy a relationship of $1.02D \leq d \leq 1.15D$. This enables the pitch of the moire pattern formed due to the regularity (periodicity) of the mesh wiring layers 20 and the regularity (periodicity) of the pixels P to be reduced. In addition, variations in the sizes of the opening portions 23 in the mesh wiring layers 20 can be reduced, and accordingly, the mesh wiring layers 20 can be more unlikely to be visible.

According to the present embodiment, 95% or more opening portions 23 among the 100 opening portions 23 described above or all of the opening portions 23 more preferably satisfy a relationship of $0.90D \leq d \leq 0.98D$ or satisfy a relationship of $1.02D \leq d \leq 1.10D$. This enables the pitch of the moire pattern formed due to the regularity (periodicity) of the mesh wiring layers 20 and the regularity (periodicity) of the pixels P to be further reduced. In addition, the variations in the sizes of the opening portions 23 in the mesh wiring layers 20 can be further reduced, and accordingly, the mesh wiring layers 20 can be more unlikely to be visible.

For example, the distances $d_1$ and $d_2$ between the sides of the opening portions 23 may be in a range of 35 μm or more and 650 μm or less. Average values D (that is, the average values $D_1$ and $D_2$) may be 50 μm or more and 500 μm or less. When the average values D are 50 μm or more, aperture ratios At of the mesh wiring layers 20 described later can be inhibited from reducing, and the transparency of the wiring board 10 can be ensured. When the average values D are 500

μm or less, the sheet resistance value of each mesh wiring layer 20 can be inhibited from being excessively increased, and the antenna characteristics thereof can be maintained. The first wiring lines 21 and the second wiring lines 22 are perpendicular to each other but are not limited thereto and may intersect with each other at an acute angle or an obtuse angle.

Figure 6:
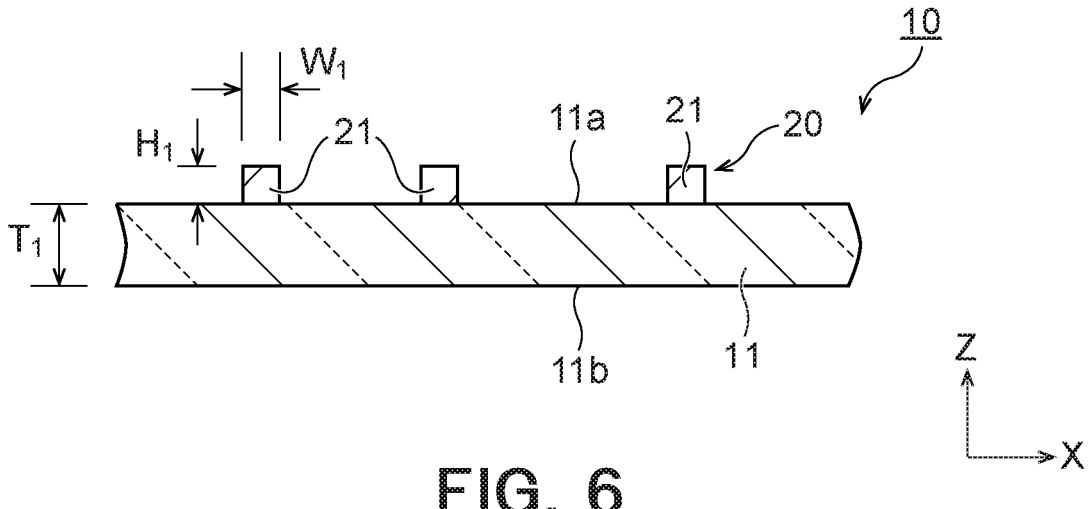
FIG. 6 is a sectional view (a sectional view taken along line VI-VI in FIG. 5A) of the wiring board according to the first embodiment.
Figure 7:
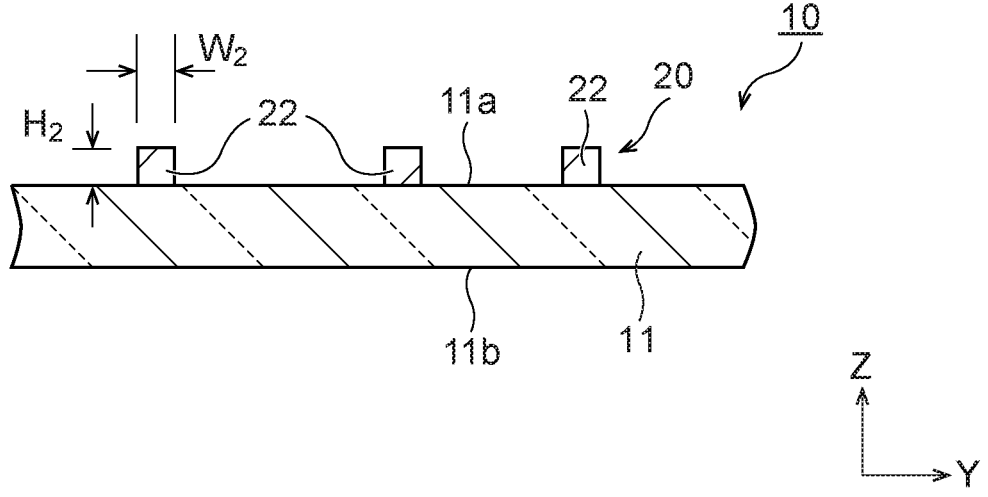
FIG. 7 is a sectional view (a sectional view taken along line VII-VII in FIG. 5A) of the wiring board according to the first embodiment.
Figure 8:
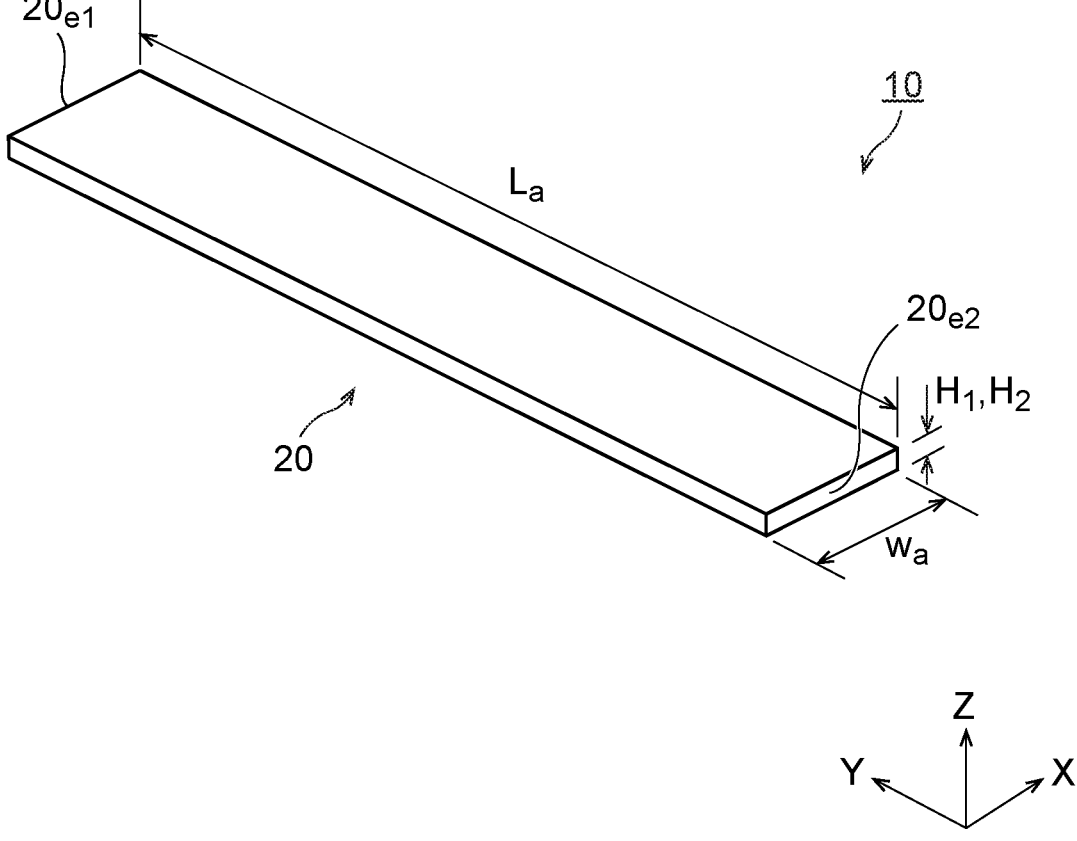
FIG. 8 is a perspective view of the mesh wiring layer of the wiring board according to the first embodiment.

As illustrated in FIG. 6, a section of each first wiring line 21 (that is, a section in the X-direction) perpendicular to the longitudinal direction thereof has a substantially rectangular shape or a substantially square shape. In this case, the shape of the section of each first wiring line 21 is substantially uniform in the longitudinal direction (that is, the Y-direction) of the first wiring line 21. As illustrated in FIG. 7, a section of each second wiring line 22 (that is, a section in the Y-direction) perpendicular to the longitudinal direction thereof has a substantially rectangular shape or a substantially square shape and is substantially the same as that of the section (that is, the section in the X-direction) of each first wiring line 21 described above. In this case, the shape of the section of each second wiring line 22 is substantially uniform in the longitudinal direction (that is, the X-direction) of the second wiring line 22. The shape of the section of each first wiring line 21 and the shape of the section of each second wiring line 22 may not necessarily be a substantially rectangular shape or a substantially square shape. For example, the shape of the section of each first wiring line 21 and the shape of the section of each second wiring line 22 may be a substantially trapezoid shape a front surface (that is, in the positive Z-direction) of which is narrower than a back surface (that is, in the negative Z-direction) or a shape in which both side surfaces in the longitudinal direction are curved.

According to the present embodiment, the linewidths $W_1$ (see FIG. 6) of the first wiring lines 21 and the linewidths $W_2$ (see FIG. 7) of the second wiring lines 22 are not particularly limited but may be appropriately selected depending on use. The linewidths $W_1$ of the first wiring lines 21 correspond to lengths in the X-direction. The linewidths $W_2$ of the second wiring lines 22 correspond to lengths in the Y-direction. For example, the linewidths $W_1$ of the first wiring lines 21 may be 0.5 μm or more and 3 μm or less. When the linewidths $W_1$ of the first wiring lines 21 are 0.5 μm or more, the conductivity of the wiring board 10 can be increased. When the linewidths $W_1$ of the first wiring lines 21 are 3.0 μm or less, the concentration of the moire pattern can be reduced even when the moire pattern is formed. The linewidths $W_1$ of the first wiring lines 21 can be selected from a range of 0.5 μm or more and are preferably 1.0 μm or more. The linewidths $W_1$ of the first wiring lines 21 can be selected from a range of 3.0 μm or less and are preferably 2.0 μm or less. The linewidths $W_2$ of the second wiring lines 22 may be 0.5 μm or more and 3 μm or less. When the linewidths $W_2$ of the second wiring lines 22 are 0.5 μm or more, the conductivity of the wiring board 10 can be increased. When the linewidths $W_2$ of the second wiring lines 22 are 3.0 μm or less, the concentration of the moire pattern can be reduced even when the moire pattern is formed. The linewidths $W_2$ of the second wiring lines 22 can be selected from a range of 0.5 μm or more and are preferably 1.0 μm or more. The linewidths $W_2$ of the second wiring lines 22 can be selected from a range of 3.0 μm or less and are preferably 2.0 μm or less.

The heights $H_1$ (see FIG. 6) of the first wiring lines 21 and the heights $H_2$ (see FIG. 7) of the second wiring lines 22 are not particularly limited but can be appropriately selected depending on use. The heights $H_1$ of the first wiring lines 21 and the heights $H_2$ of the second wiring lines 22 described herein correspond to lengths in the Z-direction. For example, the heights $H_1$ of the first wiring lines 21 and the heights $H_2$ of the second wiring lines 22 can be selected from a range of 0.1 μm or more and are preferably 0.2 μm or more. For example, the heights $H_1$ of the first wiring lines 21 and the heights $H_2$ of the second wiring lines 22 can be selected from a range of 5.0 μm or less and are preferably 2.0 μm or less.

The materials of the first wiring lines 21 and the second wiring lines 22 are conductive metal materials. According to the present embodiment, the materials of the first wiring lines 21 and the second wiring lines 22 are copper but are not limited thereto. Examples of the materials of the first wiring lines 21 and the second wiring lines 22 can include metal materials such as gold, silver, copper, platinum, tin, aluminum, iron, and nickel and alloys that contain these metals. The first wiring lines 21 and the second wiring lines 22 may be plating layers that are formed by using an electroplating method.

For example, the aperture ratios At of the mesh wiring layers 20 as a whole may be in a range of 87% or more and less than 100%. When the aperture ratios At of the mesh wiring layers 20 as a whole is in this range, the transparency and conductivity of the wiring board 10 can be ensured. The aperture ratios At of the mesh wiring layers 20 as a whole is preferably 95% or more and less than 100% or 96% or more and less than 100%. This ensures the conductivity of the wiring board 10 and enables the transparency of the wiring board 10 to be enhanced. An aperture ratio is the percentage (%) of the area of an opening region that occupies a predetermined region (for example, the entire region of each mesh wiring layer 20) per unit area. The opening region is a region in which metal portions such as the first wiring lines 21 and the second wiring lines 22 are not present, where the substrate 11 is exposed.

The sheet resistance value of each mesh wiring layer 20 may be 4Ω/□ or less. When the sheet resistance value is 4Ω/□ or less, the performance of each mesh wiring layer 20 can be maintained. Specifically, the radiation efficiency of the mesh wiring layers 20 that serve as an antenna can be increased. A radiation efficiency means a percentage that represents the degree of radiation of power that is inputted into each mesh wiring layer 20.

The sheet resistance value (Ω/□) of each mesh wiring layer 20 can be obtained in the following manner. That is, a resistance value R between both end portions 20e1 and 20e2 (see FIG. 8) of each mesh wiring layer 20 in the longitudinal direction (the Y-direction) is measured. Subsequently, the resistance value R is divided by a ratio $(L_a/W_a)$ between the length $L_a$ and width $W_a$ of each mesh wiring layers 20, and consequently, the sheet resistance value Rs (Ω/□) of each mesh wiring layer 20 can be obtained. That is, the sheet resistance value $Rs=R \times W_a/L_a$ is satisfied.

When the sheet resistance value of each mesh wiring layer 20 is thus 4Ω/□ or less, the radiation efficiency of each mesh wiring layer 20 can be increased, and the performance of the mesh wiring layers 20 that serve as an antenna can be increased. The width $W_a$ and the height $H_1$ or $H_2$ of each mesh wiring layer 20 can be minimized as possible in ranges in which the sheet resistance value described above is satisfied. For this reason, the aperture ratios At of the mesh wiring layers 20 can be increased, and the mesh wiring layers 20 can be unlikely to be visible.

A protective layer may be formed on the front surface of the substrate 11 so as to cover the mesh wiring layers 20 although this is not illustrated. The protective layer protects the mesh wiring layers 20 and is formed so as to cover at least the mesh wiring layers 20 on the substrate 11. Examples of the material of the protective layer can include acrylic resin such as polymethyl (meth) acrylate and polyethyl (meth) acrylate, modified resin thereof, copolymer thereof, polyvinyl resin such as polyester, polyvinyl alcohol, polyvinyl acetate, polyvinyl acetal, and polyvinyl butyral, copolymer thereof, and colorless transparent insulating resin such as polyurethane, epoxy resin, polyamide, and chlorinated polyolefin.

Referring to FIG. 4 again, the power supply portions 40 are electrically connected to the mesh wiring layers 20. The power supply portions 40 include conductive thin plate members that have a substantially rectangular shape. The longitudinal direction of the power supply portions 40 is parallel with the X-direction. The transverse direction of the power supply portions 40 is parallel with the Y-direction. The power supply portions 40 are disposed at end portions of the substrate 11 in the longitudinal direction (that is, end portions in the negative Y-direction). Examples of the materials of the power supply portions 40 can include metal materials such as gold, silver, copper, platinum, tin, aluminum, iron, and nickel and alloys that contain these metals. The power supply portions 40 are electrically connected to the communication module 63 of the image display apparatus 60 with the power supply lines, not illustrated, interposed therebetween when the wiring board 10 is incorporated into the image display apparatus 60 (see FIG. 1 and FIG. 2). The power supply portions 40 are provided on the first surface 11a of the substrate 11 but are not limited thereto. Some or all of the power supply portions 40 may be located outside the periphery of the substrate 11. The power supply portions 40 may be flexible such that the power supply portions 40 extend to a side surface or back surface of the image display apparatus 60. In this case, the power supply portions 40 may be electrically connected to the communication module 63 at the side surface or back surface of the image display apparatus 60.

A method of manufacturing the wiring board 10 according to the present embodiment will now be described with reference to FIG. 9(a) to FIG. 9(f).

Figures 9A, 9B, 9C, 9D, 9E, 9F:
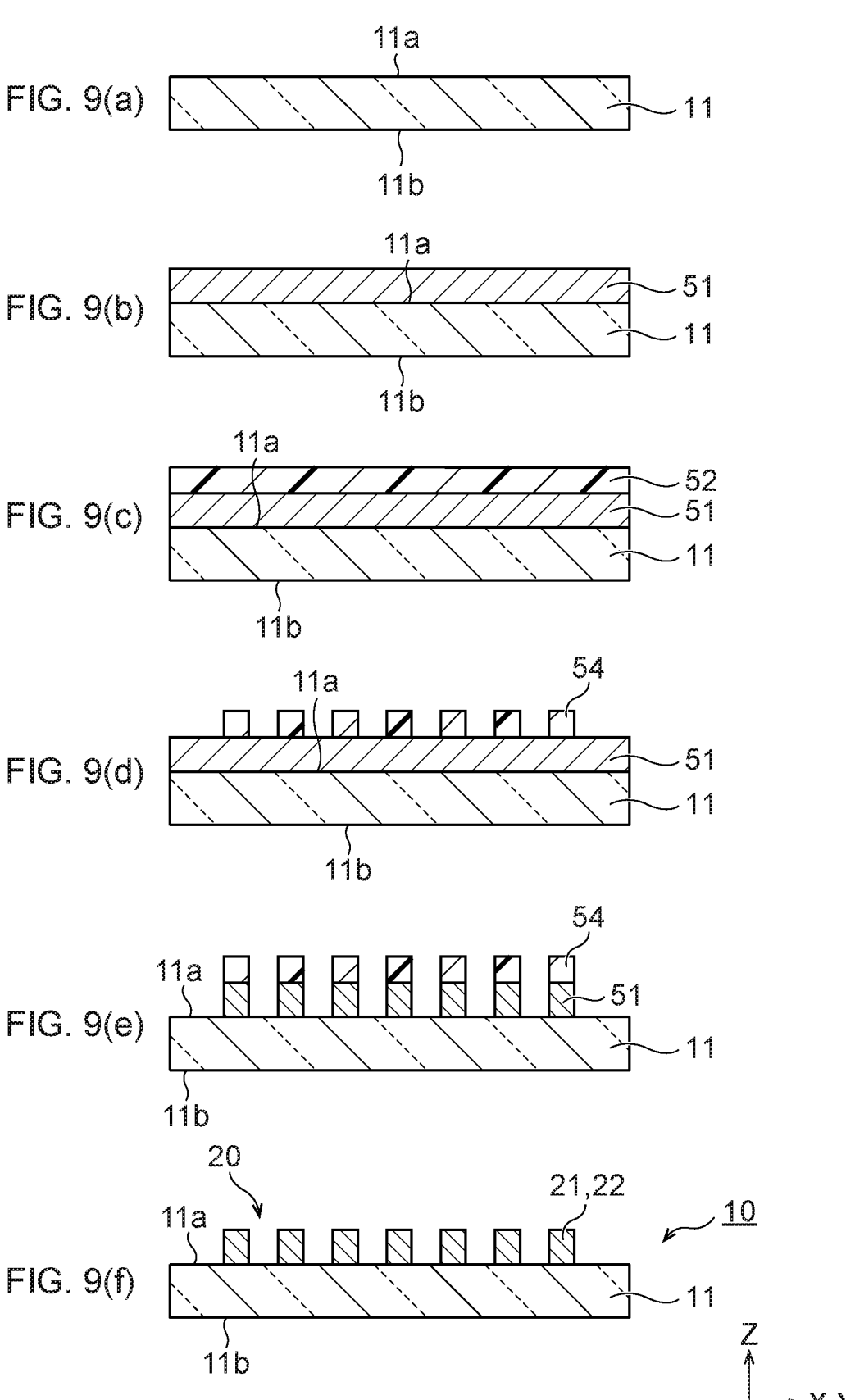
FIG. 9(*a*) to FIG. 9(*f*) are sectional views for a method of manufacturing the wiring board according to the first embodiment.

As illustrated in FIG. 9(a), the substrate 11 that has the first surface 11a and the second surface 11b that is opposite the first surface 11a is first prepared. The substrate 11 is transparent.

Subsequently, the mesh wiring layers 20 and the power supply portions 40 that are electrically connected to the mesh wiring layers 20 are formed on the first surface 11a of the substrate 11.

At this time, as illustrated in FIG. 9(b), metal foil 51 is stacked over the entire region of the first surface 11a of the substrate 11. According to the present embodiment, the thickness of the metal foil 51 may be 0.1 μm or more and 5.0 μm or less. According to the present embodiment, the metal foil 51 may contain copper.

Subsequently, as illustrated in FIG. 9(c), photocurable insulating resist 52 is applied to the entire region of the front surface of the metal foil 51. Examples of the photocurable insulating resist 52 include organic resin such as acrylic resin and epoxy resin.

Subsequently, as illustrated in FIG. 9(d), an insulating layer 54 is formed by using a photolithography method. In this case, the photocurable insulating resist 52 is patterned by using the photolithography method, and the insulating layer 54 (that is, a resist pattern) is formed. At this time, the insulating layer 54 is formed such that the metal foil 51 that corresponds to the first wiring lines 21 and the second wiring lines 22 is exposed.

Subsequently, as illustrated in FIG. 9(e), a portion of the metal foil 51 on the first surface 11a of the substrate 11 that is not covered by the insulating layer 54 is removed. At this time, wet processing is performed by using strong acid such as ferric chloride, cupric chloride, sulfuric acid or hydrochloric acid, persulfate, hydrogen peroxide, an aqueous solution thereof, or a combination thereof, and consequently, the metal foil 51 is etched such that the first surface 11a of the substrate 11 is exposed.

Subsequently, as illustrated in FIG. 9(f), the insulating layer 54 is removed. In this case, wet processing is performed by using a permanganate solution, N-methyl-2-pyrrolidone, an acid, or alkali solution, or dry processing is performed by using oxygen plasma, and consequently, the insulating layer 54 on the metal foil 51 is removed.

In this way, the wiring board 10 that includes the substrate 11 and the mesh wiring layers 20 that are provided on the first surface 11a of the substrate 11 is obtained. In this case, the mesh wiring layers 20 include the first wiring lines 21 and the second wiring lines 22. At this time, the power supply portions 40 may be formed by using a portion of the metal foil. Alternatively, the power supply portions 40 that have a plate shape may be prepared, and the power supply portions 40 may be electrically connected to the mesh wiring layers 20.

Subsequently, the display device 61 is stacked with the wiring board 10 with the first transparent adhesive layer 95 and the second transparent adhesive layer 96 interposed therebetween, and consequently, the image display apparatus 60 that includes the wiring board 10 and the display device 61 that is stacked with the wiring board 10 is obtained.

Actions according to the present embodiment that is thus configured will now be described.

As illustrated in FIG. 1 and FIG. 2, the wiring board 10 is incorporated into the image display apparatus 60 that includes the display device 61. At this time, the wiring board 10 is disposed along the display device 61. The mesh wiring layers 20 of the wiring board 10 are electrically connected to the communication module 63 of the image display apparatus 60 with the power supply portions 40 interposed therebetween. In this way, a radio wave at a predetermined frequency can be transmitted and received by using the mesh wiring layers 20, and the use of the image display apparatus 60 enables communication.

As for the image display apparatus 60, the mesh wiring layers 20 of the wiring board 10 overlap the pixels P of the display device 61 in the Z-direction as described above. For this reason, the moire pattern can be formed due to the regularity (periodicity) of the mesh wiring layers 20 and the regularity (periodicity) of the pixels P.

According to the present embodiment, however, 95% or more opening portions 23 among the 100 opening portions 23 or all of the opening portions 23 satisfy the relationship of $0.70D \leq d \leq 0.98D$ or satisfy the relationship of $1.02D \leq d \leq 1.30D$, where d is the distances between the sides that extend in the predetermined direction regarding the opening portions 23, and D is the average value of the distances d between the sides that extend in the predetermined direction regarding the 100 opening portions 23 continuously adjacent to each other or all of the opening portions 23. Consequently, the first wiring lines 21, the second wiring lines 22, and the pixels P are irregularly arranged when viewed in the Z-direction. For this reason, the pitch of the moire pattern formed due to the regularity (periodicity) of the mesh wiring layers 20 and the regularity (periodicity) of the pixels P can be reduced to such an extent that the pitch is invisible by the naked eye. When the wiring board 10 satisfies the relationship described above, the sizes of the opening portions 23 in the mesh wiring layers 20 do not vary, and the mesh wiring layers 20 can be unlikely to be visible by the naked eye.

According to the present embodiment, the two or more opening portions 23 are formed by being surrounded by the first wiring lines 21 and the second wiring lines 22, and the planar shape of each opening portion 23 is a polygonal shape that has opposing sides parallel with each other. In other words, the first wiring lines 21 linearly extend in a plan view and are parallel with each other, and the second wiring lines 22 linearly extend in a plan view and are parallel with each other. For this reason, flicker caused by the reflection of visible light due to the mesh wiring layers 20 can be reduced. The first wiring lines 21, for example, linearly extend in a plan view and are parallel with each other, and consequently, the full lengths of the first wiring lines 21, for example, can be reduced unlike the case where the first wiring lines 21, for example, curve in a plan view. For this reason, the sheet resistance value of each mesh wiring layer 20 can be reduced, and the antenna characteristics thereof can be maintained.

According to the present embodiment, the wiring board 10 includes the substrate 11 and the mesh wiring layers 20 that are disposed on the substrate 11. The substrate 11 is transparent. Each mesh wiring layer 20 includes a conductive portion that serves as a formation portion for an opaque conductive layer and has a mesh pattern due to a large number of the opening portions 23. For this reason, the transparency of the wiring board 10 is ensured. Consequently, when the wiring board 10 is disposed along the display device 61, the display device 61 is visible from the opening portions 23 of the mesh wiring layers 20, and the visibility of the display device 61 is not impaired.

Modifications to the wiring board will now be described.

Figure 10:
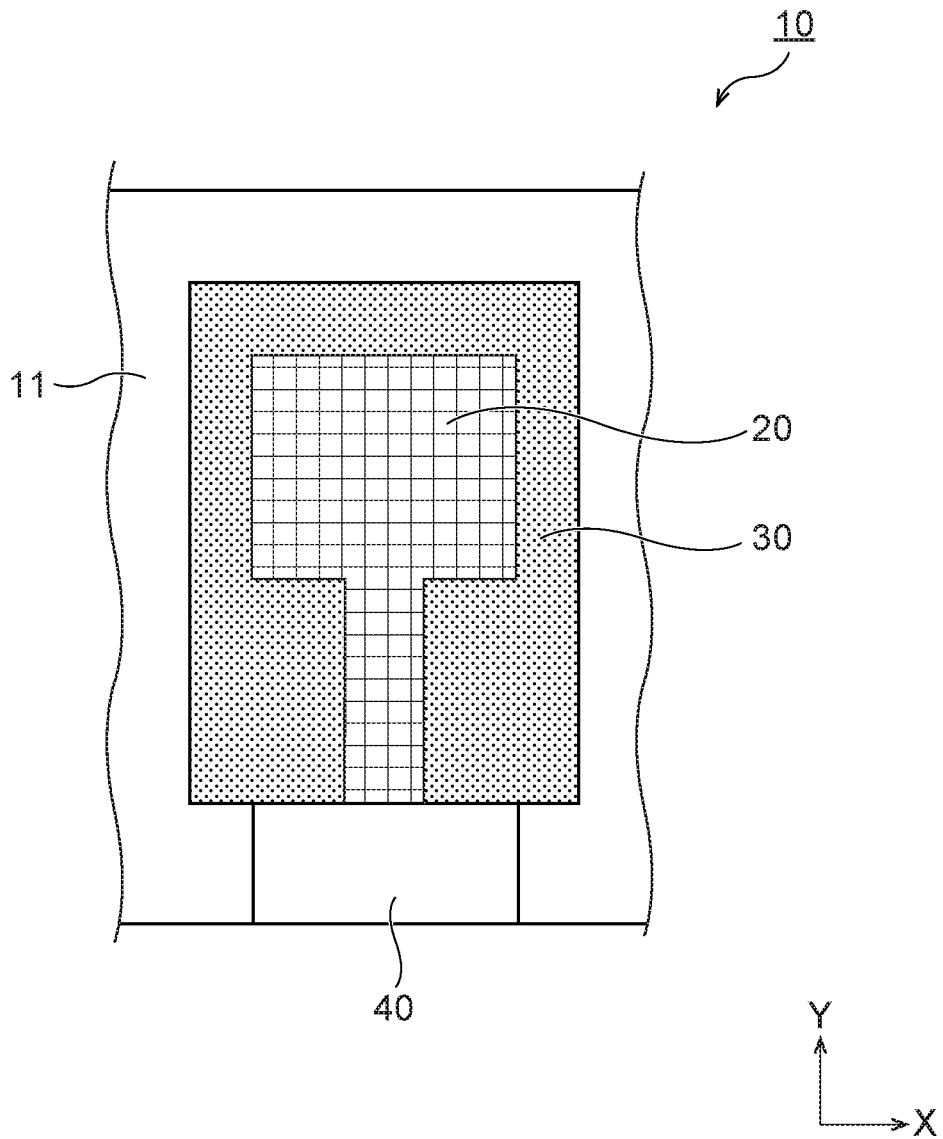
FIG. 10 is a plan view of a wiring board according to a first modification.
Figure 11:
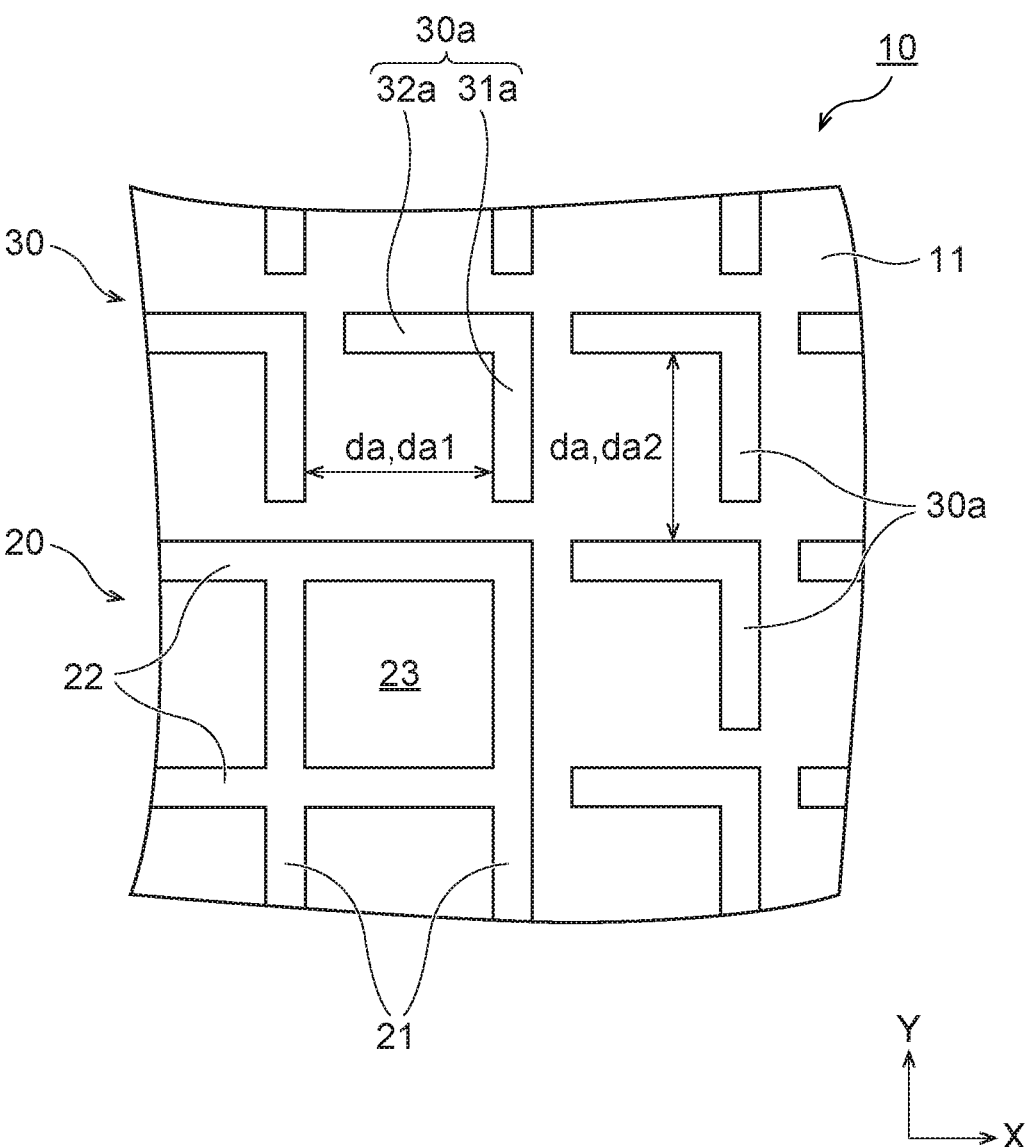
FIG. 11 is an enlarged plan view of the wiring board according to the first modification.

FIG. 10 and FIG. 11 illustrate a first modification to the wiring board. The modification illustrated in FIG. 10 and FIG. 11 differs therefrom in including dummy wiring layers 30 that are provided around the mesh wiring layers 20, and the other components are substantially the same as those according to the embodiment illustrated in FIG. 1 to FIG. 9 described above. In FIG. 10 and FIG. 11, components like to those according to the embodiment illustrated in FIG. 1 to FIG. 9 are designated by using like reference signs, and a detailed description is omitted.

As for the wiring board 10 illustrated in FIG. 10, the dummy wiring layers 30 are provided around the mesh wiring layers 20. The dummy wiring layers 30 do not function as an antenna substantially unlike the mesh wiring layers 20.

As illustrated in FIG. 11, the dummy wiring layers 30 include dummy wiring lines 30a that have a predetermined pattern and that are repeatedly provided. That is, the dummy wiring layers 30 include the multiple dummy wiring lines 30a, and the dummy wiring lines 30a are electrically separated from the mesh wiring layers 20 (that is, the first wiring lines 21 and the second wiring lines 22). The multiple dummy wiring lines 30a are regularly arranged over the entire region in the dummy wiring layers 30. The multiple dummy wiring lines 30a are separated from each other in a planar direction and are disposed on the substrate 11 so as to protrude. That is, the dummy wiring lines 30a are electrically separated from the mesh wiring layers 20, the power supply portions 40, and the other dummy wiring lines 30a. The dummy wiring lines 30a are substantially L-shaped lines in a plan view.

In this case, the shapes of the dummy wiring lines 30a are the same as those obtained by removing portions of the patterns of the mesh wiring layers 20 described above. This enables differences between the mesh wiring layers 20 and the dummy wiring layers 30 to be unlikely to be visually recognized and enables the mesh wiring layers 20 that are disposed on the substrate 11 to be unlikely to be visible. As illustrated in FIG. 11, the dummy wiring lines 30a are parallel with the first wiring lines 21 or the second wiring lines 22. Specifically, the dummy wiring lines 30a include first portions 31a parallel with the first wiring lines 21 and second portions 32a parallel with the second wiring lines 22. When the dummy wiring lines 30a are thus parallel with the first wiring lines 21 or the second wiring lines 22, the mesh wiring layers 20 that are disposed on the substrate 11 can be more unlikely to be visible. The aperture ratios of the dummy wiring layers 30 may be equal to or differs from the aperture ratios of the mesh wiring layers 20 and are preferably close to the aperture ratios of the mesh wiring layers 20.

According to the present modification, as illustrated in FIG. 11, distances between portions of the dummy wiring lines 30a that extend in a predetermined direction are designated as $d_a$. The average value of the distances $d_a$ between the portions that extend in the predetermined direction regarding 100 sets of the dummy wiring lines 30a continuously adjacent to each other is designated as $D_a$. According to the present modification, 95% or more dummy wiring lines 30a among the 100 sets of the dummy wiring lines 30a may satisfy a relationship of $0.70\,D_a \leq d_a \leq 0.98\,D_a$ or satisfy a relationship of $1.02\,D_a \leq d_a \leq 1.30\,D_a$. The pitch of moire pattern formed due to the regularity (periodicity) of the dummy wiring lines 30a and the regularity (periodicity) of the pixels P of the display device 61 can be reduced to such an extent that the pitch is invisible by the naked eye. One direction may be the X-direction or may be the Y-direction.

As for the wiring board 10, in the case where the number of the sets of the dummy wiring lines 30a is less than 100, the average value of the distances $d_a$ between the portions that extend in the predetermined direction regarding all of the dummy wiring lines 30a may be designated as $D_a$. Also in this case, 95% or more dummy wiring lines 30a among all of the dummy wiring lines 30a may satisfy the relationship of $0.70\,D_a \leq d_a \leq 0.98\,D_a$ or satisfy the relationship of $1.02\,D_a \leq d_a \leq 1.30\,D_a$.

In an example illustrated in FIG. 11, the distances $d_a$ between the first portions 31a are designated as $d_{a1}$. In this case, 95% or more dummy wiring lines 30a among the 100 sets of the dummy wiring lines 30a or all of the dummy wiring lines 30a may satisfy a relationship of $0.70D_{a1} \leq d_{a1} \leq 0.98D_{a1}$ or satisfy a relationship of $1.02D_{a1} \leq d_{a1} \leq 1.30D_{a1}$, where $D_{a1}$ is the average value of the distances $d_{a1}$ regarding the 100 sets of the dummy wiring lines 30a continuously adjacent to each other or all of the dummy wiring lines 30a.

Similarly, the distances $d_a$ between the second portions 32a are designated as $d_{a2}$. In this case, 95% or more dummy wiring lines 30a among the 100 sets of the dummy wiring lines 30a or all of the dummy wiring lines 30a may satisfy a relationship of $0.70D_{a2} \leq d_{a2} \leq 0.98D_{a2}$ or satisfy a relationship of $1.02D_{a2} \leq d_{a2} \leq 1.30D_{a2}$, where $D_{a2}$ is the average value of the distances $d_{a2}$ regarding the 100 sets of the dummy wiring lines 30a continuously adjacent to each other or all of the dummy wiring lines 30a.

According to the present modification, 95% or more dummy wiring lines 30a among the 100 sets of the dummy wiring lines 30a described above or all of the dummy wiring lines 30a preferably satisfy a relationship of 0.85 $D_a \leq d_a \leq 0.98 \, D_a$ or satisfy a relationship of $1.02 \, D_a \leq d_a \leq 1.15 \, D_a$. According to the present modification, 95% or more dummy wiring lines 30a among the 100 sets of the dummy wiring lines 30a described above or all of the dummy wiring lines 30a is more preferably satisfy a relationship of 0.90 $D_a \leq d_a \leq 0.98 \, D_a$ or satisfy a relationship of $1.02 \, D_a \leq d_a \leq 1.10 \, D_a$.

According to the present modification, the dummy wiring layers 30 that are electrically separated from the mesh wiring layers 20 are provided around the mesh wiring layers 20, and this enables outer edges of the mesh wiring layers 20 to be unclear. This enables the mesh wiring layers 20 to be unlikely to be visible on the front surface of the image display apparatus 60 and enables the mesh wiring layers 20 to be unlikely to be recognized by the naked eye of the user of the image display apparatus 60.

Figure 12:
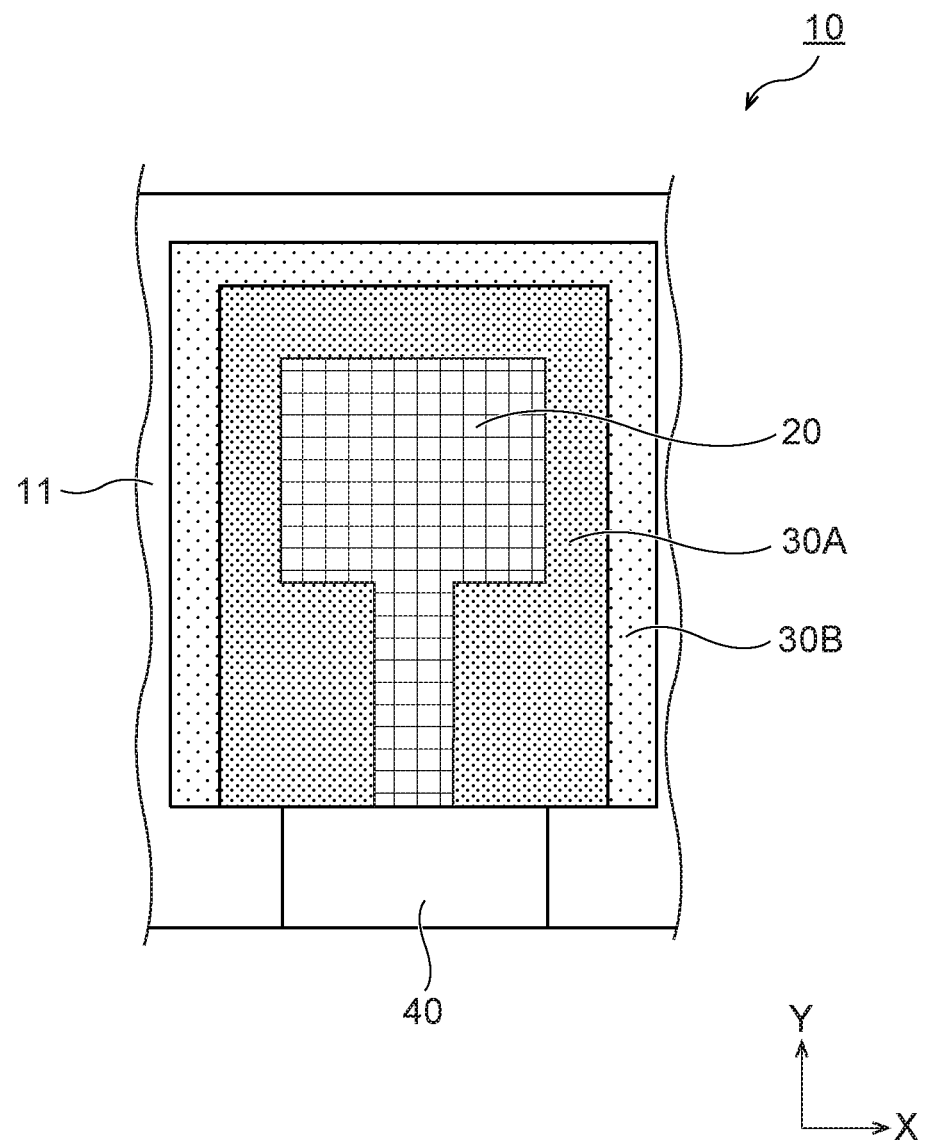
FIG. 12 is a plan view of a wiring board according to a second modification.
Figure 13:
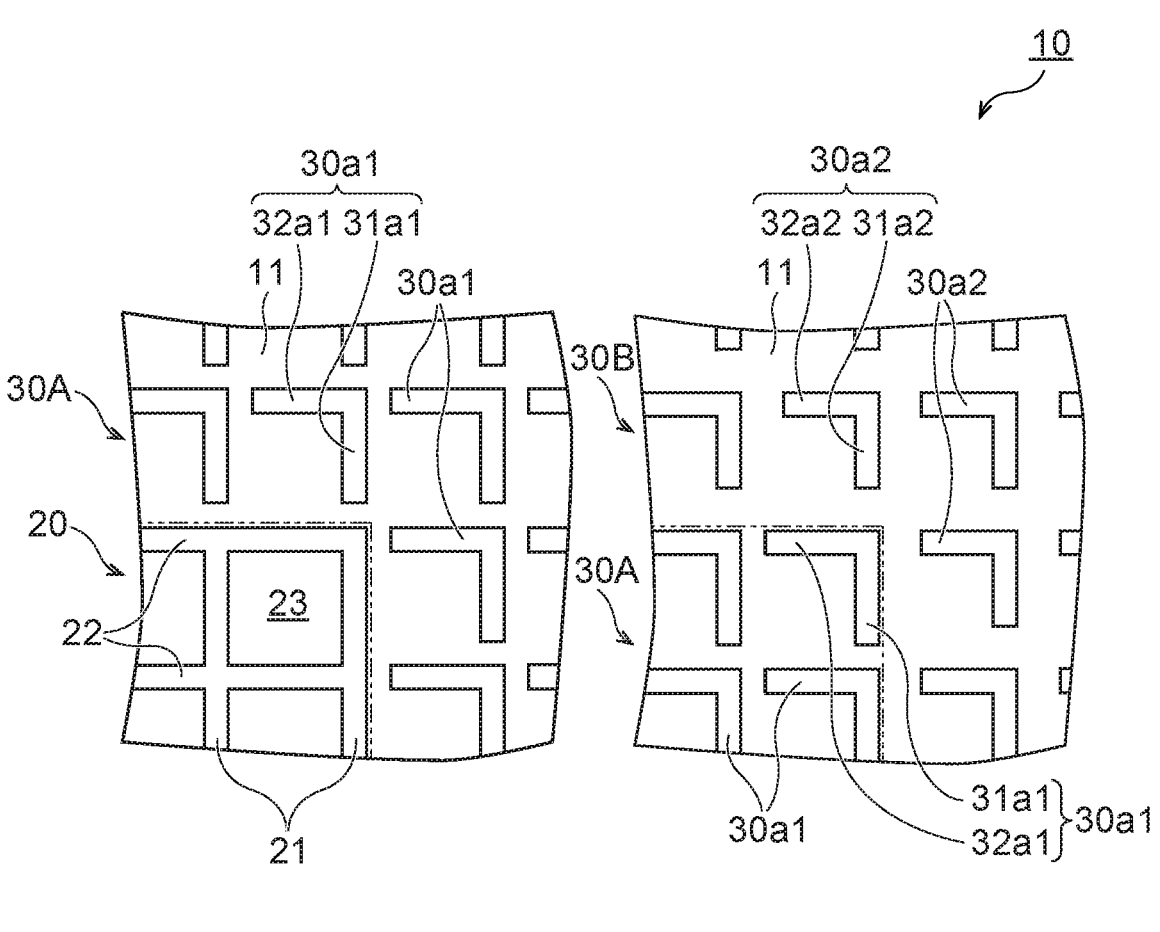
FIG. 13 is an enlarged plan view of the wiring board according to the second modification.

FIG. 12 and FIG. 13 illustrate a second modification to the wiring board. The modification illustrated in FIG. 12 and FIG. 13 differs therefrom in including two or more dummy wiring layers 30A and 30B that have different aperture ratios and that are provided around the mesh wiring layers 20, and the other components are substantially the same as those according to the embodiment illustrated in FIG. 1 to FIG. 11 described above. In FIG. 12 and FIG. 13, components like to those according to the embodiment illustrated in FIG. 1 to FIG. 11 are designated by using like reference signs, and a detailed description is omitted.

As for the wiring board 10 illustrated in FIG. 12, the two or more (two in this case) dummy wiring layers 30A and 30B (that is, the first dummy wiring layers 30A and the second dummy wiring layers 30B) that have different aperture ratios are provided around the mesh wiring layers 20. Specifically, the first dummy wiring layers 30A are arranged around the mesh wiring layers 20, and the second dummy wiring layers 30B are arranged around the first dummy wiring layers 30A. The dummy wiring layers 30A and 30B do not function as an antenna substantially unlike the mesh wiring layers 20.

As illustrated in FIG. 13, the first dummy wiring layers 30A include dummy wiring lines 30a1 that have a predetermined pattern and that are repeatedly provided. The second dummy wiring layers 30B include dummy wiring lines 30a2 that have a predetermined pattern and that are repeatedly provided. That is, the dummy wiring layers 30A and 30B include the multiple dummy wiring lines 30a1 and 30a2, and the dummy wiring lines 30a1 and 30a2 are electrically separated from the mesh wiring layers 20. The dummy wiring lines 30a1 and 30a2 are regularly arranged over the entire region in the dummy wiring layers 30A and 30B. The dummy wiring lines 30a1 and 30a2 are separated from each other in the planar direction and are disposed on the substrate 11 so as to protrude. The dummy wiring lines 30a1 and 30a2 are electrically separated from the mesh wiring layers 20, the power supply portions 40, and the other dummy wiring lines 30a1 and 30a2. The dummy wiring lines 30a1 and 30a2 are substantially L-shaped lines in a plan view.

In this case, the shapes of the dummy wiring lines 30a1 and 30a2 are the same as those obtained by removing portions of the patterns of the mesh wiring layers 20 described above. This enables differences between the mesh wiring layers 20 and the first dummy wiring layers 30A and differences between the first dummy wiring layers 30A and the second dummy wiring layers 30B to be unlikely to be visually recognized and enables the mesh wiring layers 20 that are disposed on the substrate 11 to be unlikely to be visible. As illustrated in FIG. 13, the dummy wiring lines 30a1 and 30a2 are parallel with the first wiring lines 21 or the second wiring lines 22. Specifically, the dummy wiring lines 30a1 include first portions 31a1 parallel with the first wiring lines 21 and second portions 32a1 parallel with the second wiring lines 22. The dummy wiring lines 30a2 include first portions 31a2 parallel with the first wiring lines 21 and second portions 32a2 parallel with the second wiring lines 22.

The area of each dummy wiring line 30a1 of the first dummy wiring layers 30A is larger than the area of each dummy wiring line 30a2 of the second dummy wiring layers 30B. In this case, the linewidth of each dummy wiring line 30a1 is equal to the linewidth of each dummy wiring line 30a2 but is not limited thereto, and the linewidth of each dummy wiring line 30a1 may be greater than the linewidth of each dummy wiring line 30a2. The other components of the dummy wiring lines 30a1 and 30a2 are the same as those of the dummy wiring lines 30a according to the first modification and are not described in detail here.

According to the present modification, the aperture ratios of the mesh wiring layers 20 and the two or more dummy wiring layers 30A and 30B preferably increase stepwise in order from the mesh wiring layers 20 to the dummy wiring layers 30A and 30B far from the mesh wiring layers 20. In other words, the aperture ratios of the dummy wiring layers preferably gradually increase in order from a dummy wiring layer close to one of the mesh wiring layers 20 to a dummy wiring layer far therefrom. In this case, the aperture ratios of the first dummy wiring layers 30A are preferably higher than the aperture ratios of one of the mesh wiring layers 20. The aperture ratios of the second dummy wiring layers 30B are preferably higher than the aperture ratios of the first dummy wiring layers 30A. This enables the outer edges of the mesh wiring layers 20 and outer edges of the dummy wiring layers 30A and 30B to be more unclear. For this reason, the mesh wiring layers 20 can be more unlikely to be visible on the front surface of the image display apparatus 60.

The dummy wiring layers 30A and 30B that are electrically separated from the mesh wiring layers 20 are thus disposed, and consequently, the outer edges of the mesh wiring layers 20 can be more unclear. This enables the mesh wiring layers 20 to be unlikely to be visible on the front surface of the image display apparatus 60 and enables the mesh wiring layers 20 to be unlikely to be visually recognized by the naked eye of the user of the image display apparatus 60. Three or more dummy wiring layers that have different aperture ratios may be provided around the mesh wiring layers 20.

Figure 14:
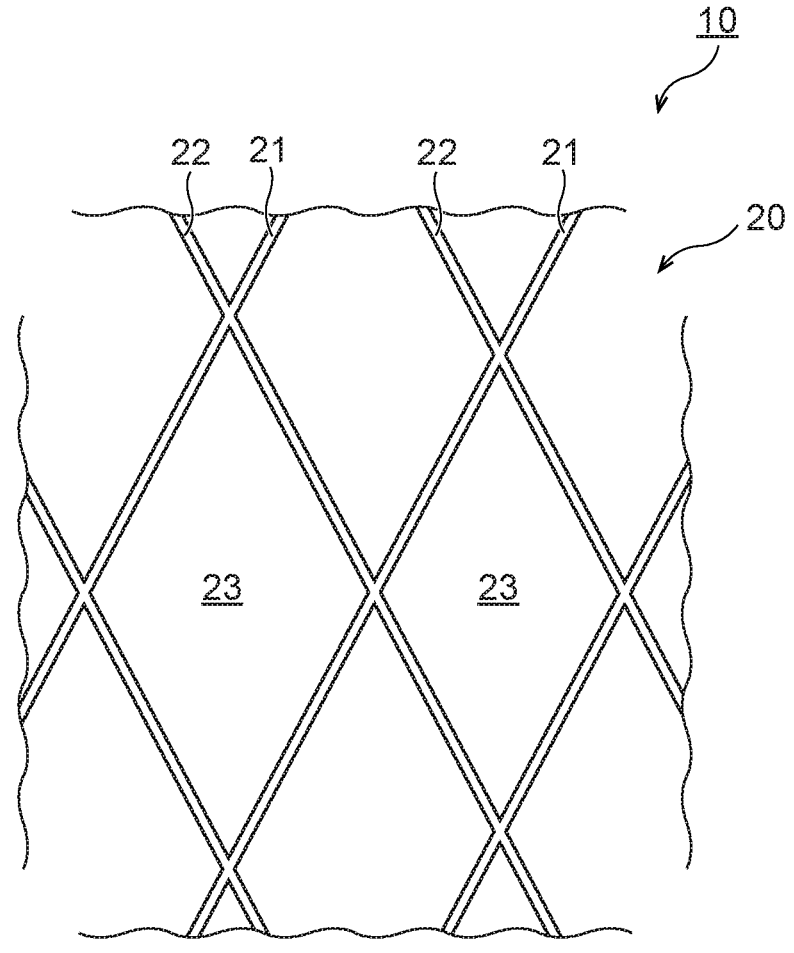
FIG. 14 is an enlarged plan view of a mesh wiring layer of a wiring board according to a third modification.
Figure 14:
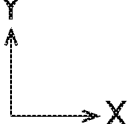

FIG. 14 illustrates a third modification to the wiring board. The modification illustrated in FIG. 14 differs therefrom in that the mesh wiring layers 20 have a different planar shape, and the other components are substantially the same as those according to the embodiment illustrated in FIG. 1 to FIG. 13 described above. In FIG. 14, components like to those according to the embodiment illustrated in FIG. 1 to FIG. 13 are designated by using like reference signs, and a detailed description is omitted.

FIG. 14 is an enlarged plan view of one of the mesh wiring layers 20 according to the third modification. In FIG. 14, the first wiring lines 21 and the second wiring lines 22 intersect with each other obliquely (that is, not at a right angle), and the shape of each opening portion 23 is a rhomboidal shape in a plan view. The first wiring lines 21 and the second wiring lines 22 are not parallel with the X-direction or the Y-direction, but the first wiring lines 21 or the second wiring lines 22 may be parallel with the X-direction or the Y-direction.

Figure 15:
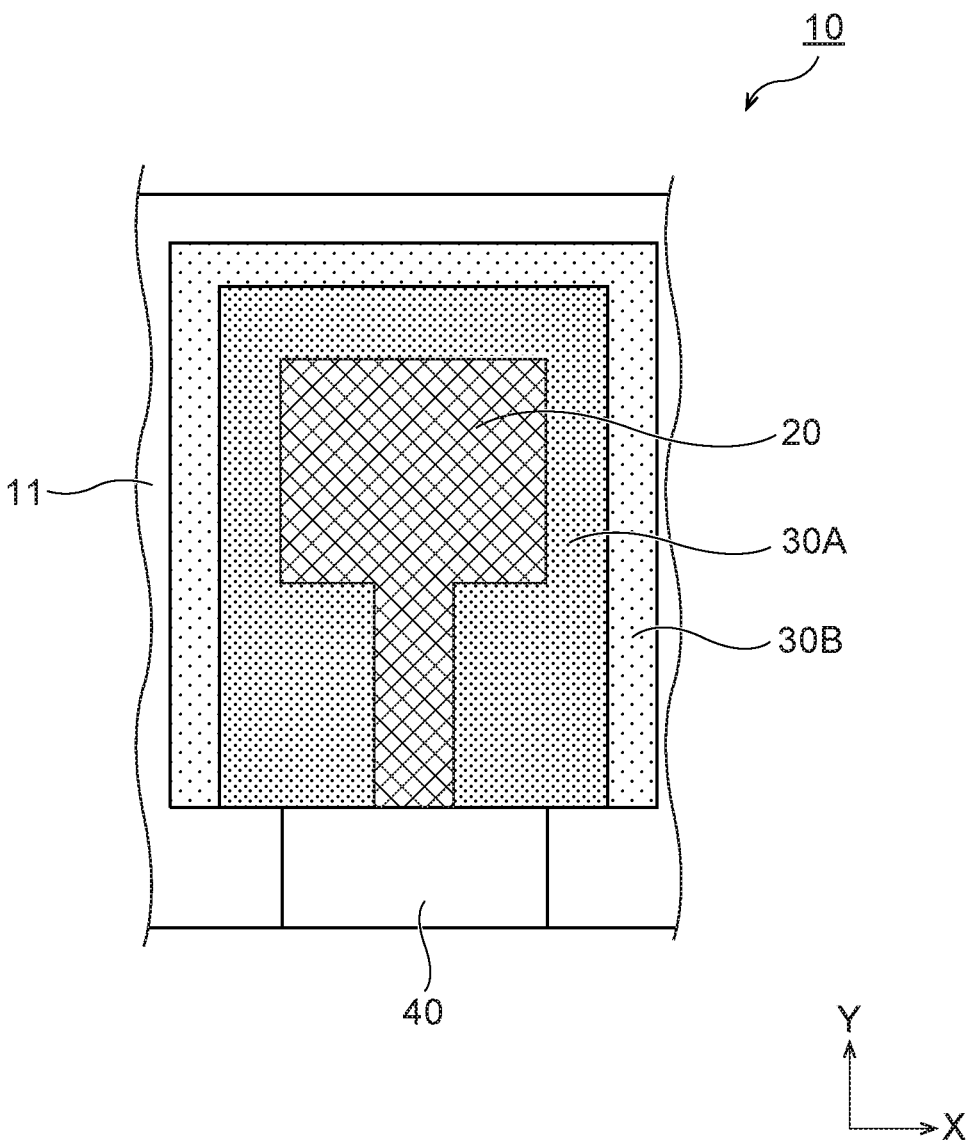
FIG. 15 is a plan view of a wiring board according to a fourth modification.
Figure 16:
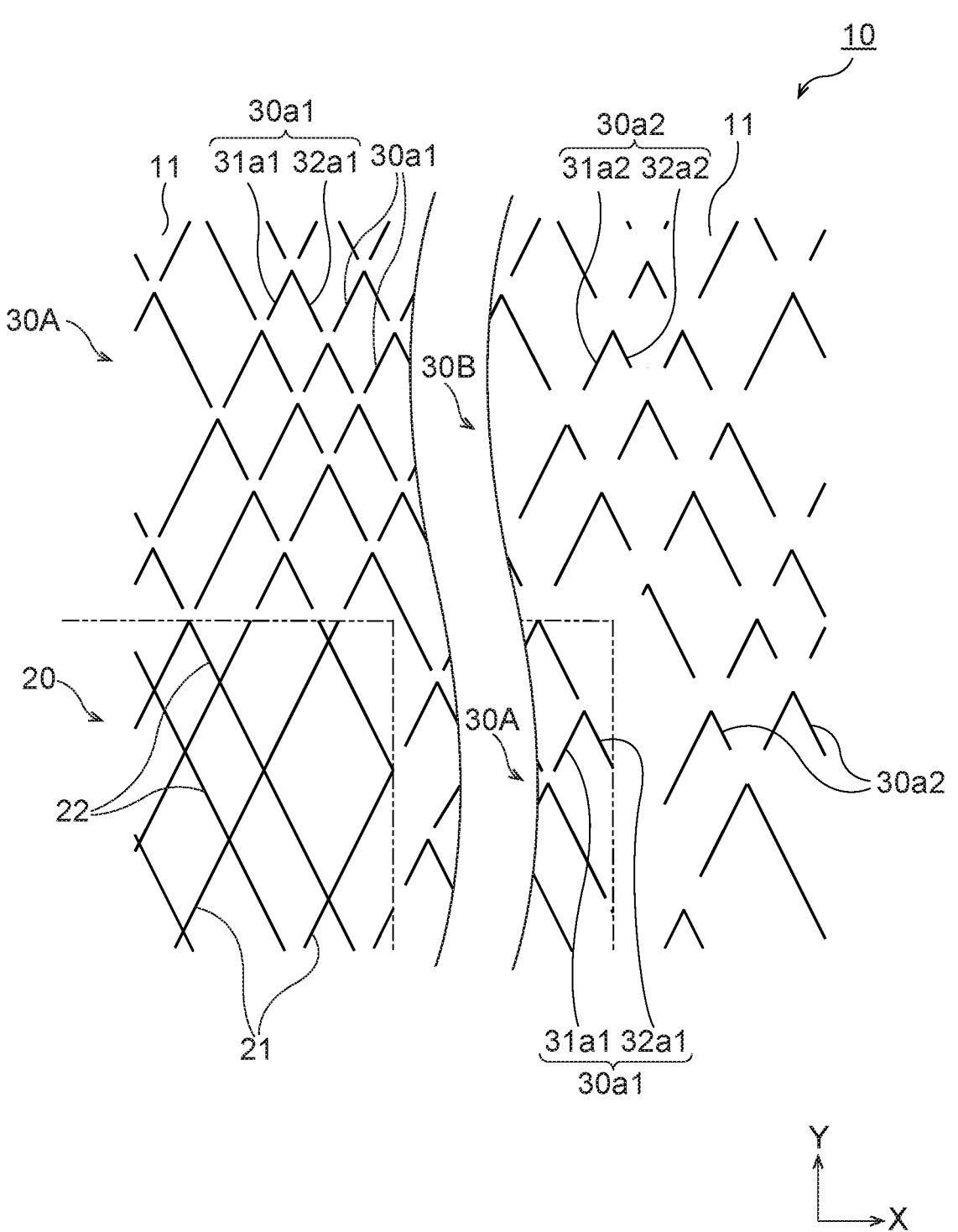
FIG. 16 is an enlarged plan view of the wiring board according to the fourth modification.

FIG. 15 and FIG. 16 illustrate a fourth modification to the wiring board. The modification illustrated in FIG. 15 and FIG. 16 differs therefrom in that the mesh wiring layers 20 have a different planar shape, and the two or more dummy wiring layers 30A and 30B that have different aperture ratios are provided around the mesh wiring layers 20, and the other components are substantially the same as those according to the embodiment illustrated in FIG. 1 to FIG. 14 described above. In FIG. 15 and FIG. 16, components like to those according to the embodiment illustrated in FIG. 1 to FIG. 14 are designated by using like reference signs, and a detailed description is omitted.

FIG. 15 and FIG. 16 are enlarged plan views of the mesh wiring layers 20 according to the fourth modification. In FIG. 15 and FIG. 16, the first wiring lines 21 and the second wiring lines 22 intersect with each other obliquely (that is, not at a right angle) as in the mesh wiring layers 20 according to the third modification illustrated in FIG. 14. The shape of each opening portion 23 is a rhomboidal shape in a plan view. The first wiring lines 21 and the second wiring lines 22 are not parallel with the X-direction or the Y-direction, but the first wiring lines 21 or the second wiring lines 22 may be parallel with the X-direction or the Y-direction.

As for the wiring board 10 illustrated in FIG. 15 and FIG. 16, the two or more (two in this case) dummy wiring layers 30A and 30B (that is, the first dummy wiring layers 30A and the second dummy wiring layers 30B) that have different aperture ratios are provided around the mesh wiring layers 20 as in the wiring board 10 according to the second modification illustrated in FIG. 12 and FIG. 13.

Also according to the present modification, as illustrated in FIG. 16, the dummy wiring lines 30a1 and 30a2 are parallel with the first wiring lines 21 or the second wiring lines 22. Specifically, the dummy wiring lines 30a1 include the first portions 31a1 parallel with the first wiring lines 21 and the second portions 32a1 parallel with the second wiring lines 22. The first portions 31a1 and the second portions 32a1 intersect with each other obliquely (that is, not at a right angle). The dummy wiring lines 30a2 include the first portions 31a2 parallel with the first wiring lines 21 and the second portions 32a2 parallel with the second wiring lines 22. The first portions 31a2 and the second portions 32a2 intersect with each other obliquely (that is, not at a right angle). The other components of the first dummy wiring layers 30A and the second dummy wiring layers 30B are the same as those of the first dummy wiring layers 30A and the second dummy wiring layers 30B according to the second modification and are not described in detail here.

Figure 17:
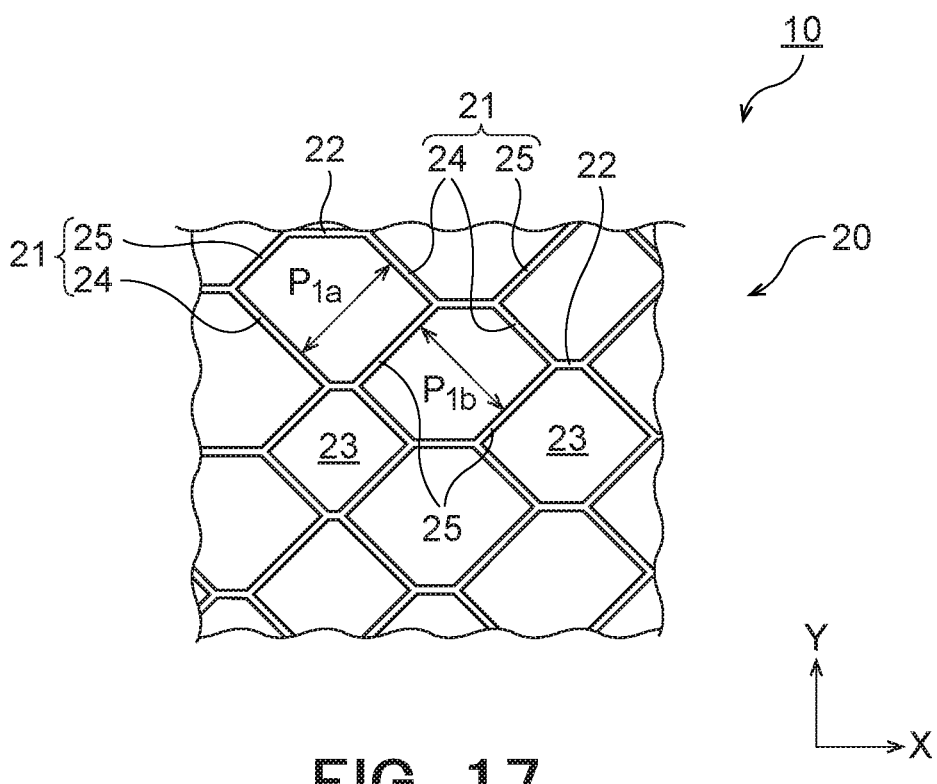
FIG. 17 is an enlarged plan view of a mesh wiring layer of a wiring board according to a fifth modification.

FIG. 17 illustrates a fifth modification to the wiring board. The modification illustrated in FIG. 17 differs therefrom in that the opening portions 23 have a different planar shape, and the other components are substantially the same as those according to the embodiment illustrated in FIG. 1 to FIG. 16 described above. In FIG. 17, components like to those according to the embodiment illustrated in FIG. 1 to FIG. 16 are designated by using like reference signs, and a detailed description is omitted.

As for the wiring board 10 illustrated in FIG. 17, the planar shape of each opening portion 23 is a hexagonal shape. According to the present modification, the first wiring lines 21 include first portions 24 and second portions 25 that intersect with each other obliquely (that is, not at a right angle). The first portions 24 and the second portions 25 are not parallel with the X-direction or the Y-direction.

The first portions 24 and the second portions 25 are irregularly arranged. Specifically, the multiple first portions 24 are parallel with each other, and the pitches $P_{1a}$ thereof are irregular. For example, the pitches Pia may be in a range of 0.01 mm or more and 1 mm or less. The multiple second portions 25 are parallel with each other, and the pitches $P_{1b}$ thereof are irregular. For example, the pitches $P_{1b}$ may be in a range of 0.01 mm or more and 1 mm or less.

The pitches $P_{1a}$ of the multiple first portions 24 and the pitches $P_{1b}$ of the multiple second portions 25 are thus irregular. This enables the pitch of the moire pattern formed due to the regularity (periodicity) of the mesh wiring layers 20 and the regularity (periodicity) of the pixels P of the display device 61 to be reduced to such an extent that the pitch is invisible by the naked eye. The first portions 24 are parallel with each other, and the second portions 25 are parallel with each other as described above. For this reason, even in the case where the pitches $P_{1a}$ and $P_{1b}$ are irregular, flicker caused by the reflection of visible light due to the mesh wiring layers 20 can be reduced.

In an example described according to the present modification, the planar shape of each opening portion 23 is a hexagonal shape, but the planar shape of each opening portion 23 may be an octagonal shape or a polygonal shape that include ten or more corner portions.

EXAMPLES

Specific examples of the present embodiment will now be described.

Example A1

The wiring board 10 that had the structure illustrated in FIG. 5A was manufactured. That is, the wiring board 10 that included the first wiring lines 21 and the second wiring lines 22 that were irregularly arranged was manufactured. In this case, the substrate of the wiring board 10 was a substrate that had a thickness of 100 μm and that was composed of polyethylene terephthalate. The first wiring lines 21 and the second wiring lines 22 were copper wiring lines having a linewidth of 1.0 μm and a height of 1.0 μm. At this time, the lengths $L_a$ of the end portions 20b of the mesh wiring layers 20 were 3.5 mm, and the widths $W_a$ were 4.2 mm.

As for the wiring board 10 in the example A1, the distances between the sides that extended in the longitudinal direction (that is, the Y-direction) of the first wiring lines 21 among the sides of the opening portions 23 were designated as d. In this case, the average value D of the distances d between the sides regarding 100 opening portions 23 continuously adjacent to each other in the Y-direction was 100 μm. The number of opening portions 23 that satisfied the relationship of 0.70D≤d≤0.98D (also simply referred to below as an expression 1) or satisfied the relationship of 1.02D≤d≤1.30D (also simply referred to below as an expression 2) among the 100 opening portions 23 was 100.

As for the wiring board 10 in the example A1, a difference between the aperture ratios of continuous square regions having a side of 1000 μm was 0.5% or less.

Subsequently, the visibility of the wiring board 10 was checked. At this time, the presence or absence of a moire pattern was first checked. At this time, the wiring board 10 was stacked with the display device 61 illustrated in FIG. 3, and these were observed. As for the display device 61, the pitches $P_X$ of the pixels P were 60 μm, and the pitches $P_Y$ of the pixels P were 60 μm. The wiring board 10 was visually observed with the display device 61 emitting white light from a position 300 mm away therefrom, and the presence or absence of a moire pattern was checked.

In addition, the presence or absence of flicker was checked. At this time, a black plate was placed on the back surface of the wiring board 10 (that is, in the negative Z-direction). Subsequently, light was emitted from a position facing the front surface of the wiring board 10 (that is, the positive Z-direction) by using a high luminance light. At this time, the light was emitted in a direction inclining with respect to the normal direction to the first surface 11a of the substrate 11. The wiring board 10 was visually observed from a position 300 mm away therefrom, and the presence or absence of flicker was checked.

Subsequently, as for the wiring board 10, the sheet resistance value (Q/c) of each mesh wiring layer 20 was measured. At this time, the resistance value R between both end portions 20e1 and 20e2 (see FIG. 8) of the mesh wiring layers 20 in the longitudinal direction (the Y-direction) was first measured. A digital multimeter (CDM-2000D made by CUSTOM corporation) was used as a measurement device. Subsequently, the resistance value R was divided by the ratio $(L_a/W_a)$ between the length $L_a$ and width $W_a$ of each mesh wiring layer 20, and consequently, the sheet resistance value Rs ($\Omega/\square$) of each mesh wiring layer 20 was obtained.

Example A2

The wiring board 10 that had the structure illustrated in FIG. 15 was manufactured. That is, the wiring board 10 that included the first wiring lines 21 and the second wiring lines 22 that were irregularly arranged was manufactured. In this case, the substrate of the wiring board 10 was a substrate that had a thickness of 100 μm and that was composed of polyethylene terephthalate. The first wiring lines 21 and the second wiring lines 22 were copper wiring lines having a linewidth of 1.0 μm and a height of 1.0 μm. At this time, the lengths L, of the end portions 20b of the mesh wiring layers 20 were 3.5 mm, and the widths $W_a$ were 4.2 mm.

As for the wiring board 10 in the example A2, the distances between the sides that extended in the longitudinal direction of the first wiring lines 21 among the sides of the opening portions 23 were designated as d. In this case, the average value D of the distances d between the sides regarding 100 opening portions 23 continuously adjacent to each other in the Y-direction was 100 μm. The number of opening portions 23 that satisfied the expression 1 or the expression 2 among the 100 opening portions 23 was 100.

As for the wiring board 10 in the example A2, a difference between the aperture ratios of continuous square regions having a side of 1000 μm was 0.5% or less.

Subsequently, the visibility of the wiring board 10 was checked, and the sheet resistance value of each mesh wiring layer 20 was measured as in the example A1.

Comparative Example A1

Figure 18:
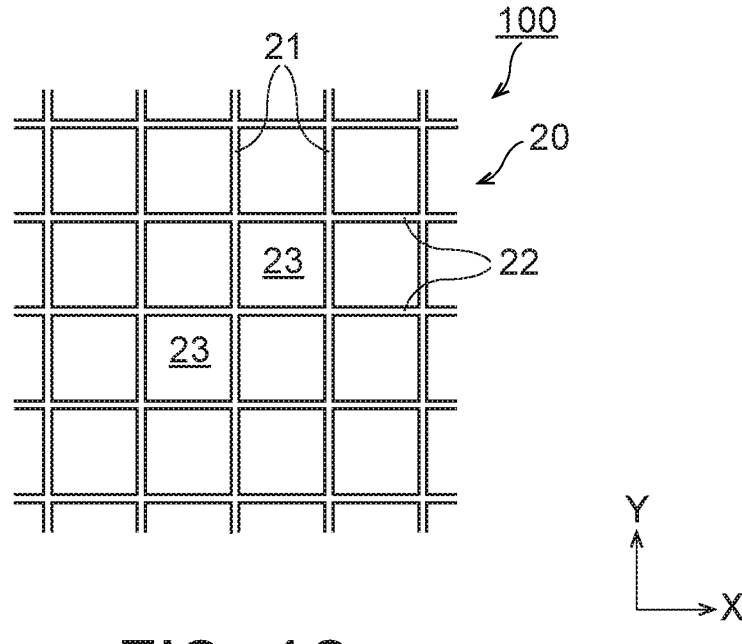
FIG. 18 is an enlarged plan view of a mesh wiring layer of a wiring board in a comparative example A1.

A wiring board 100 that had a structure illustrated in FIG. 18 was manufactured. That is, the wiring board 100 that included the first wiring lines 21 and the second wiring lines 22 that were regularly arranged was manufactured. Specifically, the wiring board 100 that included the first wiring lines 21 and the second wiring lines 22 that were arranged at substantially regular intervals was manufactured. In this case, the substrate of the wiring board 100 was a substrate that had a thickness of 100 μm and that was composed of polyethylene terephthalate. The first wiring lines 21 and the second wiring lines 22 were copper wiring lines having a linewidth of 1.0 μm and a height of 1.0 μm. At this time, the lengths $L_a$ of the end portions 20b of the mesh wiring layers 20 were 3.5 mm, and the widths $W_a$ were 4.2 mm.

As for the wiring board 100 in the comparative example A1, the distances between the sides that extended in the longitudinal direction of the first wiring lines 21 among the sides of the opening portions 23 were designated as d. In this case, the average value D of the distances d between the sides was 100 μm. The number of opening portions 23 that satisfied the expression 1 or the expression 2 among the 100 opening portions 23 was 0.

As for the wiring board 100 in the comparative example A1, a difference between the aperture ratios of continuous square regions having a side of 1000 μm was 0.5% or less.

Subsequently, the visibility of the wiring board 100 was checked, and the sheet resistance value of each mesh wiring layer 20 was measured as in the example A1.

Comparative Example A2

Figure 19:
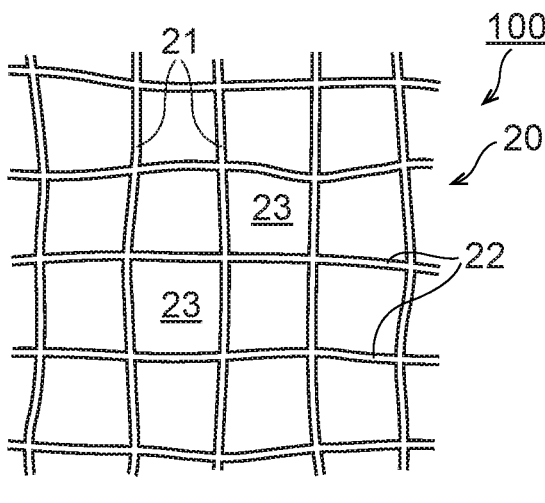
FIG. 19 is an enlarged plan view of a mesh wiring layer of a wiring board in a comparative example A2.
Figure 19:
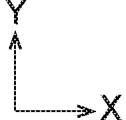

The wiring board 100 that had a structure illustrated in FIG. 19 was manufactured. That is, the wiring board 100 that included the opening portions 23 the planar shape of which was a quadrilateral shape that had opposing sides that were not parallel with each other was manufactured. In this case, the substrate of the wiring board 100 was a substrate that had a thickness of 100 μm and that was composed of polyethylene terephthalate. The first wiring lines 21 and the second wiring lines 22 were copper wiring lines having a linewidth of 1.0 μm and a height of 1.0 μm. At this time, the lengths $L_a$ of the end portions 20b of the mesh wiring layers 20 were 3.5 mm, and the widths $W_a$ were 4.2 mm.

As for the wiring board 100 in the comparative example A2, the average value of the distances between the sides was 100 μm. The distances between the sides were measured on an imaginary line that extended in the longitudinal direction (the X-direction) of the end portions 20b (see FIG. 4) of the mesh wiring layers 20 and that was drawn at a freely selected position.

As for the wiring board 100 in the comparative example A2, a difference between the aperture ratios of continuous square regions having a side of 1000 μm was 0.5% or less.

Subsequently, the visibility of the wiring board 100 was checked, and the sheet resistance value of each mesh wiring layer 20 was measured as in the example A1.

Comparative Example A3

Figure 20:
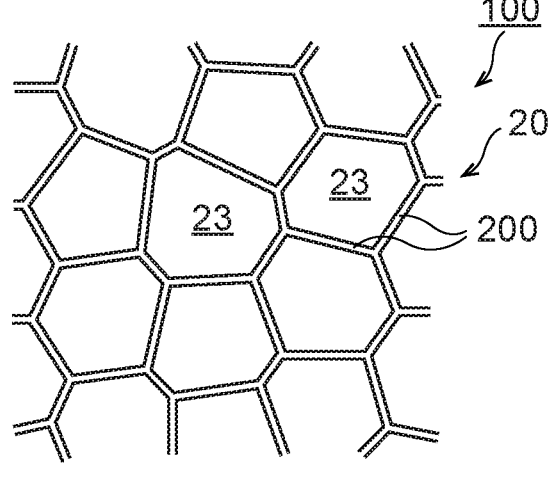
FIG. 20 is an enlarged plan view of a mesh wiring layer of a wiring board in a comparative example A3.
Figure 20:
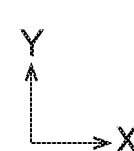

The wiring board 100 that had a structure illustrated in FIG. 20 was manufactured. That is, the wiring board 100 in which a planar structure that included wiring lines 200 of the mesh wiring layers 20 corresponded to a Voronoi pattern was manufactured. In this case, the substrate of the wiring board 100 was a substrate that had a thickness of 100 μm and that was composed of polyethylene terephthalate. The wiring lines 200 were copper wiring lines having a linewidth of 1.0 μm and a height of 1.0 μm. At this time, the lengths $L_a$ of the end portions 20b of the mesh wiring layers 20 were 3.5 mm, and the widths $W_a$ were 4.2 mm.

As for the wiring board 100 in the comparative example A3, the average value of the distances between the sides was 100 μm. The distances between the sides were measured on an imaginary line that extended in the longitudinal direction (the X-direction) of the end portions 20*b* (see FIG. 4) of the mesh wiring layers 20 and that was drawn at a freely selected position.

As for the wiring board 100 in the comparative example A3, a difference between the aperture ratios of continuous square regions having a side of 1000 μm was 0.5% or less.

Subsequently, the visibility of the wiring board 100 was checked, and the sheet resistance value of each mesh wiring layer 20 was measured as in the example A1.

The results of these are illustrated in Table 1.

TABLE 1

| | Planar shape (Structure) | Average value D (μm) | Number | Moire pattern | Flicker | Aperture ratio | Sheet resistance value |
|---|---|---|---|---|---|---|---|
| Example A1 | Quadrilateral shape | 100 | 100 | A | A | A | A |
| Example A2 | Hexagonal shape | 100 | 100 | A | A | A | A |
| Comparative example A1 | Quadrilateral shape | 100 | 0 | B | A | A | A |
| Comparative example A2 | Quadrilateral shape | — | — | A | B | A | B |
| Comparative example A3 | Voronoi pattern | — | — | A | B | A | B |

Numerals in a column of "Number" in Table 1 means the number of the opening portions 23 that satisfy the expression 1 or the expression 2 among the 100 opening portions 23.

In Table 1, "A" means an excellent result, and "B" means a poor result. Specifically, in a column of "Moire pattern" in Table 1, "A" means that the formation of the moire pattern was not found, and "B" means that the moire pattern was formed. In a column of "Flicker" in Table 1, "A" means that flicker due to reflected light was not found, and "B" means that the flicker due to reflected light occurred. In a column of "Aperture ratio" in Table 1, "A" means that a difference between the aperture ratios was 0.5% or less. In a column of "Sheet resistance value" in Table 1, "A" means that the sheet resistance value was equal to or less than a predetermined value, and "B" means that the sheet resistance value was larger than the predetermined value.

Consequently, as illustrated in Table 1, the wiring board 100 in the comparative example A1 formed the moire pattern. As for the wiring boards 10 in the example A1 and the example A2, however, the formation of the moire pattern was not found.

As for the wiring boards 100 in the comparative example A2 and the comparative example A3, as illustrated in Table 1, the flicker due to reflected light occurred. As for the wiring boards 10 in the example A1 and the example A2, however, the flicker due to reflected light was not found.

It is thus confirmed that the wiring board 10 according to the present embodiment enables the formation of the moire pattern to be reduced and enables the flicker due to reflected light to be reduced.

As for the wiring boards 10 in the example A1 and the example A2, as illustrated in Table 1, variations in the aperture ratios were able to be reduced as in the wiring board 100 in the comparative example A1. That is, even in the case where the first wiring lines 21, for example, were irregularly arranged, the variations in the aperture ratios were able to be reduced as in the wiring board 100 in which the first wiring lines 21, for example, were regularly arranged.

As for the wiring boards 10 in the example A1 and the example A2, as illustrated in Table 1, the sheet resistance value of each mesh wiring layer 20 was able to be reduced to a predetermined value or less as in the wiring board 100 in the comparative example A1. In this case, the sheet resistance value of each mesh wiring layer 20 of the wiring boards 10 in the example A1 and the example A2 was able to be at the same level as the sheet resistance value of each mesh wiring layer 20 of the wiring board 100 in the comparative example A1. That is, as for the wiring boards 10 in the example A1 and the example A2, the first wiring lines 21, for example, were irregularly arranged, but the lengths of the wiring lines such as the first wiring lines 21 were not changed unlike the case where the first wiring lines 21, for example, were regularly arranged. Consequently, even in the case where the first wiring lines 21, for example, were irregularly arranged, the sheet resistance value of each mesh wiring layer 20 was able to be at the same level as the sheet resistance value of each mesh wiring layer 20 of the wiring board 100 in which the first wiring lines 21, for example, were regularly arranged. For this reason, as for the wiring boards 10 in the example A1 and the example A2, the radiation efficiency of the mesh wiring layers 20 that served as an antenna was able to be increased as in the wiring board 100 in which the first wiring lines 21, for example, were regularly arranged.

Second Embodiment

An embodiment will now be described with reference to FIG. 21 to FIG. 24. FIG. 21 to FIG. 24 illustrate the present embodiment. In FIG. 21 to FIG. 24, components like to those according to the first embodiment illustrated in FIG. 1 to FIG. 20 are designated by using like reference signs, and a detailed description is omitted in some cases.

According to the present embodiment, the first wiring lines 21 and the second wiring lines 22 linearly extend in directions that are not parallel with the longitudinal direction (that is, the Y-direction) of the mesh wiring layers 20 or the width direction (that is, the X-direction) of the mesh wiring layers 20. That is, the first wiring lines 21 and the second wiring lines 22 are not parallel with the X-direction or the Y-direction. The first wiring lines 21 or the second wiring lines 22 may be parallel with the X-direction or the Y-direction.

Also according to the present embodiment, the multiple opening portions 23 are formed by being surrounded by the first wiring lines 21 adjacent to each other and the second wiring lines 22 adjacent to each other. The planar shape of each opening portion 23 is a substantially rhomboidal shape in a plan view. The substrate 11 that is transparent is exposed from the opening portions 23. This enables the transparency of the wiring board 10 as a whole to be enhanced.

Figure 21:
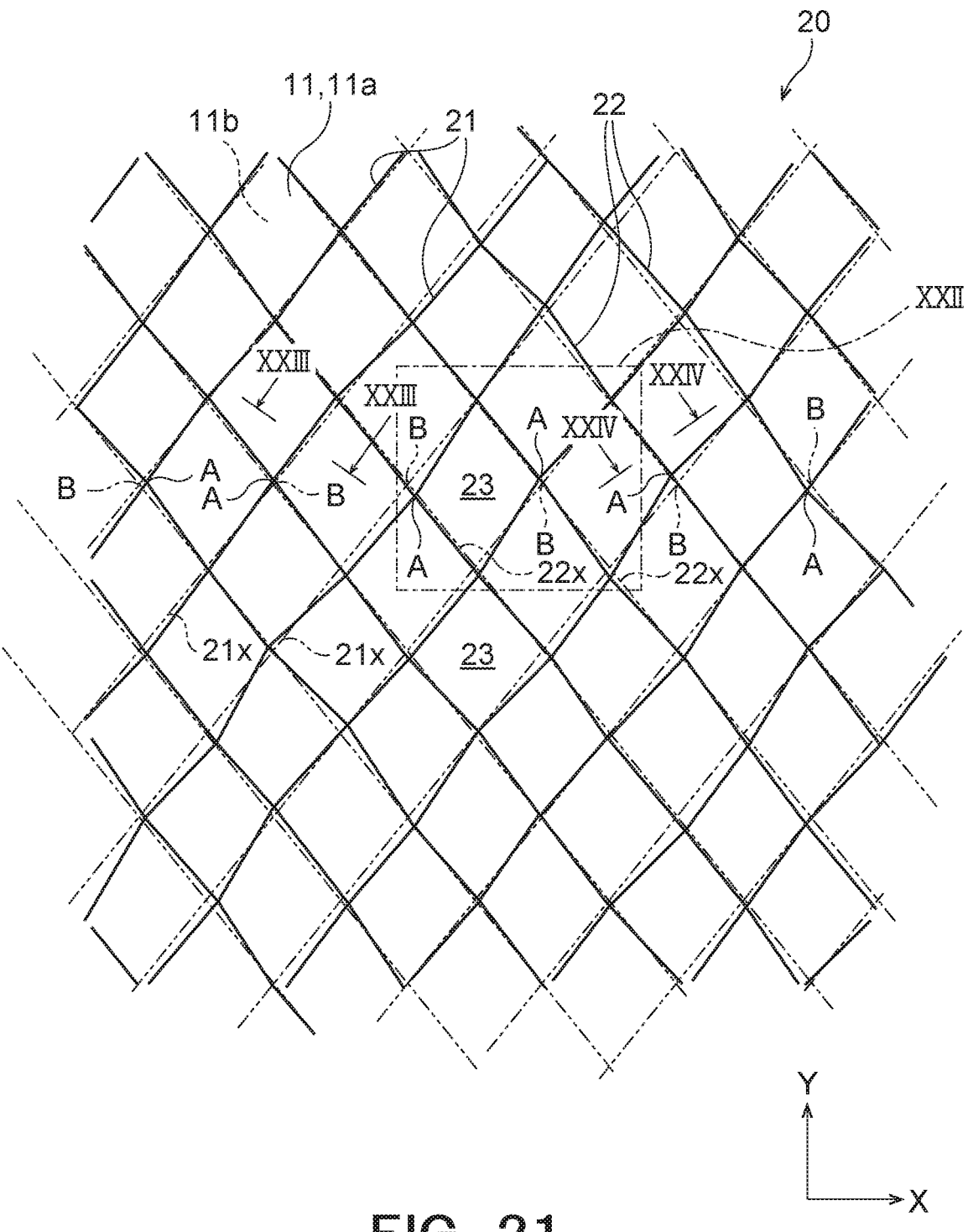
FIG. 21 is an enlarged plan view of a mesh wiring layer of a wiring board according to a second embodiment.
Figure 22:
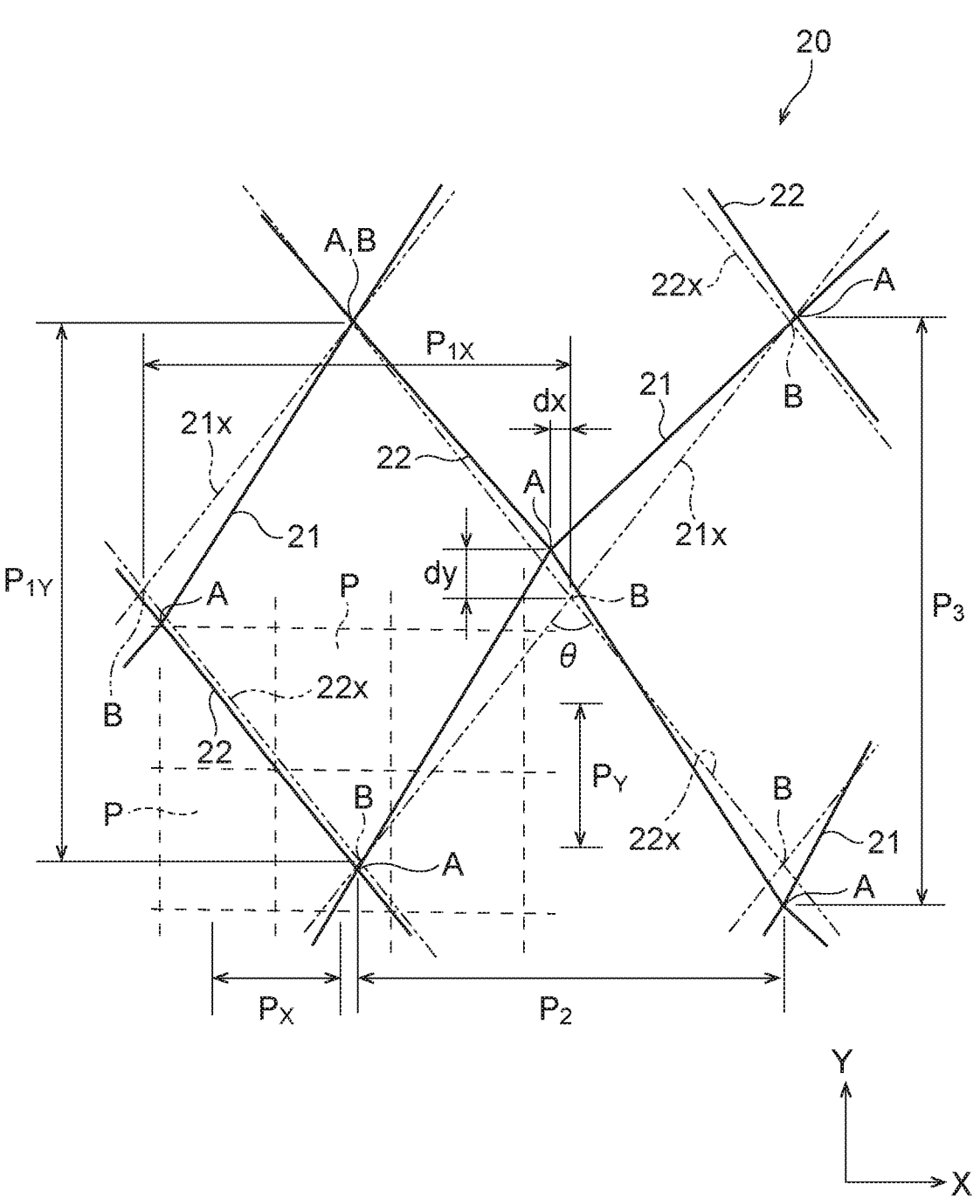
FIG. 22 illustrates an enlarged plan (an enlarged view of a portion XXII in FIG. 21) of the mesh wiring layer of the wiring board according to the second embodiment.

As illustrated in FIG. 21 and FIG. 22, intersection points between the first wiring lines 21 and the second wiring lines 22 are designated as A. In this case, the intersection points A between the first wiring lines 21 and the second wiring lines 22 are irregularly arranged. That is, the pitches of the first wiring lines 21 and the pitches of the second wiring lines 22 are irregular. Specifically, since the intersection points A are irregularly arranged, directions in which the first wiring lines 21 extend between the intersection points A are irregular. Similarly, directions in which the second wiring lines 22 extend between the intersection points A are irregular. This enables the pitch of the moire pattern formed due to the regularity (periodicity) of the mesh wiring layers 20 and the regularity (periodicity) of the pixels P of the display device 61 to be reduced to such an extent that the pitch is invisible by the naked eye.

That is, as for the image display apparatus 60 described above, the mesh wiring layers 20 of the wiring board 10 overlap the pixels P of the display device 61 in the Z-direction. For this reason, the moire pattern can be formed due to the regularity (periodicity) of the mesh wiring layers 20 and the regularity (periodicity) of the pixels P. According to the present embodiment, however, the intersection points A are irregularly arranged. Consequently, the first wiring lines 21, the second wiring lines 22, and the pixels P are irregularly arranged. For this reason, the pitch of the moire pattern formed due to the regularity (periodicity) of the mesh wiring layers 20 and the regularity (periodicity) of the pixels P can be reduced to such an extent that the pitch is invisible by the naked eye.

As illustrated in FIG. 21 and FIG. 22, regression lines that are obtained from the multiple intersection points A that are located on the respective first wiring lines 21 are referred to as first regression lines 21x. Similarly, regression lines that are obtained from the multiple intersection points A that are located on the respective second wiring lines 22 are referred to as second regression lines 22x. Intersection points between the first regression lines 21x and the second regression lines 22x are designated as B. The regression lines described herein mean straight lines that are obtained by approximating position data of the intersection points A that are located on the respective first wiring lines 21 in a plan view by using the least-squares method.

As illustrated in FIG. 22, distances from the intersection points A to the nearest intersection points B in the width direction (that is, the X-direction) of the mesh wiring layers 20 are designated as $d_X$. Distances from the intersection points A to the nearest intersection points B in the longitudinal direction (that is, the Y-direction) of the mesh wiring layers 20 are designated as $d_Y$. The average value of pitches $P_{1X}$ of ten intersection points B continuously adjacent to each other in the width direction of the mesh wiring layers 20 is designated as $D_X$. The average value of pitches $P_{1Y}$ of ten intersection points B continuously adjacent to each other in the longitudinal direction of the mesh wiring layers 20 is designated as $D_Y$. According to the present embodiment, nine or more intersection points A among the ten intersection points A nearest to the respective ten intersection points B satisfy at least a relationship of $0.02D_X \leq d_X < 0.3D_X$ or a relationship of $0.02D_Y \leq d_Y < 0.3D_Y$. This enables variations in the pitches of the first wiring lines 21 and variations in pitches of the second wiring lines 22 to be inhibited from being excessively increased. For this reason, flicker caused by the reflection of visible light due to the mesh wiring layers 20 can be reduced. When the wiring board 10 satisfies the relationship described above, the sizes of the opening portions 23 in the mesh wiring layers 20 do not vary, and the mesh wiring layers 20 can be unlikely to be visible by the naked eye. As for the ten intersection points A nearest to the respective ten intersection points B, the distances $d_X$ and $d_Y$ can differ from each other. In this case, as for the ten intersection points A nearest to the respective ten intersection points B, the distances $d_X$ and $d_Y$ preferably have three or more values.

The nine or more intersection points A among the ten intersection points A nearest to the respective ten intersection points B satisfy the relationship of $0.02D_X \leq d_X < 0.3D_X$ and the relationship of $0.02D_Y \leq d_Y < 0.3D_Y$. When both of the relationships described above are satisfied, the variations in the pitches of the first wiring lines 21 and the variations in the pitches of the second wiring lines 22 can be more effectively inhibited from being excessively increased. For this reason, flicker caused by the reflection of visible light due to the mesh wiring layers 20 can be more effectively reduced. When the wiring board 10 satisfies both of the relationships described above, the variations in the sizes of the opening portions 23 can be further reduced, and the mesh wiring layers 20 can be more unlikely to be visible by the naked eye.

The average value $D_X$ of the pitches $P_{1X}$ of the intersection points B and the average value $D_Y$ of the pitches $P_{1Y}$ of the intersection points B may be 50 μm or more and 500 μm or less. When the average value $D_X$ and the average value $D_Y$ are 50 μm or more, the aperture ratios At of the mesh wiring layers 20 described later can be inhibited from reducing, and the transparency of the wiring board 10 can be ensured. When the average value $D_X$ and the average value $D_Y$ are 500 μm or less, the sheet resistance value of each mesh wiring layer 20 can be inhibited from being excessively increased, and the antenna characteristics thereof can be maintained.

The average value $D_X$ of the pitches $P_{1X}$ of the intersection points B may be equal to or less than (N−0.05) times (N is a natural number (is not 0)), or equal to or more than (N+0.05) times the pitches $P_X$ of the pixels P in the width direction. This enables the pitch of the moire pattern formed due to the regularity (periodicity) of the mesh wiring layers 20 and the regularity (periodicity) of the pixels P to be reduced to such an extent that the pitch is invisible by the naked eye. That is, the intersection points A and the pixels P are irregularly arranged in the X-direction when viewed in the Z-direction. For this reason, the pitch of the moire pattern formed due to the regularity (periodicity) of the mesh wiring layers 20 and the regularity (periodicity) of the pixels P can be reduced to such an extent that the pitch is invisible by the naked eye.

The average value $D_X$ of the pitches $P_{1X}$ of the intersection points B is preferably equal to or more than (N−0.2) times and equal to or less than (N−0.05) times, or equal to or more than (N+0.05) times and equal to or less than (N+0.2) times the pitches $P_X$ of the pixels P in the width direction. Consequently, even in the case where N, for example, reduces, the average value $D_X$ can be inhibited from being excessively reduced. For this reason, the aperture ratios At of the mesh wiring layers 20 described later can be inhibited from reducing, and the transparency of the wiring board 10 can be ensured. Even in the case where N, for example, increases, the average value $D_X$ can be inhibited from being excessively increased. For this reason, the sheet resistance value of each mesh wiring layer 20 can be inhibited from being excessively increased, and the antenna characteristics thereof can be maintained.

The average value $D_X$ of the pitches $P_{1X}$ of the intersection points B may be 50 μm or more and 500 μm or less. When the average value $D_X$ is 50 μm or more, the aperture ratios At of the mesh wiring layers 20 described later can be inhibited from reducing, and the transparency of the wiring board 10 can be ensured. When the average value $D_X$ is 500 μm or less, the sheet resistance value of each mesh wiring layer 20 can be inhibited from being excessively increased, and the antenna characteristics thereof can be maintained.

The average value $D_Y$ of the pitches $P_{1Y}$ of the intersection points B may be equal to or less than (M−0.05) times (M is a natural number), or equal to or more than (M+0.05) times the pitches $P_Y$ of the pixels P in the longitudinal direction. Consequently, the intersection points A and the pixels P are irregularly arranged in the Y-direction when viewed in the Z-direction. For this reason, the pitch of the moire pattern formed due to the regularity of the mesh wiring layers 20 and the regularity of the pixels P can be reduced to such an extent that the pitch is invisible by the naked eye.

The average value $D_Y$ of the pitches $P_{1Y}$ of the intersection points B is preferably equal to or more than (M−0.2) times and equal to or less than (M−0.05) times, or equal to or more than (M+0.05) times and equal to or less than (M+0.2) times the pitches $P_Y$ of the pixels P in the longitudinal direction. Consequently, even in the case where M, for example, reduces, the average value $D_Y$ can be inhibited from being excessively reduced. For this reason, the aperture ratios At of the mesh wiring layers 20 described later can be inhibited from reducing, and the transparency of the wiring board 10 can be ensured. Even in the case where M, for example, increases, the average value $D_Y$ can be inhibited from being excessively increased. For this reason, the sheet resistance value of each mesh wiring layer 20 can be inhibited from being excessively increased, and the antenna characteristics thereof can be maintained.

The average value $D_Y$ of the pitches $P_{1Y}$ of the intersection points B may be 50 μm or more and 500 μm or less. When the average value $D_Y$ is 50 μm or more, the aperture ratios At of the mesh wiring layers 20 described later can be inhibited from reducing, and the transparency of the wiring board 10 can be ensured. When the average value $D_Y$ is 500 μm or less, the sheet resistance value of each mesh wiring layer 20 can be inhibited from being excessively increased, and the antenna characteristics thereof can be maintained.

N and M are preferably a natural number of 1 or more and 6 or less. When N and M are a natural number of 6 or less, the average value $D_X$ of the pitches $P_{1X}$ of the intersection points B and the average value $D_Y$ of the pitches $P_{1Y}$ of the intersection points B can be inhibited from being excessively increased. For this reason, the sheet resistance value of each mesh wiring layer 20 can be inhibited from being excessively increased, and the antenna characteristics thereof can be maintained.

Angles θ that are formed between the first regression lines 21x and the second regression lines 22x described above are preferably 30° or more and 150° or less. This enables the angles that are formed between the first wiring lines 21 and the second wiring lines 22 to be inhibited from being excessively reduced or from being excessively increased. For this reason, when the mesh wiring layers 20 are formed, the first wiring lines 21 and the second wiring lines 22 can be easily formed.

Figure 23:
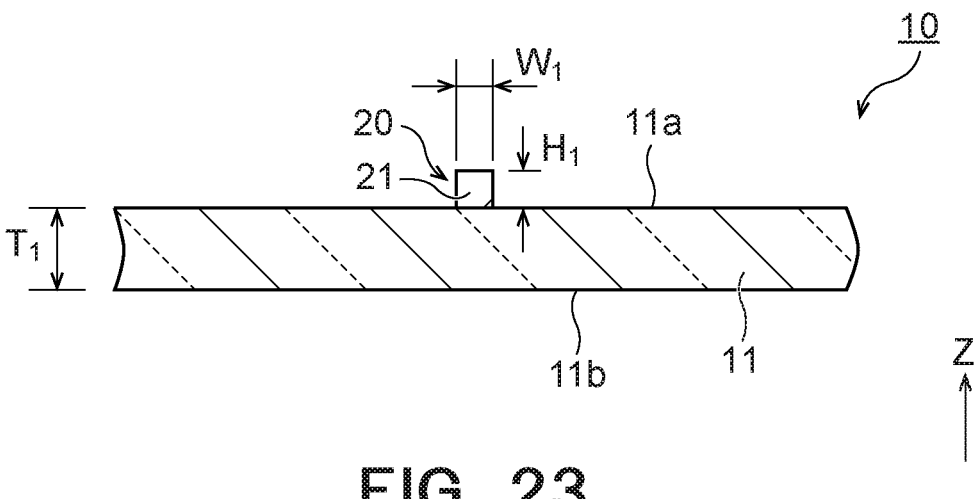
FIG. 23 is a sectional view (a sectional view taken along line XXIII-XXIII in FIG. 21) of the wiring board according to the second embodiment.
Figure 24:
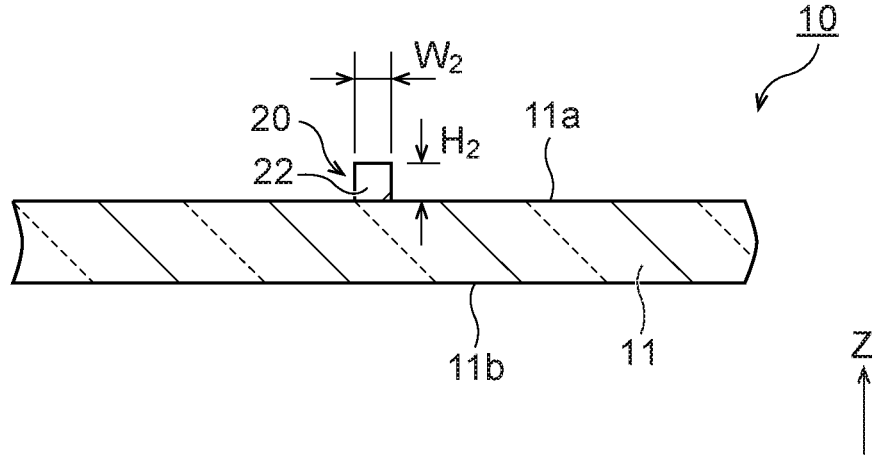
FIG. 24 is a sectional view (a sectional view taken along line XXIV-XXIV in FIG. 21) of the wiring board according to the second embodiment.

Also according to the present embodiment, as illustrated in FIG. 23, a section of each first wiring line 21 perpendicular to the longitudinal direction thereof has a substantially rectangular shape or a substantially square shape. In this case, the shape of the section of each first wiring line 21 is substantially uniform over the entire first wiring line 21. Also according to the present embodiment, as illustrated in FIG. 24, a section of each second wiring line 22 perpendicular to the longitudinal direction thereof has a substantially rectangular shape or a substantially square shape and is substantially the same as that of the section of each first wiring line 21 described above. In this case, the shape of the section of each second wiring line 22 is substantially uniform over the entire second wiring line 22. The shape of the section of each first wiring line 21 and the shape of the section of each second wiring line 22 may not necessarily be a substantially rectangular shape or a substantially square shape. For example, the shape of the section of each first wiring line 21 and the shape of the section of each second wiring line 22 may be a substantially trapezoid shape a front surface (that is, in the positive Z-direction) of which is narrower than a back surface (that is, in the negative Z-direction) or a shape in which both side surfaces in the longitudinal direction are curved.

According to the present embodiment, the linewidths $W_1$ (see FIG. 23) of the first wiring lines 21 are widths in a section perpendicular to the longitudinal direction thereof, and the linewidths $W_2$ (see FIG. 24) of the second wiring lines 22 are widths in a section perpendicular to the longitudinal direction thereof.

The wiring board 10 according to the present embodiment can be manufactured by using, for example, a method illustrated in FIG. 9(a) to FIG. 9(f).

Subsequently, the display device 61 is stacked with the wiring board 10 with the first transparent adhesive layer 95 and the second transparent adhesive layer 96 interposed therebetween, and consequently, the image display apparatus 60 that includes the wiring board 10 and the display device 61 that is stacked with the wiring board 10 is obtained.

Actions according to the present embodiment that is thus configured will now be described.

Also according to the present embodiment, the wiring board 10 is incorporated into the image display apparatus 60 (see FIG. 1 and FIG. 2) that includes the display device 61. At this time, the wiring board 10 is disposed along the display device 61. The mesh wiring layers 20 of the wiring board 10 are electrically connected to the communication module 63 of the image display apparatus 60 with the power supply portions 40 interposed therebetween. In this way, a radio wave at a predetermined frequency can be transmitted and received by using the mesh wiring layers 20, and the use of the image display apparatus 60 enables communication.

As for the image display apparatus 60, the mesh wiring layers 20 of the wiring board 10 overlap the pixels P of the display device 61 in the Z-direction as described above. For this reason, the moire pattern can be formed due to the regularity (periodicity) of the mesh wiring layers 20 and the regularity (periodicity) of the pixels P.

According to the present embodiment, however, the nine or more intersection points A among the ten intersection points A nearest to the respective ten intersection points B satisfy at least the relationship of $0.02D_X \leq d_X < 0.3D_X$ or the relationship of $0.02D_Y \leq d_Y < 0.3D_Y$, where A is the intersection points between the first wiring lines 21 and the second wiring lines 22, B is the intersection points between the first regression lines 21x that are obtained from the multiple intersection points A that are located on the respective first wiring lines 21 and the second regression lines 22x that are obtained from the multiple intersection points A that are located on the respective second wiring lines 22, $d_X$ is the distances from the intersection points A to the nearest intersection points B in the width direction of the mesh wiring layers 20, $d_Y$ is the distances from the intersection points A to the nearest intersection points B in the longitudinal direction of the mesh wiring layers 20, $D_X$ is the average value of the pitches $P_{1X}$ of the ten intersection points B continuously adjacent to each other in the width direction of the mesh wiring layers 20, and $D_Y$ is the average value of the pitches $P_{1Y}$ of the ten intersection points B continuously adjacent to each other in the longitudinal direction of the mesh wiring layers 20. This enables the intersection points A to be irregularly arranged. That is, the first wiring lines 21, the second wiring lines 22, and the pixels P are irregularly arranged. For this reason, the pitch of the moire pattern formed due to the regularity (periodicity) of the mesh wiring layers 20 and the regularity (periodicity) of the pixels P can be reduced to such an extent that the pitch is invisible by the naked eye. When the wiring board 10 satisfies the relationship described above, variations in the pitches of the first wiring lines 21 and variations in the pitches of the second wiring lines 22 can be inhibited from being excessively increased. For this reason, flicker caused by the reflection of visible light due to the mesh wiring layers 20 can be reduced. When the wiring board 10 satisfies the relationship described above, the sizes of the opening portions 23 in the mesh wiring layers 20 do not vary, and the mesh wiring layers 20 can be unlikely to be visible by the naked eye.

According to the present embodiment, the intersection points A can be irregularly arranged as described above, and accordingly, the directions in which the first wiring lines 21 extend between the intersection points A and the directions in which the second wiring lines 22 extend between the intersection points A are irregular. This enables the lengths of the first wiring lines 21 and the second wiring lines 22 to be increased unlike the case where the first wiring lines 21, for example, linearly extend in a plan view. For this reason, adhesion between the first wiring lines 21 of the mesh wiring layers 20 and the substrate 11 and between the second wiring lines 22 and the substrate 11 can be increased. In this case and in the case where a protective layer (not illustrated) that protects the mesh wiring layers 20 is provided on the mesh wiring layers 20, adhesion between the mesh wiring layers 20 and the protective layer can be increased. For this reason, for example, even in the case where the wiring board 10 is bent, the first wiring lines 21 and the second wiring lines 22 can be inhibited from being separated from the substrate 11. In addition, the first wiring lines 21 and the second wiring lines 22 can be inhibited from being disconnected.

According to the present embodiment, the wiring board 10 includes the substrate 11 and the mesh wiring layers 20 that are disposed on the substrate 11. The substrate 11 is transparent. Each mesh wiring layer 20 includes the conductive portion that serves as the formation portion for the opaque conductive layer and has the mesh pattern due to a large number of the opening portions 23. For this reason, the transparency of the wiring board 10 is ensured. Consequently, when the wiring board 10 is disposed along the display device 61, the display device 61 is visible from the opening portions 23 of the mesh wiring layers 20, and the visibility of the display device 61 is not impaired.

Modifications to the wiring board will now be described.

Figure 25:
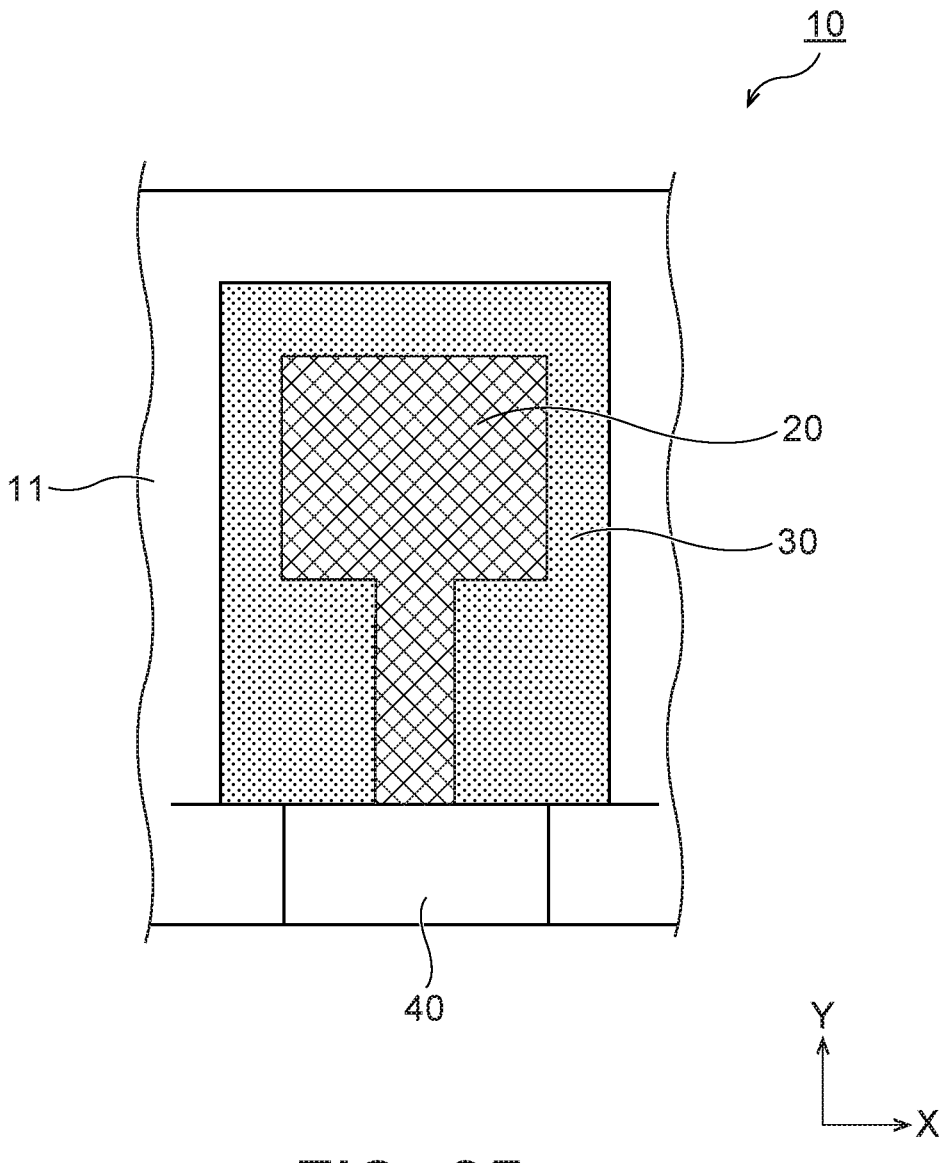
FIG. 25 is a plan view of a wiring board according to a first modification.
Figure 26:
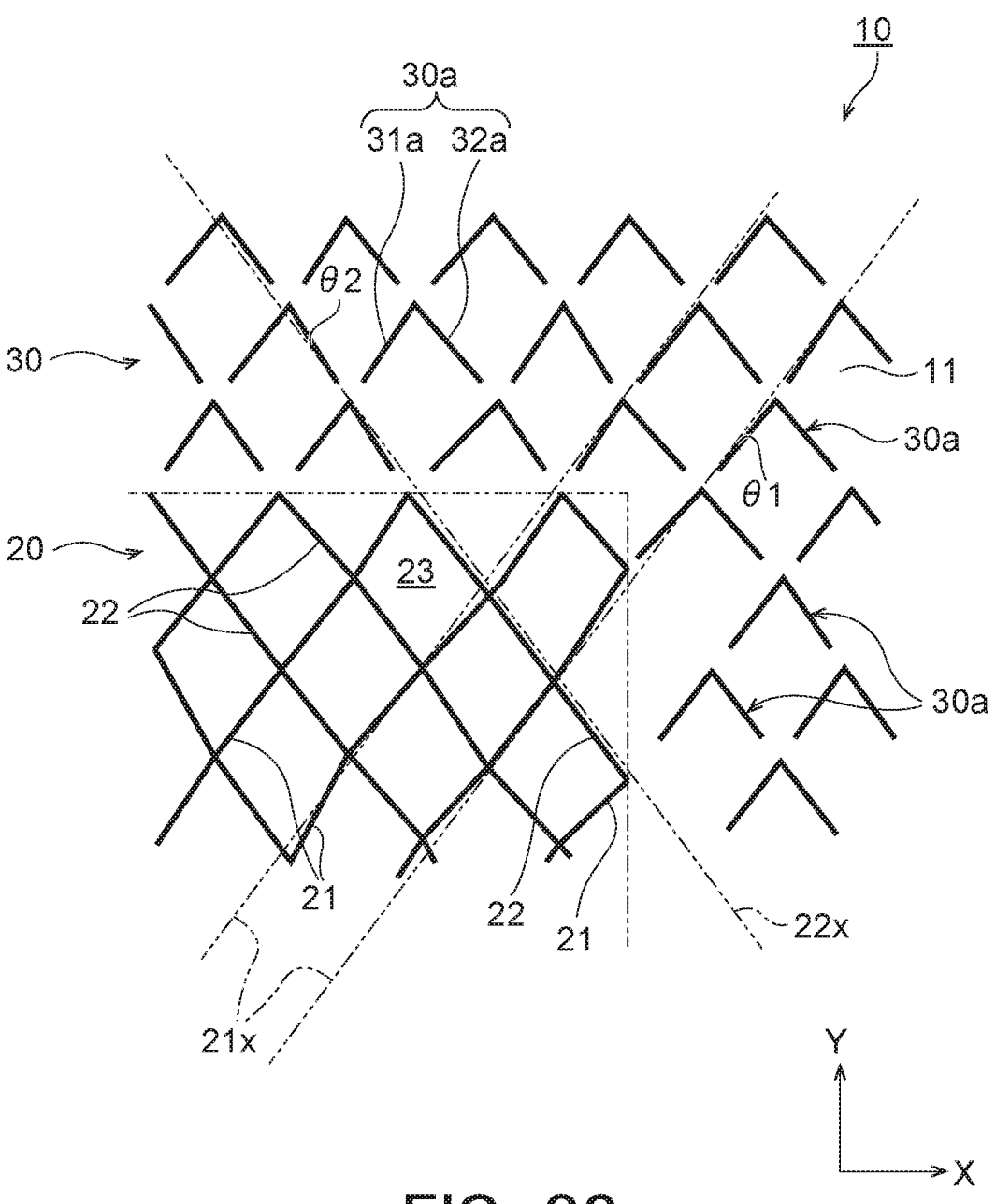
FIG. 26 is an enlarged plan view of the wiring board according to the first modification.

FIG. 25 and FIG. 26 illustrate a first modification to the wiring board. The modification illustrated in FIG. 25 and FIG. 26 differs therefrom in including the dummy wiring layers 30 that are provided around the mesh wiring layers 20, and the other components are substantially the same as those according to the embodiment illustrated in FIG. 21 to FIG. 24 described above. In FIG. 25 and FIG. 26, components like to those according to the embodiment illustrated in FIG. 21 to FIG. 24 are designated by using like reference signs, and a detailed description is omitted.

As for the wiring board 10 illustrated in FIG. 25, the dummy wiring layers 30 are provided around the mesh wiring layers 20. The dummy wiring layers 30 do not function as an antenna substantially unlike the mesh wiring layers 20.

As illustrated in FIG. 26, the dummy wiring layers 30 include the dummy wiring lines 30a that have a predetermined pattern and that are repeatedly provided. That is, the dummy wiring layers 30 include the multiple dummy wiring lines 30a, and the dummy wiring lines 30a are electrically separated from the mesh wiring layers 20 (that is, the first wiring lines 21 and the second wiring lines 22). The multiple dummy wiring lines 30a are regularly arranged over the entire region in the dummy wiring layers 30. The multiple dummy wiring lines 30a are separated from each other in a planar direction and are disposed on the substrate 11 so as to protrude. That is, the dummy wiring lines 30a are electrically separated from the mesh wiring layers 20, the power supply portions 40, and the other dummy wiring lines 30a. The dummy wiring lines 30a are substantially V-shaped lines turned upside down in a plan view.

In this case, the shapes of the dummy wiring lines 30a are the same as those obtained by removing portions of the patterns of the mesh wiring layers 20 described above. This enables the differences between the mesh wiring layers 20 and the dummy wiring layers 30 to be unlikely to be visually recognized and enables the mesh wiring layers 20 that are disposed on the substrate 11 to be unlikely to be visible. As illustrated in FIG. 26, the dummy wiring lines 30a are parallel with the first wiring lines 21 or the second wiring lines 22. Specifically, the dummy wiring lines 30a include the first portions 31a parallel with the first wiring lines 21 and the second portions 32a parallel with the second wiring lines 22. When the dummy wiring lines 30a are parallel with the first wiring lines 21 or the second wiring lines 22, the mesh wiring layers 20 that are disposed on the substrate 11 can be more unlikely to be visible. The aperture ratios of the dummy wiring layers 30 may be equal to or differs from the aperture ratios of the mesh wiring layers 20 and are preferably close to the aperture ratios of the mesh wiring layers 20. Here, "Being parallel with the first wiring lines" means that angles θ1 that are formed between the first portions 31a and the first regression lines 21x are 5° or less. "Being parallel with the second wiring lines" means that angles θ2 that are formed between the second portions 32a and the second regression lines 22x are 5° or less.

According to the present modification, the dummy wiring layers 30 that are electrically separated from the mesh wiring layers 20 are provided around the mesh wiring layers 20, and this enables the outer edges of the mesh wiring layers 20 to be unclear. This enables the mesh wiring layers 20 to be unlikely to be visible on the front surface of the image display apparatus 60 and enables the mesh wiring layers 20 to be unlikely to be recognized by the naked eye of the user of the image display apparatus 60.

Figure 27:
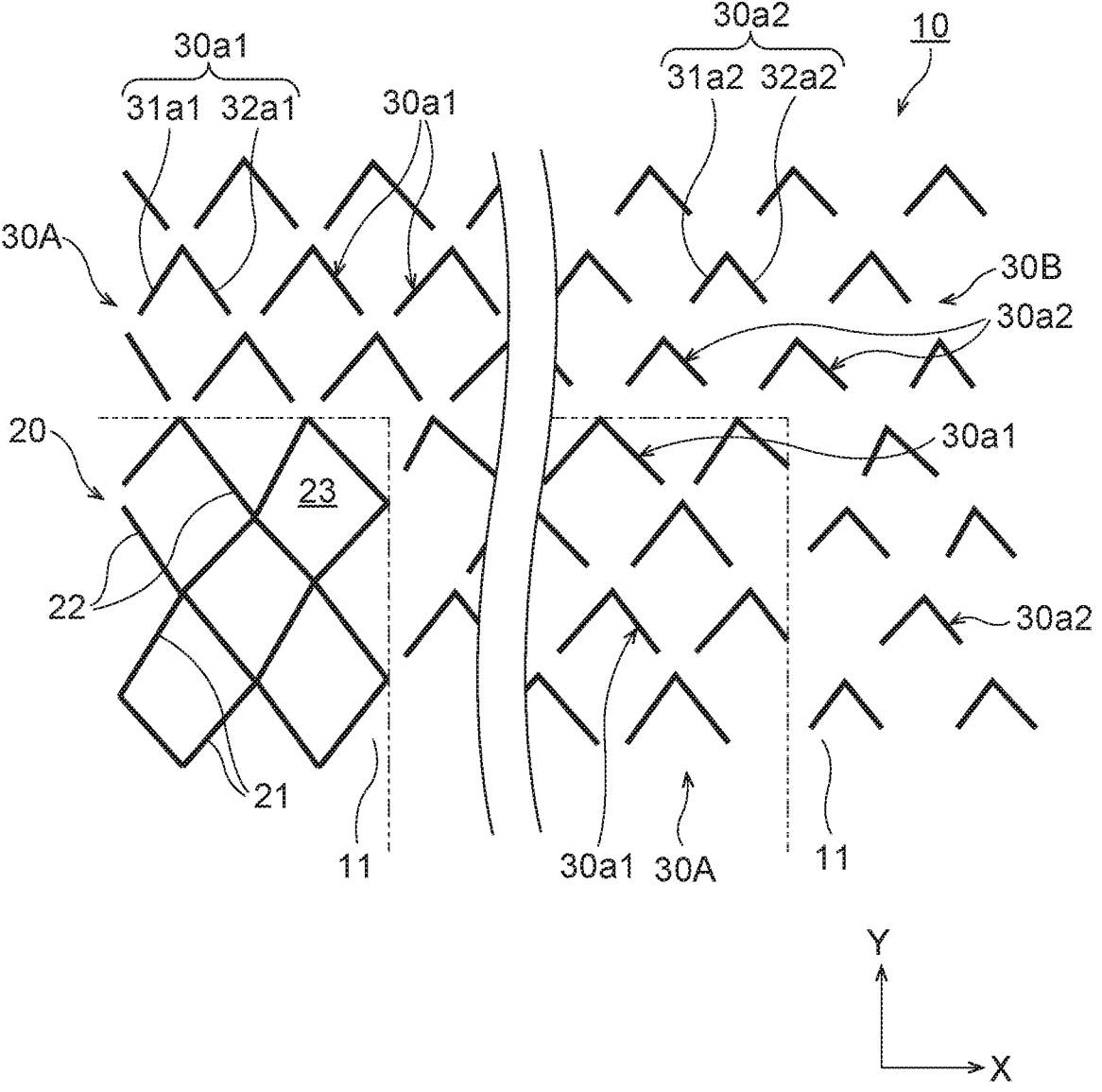
FIG. 27 is an enlarged plan view of a wiring board according to a second modification.

FIG. 27 illustrates a second modification to the wiring board. The modification illustrated in FIG. 27 differs therefrom in including the two or more dummy wiring layers 30A and 30B that have different aperture ratios and that are provided around the mesh wiring layers 20, and the other components are substantially the same as those according to the embodiment illustrated in FIG. 21 to FIG. 26 described above. In FIG. 27, components like to those according to the embodiment illustrated in FIG. 21 to FIG. 26 are designated by using like reference signs, and a detailed description is omitted.

According to the present modification, as for the wiring board 10, the multiple (two in this case) dummy wiring layers 30A and 30B (that is, the first dummy wiring layers 30A and the second dummy wiring layers 30B) that have different aperture ratios are provided around the mesh wiring layers 20 as in the example illustrated in FIG. 15. Specifically, the first dummy wiring layers 30A are arranged around the mesh wiring layers 20, and the second dummy wiring layers 30B are arranged around the first dummy wiring layers 30A. The dummy wiring layers 30A and 30B do not function as an antenna substantially unlike the mesh wiring layers 20.

As illustrated in FIG. 27, the first dummy wiring layers 30A include the dummy wiring lines 30a1 that have a predetermined pattern and that are repeatedly provided. The second dummy wiring layers 30B include the dummy wiring lines 30a2 that have a predetermined pattern and that are repeatedly provided. That is, the dummy wiring layers 30A and 30B include the multiple dummy wiring lines 30a1 and 30a2, and the dummy wiring lines 30a1 and 30a2 are electrically separated from the mesh wiring layers 20. The dummy wiring lines 30a1 and 30a2 are regularly arranged over the entire region in the dummy wiring layers 30A and 30B. The dummy wiring lines 30a1 and 30a2 are separated from each other in the planar direction and are disposed on the substrate 11 so as to protrude. The dummy wiring lines 30a1 and 30a2 are electrically separated from the mesh wiring layers 20, the power supply portions 40, and the other dummy wiring lines 30a1 and 30a2. The dummy wiring lines 30a1 and 30a2 are substantially V-shaped lines turned upside down in a plan view.

In this case, the shapes of the dummy wiring lines 30a1 and 30a2 are the same as those obtained by removing portions of the patterns of the mesh wiring layers 20 described above. This enables the differences between the mesh wiring layers 20 and the first dummy wiring layers 30A and the differences between the first dummy wiring layers 30A and the second dummy wiring layers 30B to be unlikely to be visually recognized and enables the mesh wiring layers 20 that are disposed on the substrate 11 to be unlikely to be visible. As illustrated in FIG. 27, the dummy wiring lines 30a1 and 30a2 are parallel with the first wiring lines 21 or the second wiring lines 22. Specifically, the dummy wiring lines 30a1 include the first portions 31a1 parallel with the first wiring lines 21 and the second portions 32a1 parallel with the second wiring lines 22. The dummy wiring lines 30a2 include the first portions 31a2 parallel with the first wiring lines 21 and the second portions 32a2 parallel with the second wiring lines 22.

The area of each dummy wiring line 30a1 of the first dummy wiring layers 30A is larger than the area of each dummy wiring line 30a2 of the second dummy wiring layers 30B. In this case, the linewidth of each dummy wiring line 30a1 is equal to the linewidth of each dummy wiring line 30a2 but is not limited thereto, and the linewidth of each dummy wiring line 30a1 may be greater than the linewidth of each dummy wiring line 30a2. The other components of the dummy wiring lines 30a1 and 30a2 are the same as those of the dummy wiring lines 30a according to the first modification and are not described in detail here.

According to the present modification, the aperture ratios of the mesh wiring layers 20 and the two or more dummy wiring layers 30A and 30B preferably increase stepwise in order from the mesh wiring layers 20 to the dummy wiring layers 30A and 30B far from the mesh wiring layers 20. In other words, the aperture ratios of the dummy wiring layers preferably gradually increase in order from a dummy wiring layer close to one of the mesh wiring layers 20 to a dummy wiring layer far therefrom. In this case, the aperture ratios of the first dummy wiring layers 30A are preferably higher than the aperture ratios of the mesh wiring layers 20. The aperture ratios of the second dummy wiring layers 30B are preferably higher than the aperture ratios of the first dummy wiring layers 30A. This enables the outer edges of the mesh wiring layers 20 and the outer edges of the dummy wiring layers 30A and 30B to be more unclear. For this reason, the mesh wiring layers 20 can be more unlikely to be visible on the front surface of the image display apparatus 60.

The dummy wiring layers 30A and 30B that are electrically separated from the mesh wiring layers 20 are thus disposed, and consequently, the outer edges of the mesh wiring layers 20 can be more unclear. This enables the mesh wiring layers 20 to be unlikely to be visible on the front surface of the image display apparatus 60 and enables the mesh wiring layers 20 to be unlikely to be recognized by the naked eye of the user of the image display apparatus 60. Three or more dummy wiring layers that have different aperture ratios may be provided around the mesh wiring layers 20.

Figure 28:
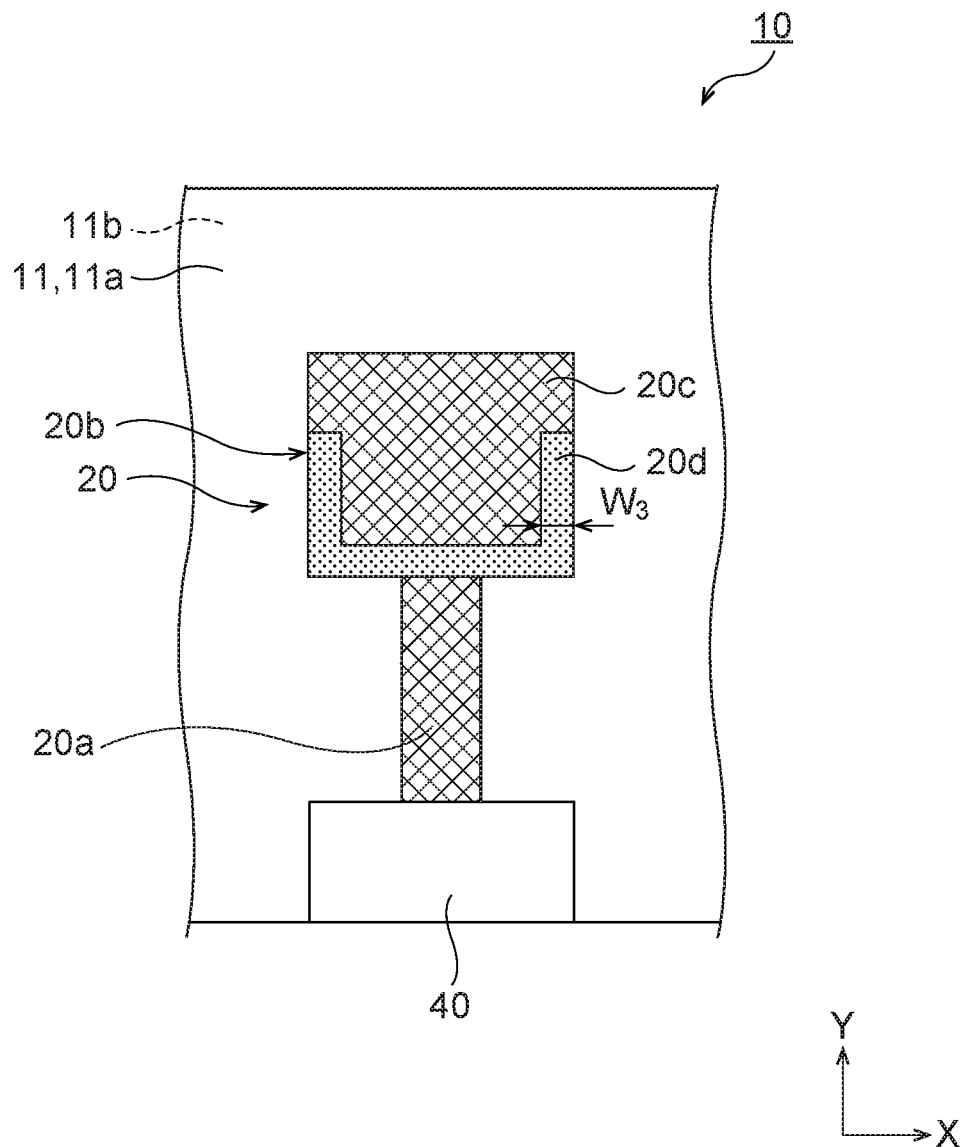
FIG. 28 is a plan view of a wiring board according to a third modification.

FIG. 28 illustrates a third modification to the wiring board. The modification illustrated in FIG. 28 differs therefrom in that the end portions 20b include central portions 20c and edge portions 20d that are located around the central portions 20c, and the other components are substantially the same as those according to the embodiment illustrated in FIG. 21 to FIG. 27 described above. In FIG. 28, components like to those according to the embodiment illustrated in FIG. 21 to FIG. 27 are designated by using like reference signs, and a detailed description is omitted.

As for the wiring board 10 illustrated in FIG. 28, the end portions (that is, the transceiver portions) 20b include the central portions 20c and the edge portions 20d that are located around the central portions 20c. At the edge portions 20d, the distances $d_X$ (see FIG. 22) described above are shorter than the distances $d_X$ at the central portions 20c. At the edge portions 20d, the distances $d_Y$ (see FIG. 22) described above are shorter than the distances $d_Y$ at the central portions 20c. This enables the sheet resistance value at the edge portions 20d to be reduced. For this reason, the radiation efficiency of the mesh wiring layers 20 that serve as an antenna can be effectively increased. That is, since the edge portions 20d are nearer than the central portions 20c to the base end portions 20a, current density at the edge portions 20d is increased to current density higher than current density at the central portions 20c. For this reason, the sheet resistance value at the edge portions 20d at which the current density is increased is reduced, and consequently, the radiation efficiency of the mesh wiring layers 20 that serve as an antenna can be effectively increased.

According to the present modification, the distances $d_X$ at the edge portions 20d are preferably 20% or more and 80% or less of the distances $d_X$ at the central portions 20c. The distances $d_Y$ at the edge portions 20d are preferably 20% or more and 80% or less of the distances $d_Y$ at the central portions 20c. When the distances $d_X$ and $d_Y$ at the edge portions 20d are 20% or more of the distances $d_X$ and $d_Y$ at the central portions 20c, the intersection points A are irregularly arranged. For this reason, the pitch of the moire pattern formed due to the regularity (periodicity) of the mesh wiring layers 20 and the regularity (periodicity) of the pixels P can be reduced to such an extent that the pitch is invisible by the naked eye. In addition, boundaries between the central portions 20c and the edge portions 20d can be unclear. When the distances $d_X$ and $d_Y$ at the edge portions 20d are 80% or less of the distances $d_X$ and $d_Y$ at the central portions 20c, the sheet resistance value at the edge portions 20d can be effectively reduced.

In an illustrated example, only regions in the central portions 20c near the base end portions 20a are surrounded by the edge portions 20d. In this case, in the longitudinal direction (that is, the Y-direction) of the mesh wiring layers 20, 50% or more regions of the central portions 20c near the base end portions 20a may be surrounded by the edge portions 20d. This enables the radiation efficiency of the mesh wiring layers 20 that serve as an antenna to be effectively increased. The peripheries of the central portions 20c may be entirely surrounded by the edge portions 20d.

The widths $W_3$ of the edge portions 20d are preferably equal to or more than 2 times the average value $D_X$ of the pitches $P_{1X}$ (see FIG. 22) of the intersection points B at the central portions 20c. This enables regions in which the sheet resistance value can be reduced to be increased. For this reason, the sheet resistance value in regions in which the current density is increased can be effectively reduced. The widths $W_3$ of the edge portions 20d mean distances in the X-direction at parts that extend in the Y-direction in the edge portions 20d and mean distances in the Y-direction at parts that extend in the X-direction in the edge portions 20d.

According to the present modification, the distances $d_X$ and $d_Y$ at the edge portions 20d are shorter than the distances $d_X$ and $d_Y$ at the central portions 20c, and consequently, the sheet resistance value at the edge portions 20d can be reduced. This enables the radiation efficiency of the mesh wiring layers 20 that serve as an antenna to be effectively increased.

EXAMPLES

Specific examples according to the present embodiment will now be described.

Example B1

The wiring board 10 that had the structure illustrated in FIG. 21 was manufactured. That is, the wiring board 10 in which the first wiring lines 21 and the second wiring lines 22 were irregularly arranged was manufactured. In this case, the substrate of the wiring board 10 was a substrate that had a thickness of 100 μm and that was composed of polyethylene terephthalate. The first wiring lines 21 and the second wiring lines 22 were copper wiring lines having a linewidth of 1.0 μm and a height of 1.0 μm. At this time, the lengths $L_a$ of the end portions 20b of the mesh wiring layers 20 were 3.5 mm, and the widths $W_a$ were 4.2 mm.

As for the wiring board 10 in the example B1, the average value $D_X$ of the pitches $P_{1X}$ of ten intersection points B continuously adjacent to each other in the width direction (that is, the X-direction) of the mesh wiring layers 20 was 70 μm. The average value $D_Y$ of the pitches $P_{1Y}$ of ten intersection points B continuously adjacent to each other in the longitudinal direction (that is, the Y-direction) of the mesh wiring layers 20 was 130 μm.

Nine or more intersection points A among the ten intersection points A nearest to the respective ten intersection points B (also simply referred to below as "nine or more intersection points A") satisfied a relationship of $0.02D_X < d_X \leq 0.1D_X$, where $d_X$ was the distances from the intersection points A to the nearest intersection points B in the width direction of the mesh wiring layers 20.

Nine or more intersection points A satisfied a relationship of $0.02D_Y \leq d_Y \leq 0.1D_Y$, where $d_Y$ was the distances from the intersection points A to the nearest intersection points B in the longitudinal direction of the mesh wiring layers 20.

As for the wiring board 10 in the example B1, a difference between the aperture ratios of continuous square regions having a side of 1000 μm was 0.5% or less.

Subsequently, the visibility of the wiring board 10 was checked. At this time, the presence or absence of a moire pattern was first checked. At this time, the wiring board 10 was stacked with the display device 61 illustrated in FIG. 3, and these were observed. As for the display device 61, the pitches $P_X$ of the pixels P were 60 μm, and the pitches $P_Y$ of the pixels P were 60 μm. The wiring board 10 was visually observed with the display device 61 emitting white light from a position 300 mm away therefrom, and the presence or absence of a moire pattern was checked.

In addition, the presence or absence of flicker was checked. At this time, a black plate was placed on the back surface of the wiring board 10 (that is, in the negative Z-direction). Subsequently, light was emitted from a position facing the front surface of the wiring board 10 (that is, the positive Z-direction) by using a high luminance light. At this time, the light was emitted in a direction inclining with respect to the normal direction to the first surface 11a of the substrate 11. The wiring board 10 was visually observed from a position 300 mm away therefrom, and the presence or absence of flicker was checked.

Subsequently, as for the wiring board 10, the sheet resistance value (Ω/□) of each mesh wiring layer 20 was measured. At this time, the resistance value R between both end portions 20e1 and 20e2 (see FIG. 8) of the mesh wiring layers 20 in the longitudinal direction (the Y-direction) was first measured. The digital multimeter (CDM-2000D made by CUSTOM corporation) was used as the measurement device. Subsequently, the resistance value R was divided by the ratio ($L_a/W_a$) between the length $L_a$ and width $W_a$ of each mesh wiring layer 20, and consequently, the sheet resistance value Rs (Ω/□) of each mesh wiring layer 20 was obtained.

Example B2

The visibility of the wiring board 10 was checked, and the sheet resistance value of each mesh wiring layer 20 was measured in the same manner as in the example B1 except that the average value $D_X$ was 130 μm, and the average value $D_Y$ was 270 μm.

Example B3

The visibility of the wiring board 10 was checked, and the sheet resistance value of each mesh wiring layer 20 was measured in the same manner as in the example B1 except that nine or more intersection points A satisfied a relationship of $0.02D_X \leq d_X \leq 0.05D_X$, and nine or more intersection points A satisfied a relationship of $0.02D_Y \leq d_Y \leq 0.05D_Y$.

Example B4

The visibility of the wiring board 10 was checked, and the sheet resistance value of each mesh wiring layer 20 was measured in the same manner as in the example B1 except that nine or more intersection points A satisfied a relationship of $0.25D_X \leq d_X \leq 0.29D_X$, and nine or more intersection points A satisfied a relationship of $0.25D_Y \leq d_Y \leq 0.29D_Y$.

Comparative Example B1

The visibility of the wiring board 10 was checked, and the sheet resistance value of each mesh wiring layer 20 was measured in the same manner as in the example B1 except that nine or more intersection points A satisfied $d_X=0$, nine or more intersection points A satisfied $d_Y=0$, the average value $D_X$ was 100 µm, and the average value $D_Y$ was 100 µm.

Comparative Example B2

The visibility of the wiring board 10 was checked, and the sheet resistance value of each mesh wiring layer 20 was measured in the same manner as in the example B1 except that nine or more intersection points A satisfied a relationship of $0.00D_X \le d_X \le 0.02D_X$, and nine or more intersection points A satisfied a relationship of $0.00D_Y \le d_Y \le 0.02D_Y$.

Comparative Example B3

The visibility of the wiring board 10 was checked, and the sheet resistance value of each mesh wiring layer 20 was measured in the same manner as in the example B1 except that nine or more intersection points A satisfied a relationship of $0.30D_X \le d_X$, and nine or more intersection points A satisfied a relationship of $0.30D_Y \le d_Y$.

Comparative Example B4

The wiring board 100 that had a structure illustrated in FIG. 20 was manufactured. That is, the wiring board 100 in which the planar structure that included the wiring lines 200 of the mesh wiring layers 20 corresponded to a Voronoi pattern was manufactured. In this case, the substrate of the wiring board 100 was a substrate that had a thickness of 100 µm and that was composed of polyethylene terephthalate. The wiring lines 200 were copper wiring lines having a linewidth of 1.0 µm and a height of 1.0 µm. At this time, the lengths $L_a$ of the end portions 20b of the mesh wiring layers 20 were 3.5 mm, and the widths $W_a$ were 4.2 mm.

As for the wiring board 100 in the comparative example B4, the average value of the distances between the sides was 100 µm. At this time, the distances between the sides were measured on an imaginary line that extended in the longitudinal direction (the X-direction) of the end portions 20b (see FIG. 4) of the mesh wiring layers 20 and that was drawn at a freely selected position.

As for the wiring board 100 in the comparative example B4, a difference between the aperture ratios of continuous square regions having a side of 1000 µm was 0.5% or less.

Subsequently, the visibility of the wiring board 100 was checked, and the sheet resistance value of each mesh wiring layer 20 was measured as in the example B1.

The results of these are illustrated in Table 2 to Table 4.

TABLE 2

| | Planar shape (Structure) | Average value $D_x$ (µm) | Average value $D_y$ (µm) |
|---|---|---|---|
| Example B1 | Quadrilateral shape | 70 | 130 |
| Example B2 | Quadrilateral shape | 130 | 270 |
| Example B3 | Quadrilateral shape | 70 | 130 |
| Example B4 | Quadrilateral shape | 70 | 130 |
| Comparative example B1 | Quadrilateral shape | 100 | 100 |
| Comparative example B2 | Quadrilateral shape | 70 | 130 |

TABLE 2-continued

| | Planar shape (Structure) | Average value $D_x$ (µm) | Average value $D_y$ (µm) |
|---|---|---|---|
| Comparative example B3 | Quadrilateral shape | 70 | 130 |
| Comparative example B4 | Voronoi pattern | 100 (Distance between sides) | 100 (Distance between sides) |

TABLE 3

| | Relationship between "$d_x$" and "$D_x$" regarding nine or more intersection points A | Relationship between "$d_y$" and "$D_y$" regarding nine or more intersection points A |
|---|---|---|
| Example B1 | $0.02D_x \le d_x \le 0.1D_x$ | $0.02D_y \le d_y \le 0.1D_y$ |
| Example B2 | $0.02D_x \le d_x \le 0.1D_x$ | $0.02D_y \le d_y \le 0.1D_y$ |
| Example B3 | $0.02D_x \le d_x \le 0.05D_x$ | $0.02D_y \le d_y \le 0.05D_y$ |
| Example B4 | $0.25D_x \le d_x \le 0.29D_x$ | $0.25D_y \le d_y \le 0.29D_y$ |
| Comparative example B1 | $d_x = 0$ | $d_y = 0$ |
| Comparative example B2 | $0.00D_x \le d_x \le 0.02D_x$ | $0.00D_y \le d_y \le 0.02D_y$ |
| Comparative example B3 | $0.30D_x \le d_x$ | $0.30D \le d_y$ |
| Comparative example B4 | — | — |

TABLE 4

| | Moire pattern | Flicker | Aperture ratio | Sheet resistance value |
|---|---|---|---|---|
| Example B1 | A | A | A | A |
| Example B2 | A | A | A | A |
| Example B3 | A | A | A | A |
| Example B4 | A | A | A | A |
| Comparative example B1 | B | A | A | A |
| Comparative example B2 | B | A | A | A |
| Comparative example B3 | A | B | A | C |
| Comparative example B4 | A | B | A | B |

In Table 4, "A" means an excellent result, "B" means a good result, and "C" means a poor result. Specifically, in a column of "Moire pattern" in Table 4, "A" means that the formation of the moire pattern was not found, and "B" means that the moire pattern was formed. In a column of "Flicker" in Table 4, "A" means that the flicker due to reflected light was not found, and "B" means that the flicker due to reflected light occurred. In a column of "Aperture ratio" in Table 4, "A" means that a difference between the aperture ratios was 0.5% or less. In a column of "Sheet resistance value" in Table 4, "A" means that the sheet resistance value was equal to or less than a predetermined value, "B" means that the sheet resistance value was larger than the predetermined value, and "C" means that the sheet resistance value was very larger than the predetermined value.

Consequently, as illustrated in Table 4, the wiring boards 100 in the comparative example B1 and the comparative example B2 formed the moire pattern. As for the wiring boards 10 in the example B1 to the example B4, however, the formation of the moire pattern was not found.

As for the wiring boards 100 in the comparative example B3 and the comparative example B4, as illustrated in Table 4, the flicker due to reflected light occurred. As for the wiring boards 10 in the example B1 to the example B4, however, the flicker due to reflected light was not found.

It is thus confirmed that the wiring board 10 according to the present embodiment enables the formation of the moire pattern to be reduced and enables the flicker due to reflected light to be reduced.

As for the wiring boards 10 in the example B1 to the example B4, as illustrated in Table 4, the variations in the aperture ratios were able to be reduced as in the wiring board 100 in the comparative example B1. That is, even in the case where the first wiring lines 21, for example, were irregularly arranged, the variations in the aperture ratios were able to be reduced as in the wiring board 100 in which the first wiring lines 21, for example, were regularly arranged.

As for the wiring boards 10 in the example B1 to the example B4, as illustrated in Table 4, the sheet resistance value of each mesh wiring layer 20 was able to be reduced to the predetermined value or less as in the wiring board 100 in the comparative example B1. In this case, the sheet resistance value of each mesh wiring layer 20 of the wiring boards 10 in the example B1 to the example B4 was able to be at the same level as the sheet resistance value of each mesh wiring layer 20 of the wiring board 100 in the comparative example B1. That is, as for the wiring boards 10 in the example B1 to the example B4, the first wiring lines 21, for example, were irregularly arranged, but the lengths of the wiring lines such as the first wiring lines 21 were not changed unlike the case where the first wiring lines 21, for example, were regularly arranged. Consequently, even in the case where the first wiring lines 21, for example, were irregularly arranged, the sheet resistance value of each mesh wiring layer 20 was able to be at the same level as the sheet resistance value of each mesh wiring layer 20 of the wiring board 100 in which the first wiring lines 21, for example, were regularly arranged. For this reason, as for the wiring boards 10 in the example B1 to the example B4, the radiation efficiency of the mesh wiring layers 20 that served as an antenna was able to be increased as in the wiring board 100 in which the first wiring lines 21, for example, were regularly arranged.

Third Embodiment

A third embodiment will now be described with reference to FIG. 29 to FIG. 34. FIG. 29 to FIG. 34 illustrate the present embodiment. In FIG. 29 to FIG. 34, components like to those according to the first embodiment illustrated in FIG. 1 to FIG. 20 or components like to those according to the second embodiment illustrated in FIG. 21 to FIG. 28 are designated by using like reference signs, and a detailed description is omitted in some cases.

In the embodiment described below, the "X-direction" is a direction parallel with a side of a substrate. The "Y-direction" is a direction perpendicular to the X-direction and parallel with another side of the substrate. The "Z-direction" is a direction perpendicular to both of the X-direction and the Y-direction and parallel with the thickness direction of a wiring board. A "front surface" means a surface in the positive Z-direction that corresponds to a surface of the substrate on which a wiring line is provided. A "back surface" means a surface in the negative Z-direction that is opposite the surface of the substrate on which the wiring line is provided.

[Structure of Wiring Board]

The structure of the wiring board according to the present embodiment will be described with reference to FIG. 29 to FIG. 32. FIG. 29 to FIG. 32 illustrate the wiring board according to the present embodiment.

Figure 29:
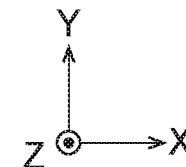
FIG. 29 is a plan view of a wiring board according to a third embodiment.

As illustrated in FIG. 29, the wiring board 10 according to the present embodiment is disposed, for example, on a display device 91 of an image display apparatus 90 described later. The wiring board 10 includes the substrate 11 that is transparent and the mesh wiring layers 20 that are disposed on the substrate 11. The power supply portions 40 are electrically connected to the mesh wiring layers 20.

According to the present embodiment, the mesh wiring layers 20 have antenna pattern regions that function as an antenna. In FIG. 29, the multiple (three) mesh wiring layers 20 are formed on the substrate 11 and correlate with respective different frequency bands. That is, the multiple mesh wiring layers 20 have different lengths (lengths in the Y-direction) $L_{a1}$ that correlate with respective specific frequency bands. As the correlating frequency bands reduce, the lengths $L_{a1}$ of the mesh wiring layers 20 increase. In the case where the wiring board 10 is disposed, for example, on the display device 91 (see FIG. 34 described later) of the image display apparatus 90, the mesh wiring layers 20 may correspond to a telephone antenna, a WiFi antenna, a 3G antenna, a 4G antenna, a 5G antenna, a millimeter wave antenna, a LTE antenna, a Bluetooth (registered trademark) antenna, or a NFC antenna. In the case where the wiring board 10 does not have the radio wave transceiver function, for example, the mesh wiring layers 20 may fulfill the hovering function (the function of enabling the user to operate the display without a direct touch), or another function such as fingerprint authentication, heating, or noise cutting (shielding). The mesh wiring layers 20 may not spread over the entire surface of the substrate 11 but may be disposed in only a region of the substrate 11.

The mesh wiring layers 20 have a substantially rectangular shape in a plan view. As for the mesh wiring layers 20, the longitudinal direction thereof is parallel with the Y-direction, and the transverse direction thereof is parallel with the X-direction. For example, the lengths $L_{a1}$ of the mesh wiring layers 20 in the longitudinal direction (the Y-direction) can be selected from a range of 2 mm or more and 100 mm or less. For example, the widths $W_{a1}$ of the mesh wiring layers 20 in the transverse direction (the X-direction) can be selected from a range of 1 mm or more and 10 mm or less. In particular, the mesh wiring layers 20 may serve as a millimeter wave antenna. In the case where the mesh wiring layers 20 serve as a millimeter wave antenna, the lengths $L_{a1}$ of the mesh wiring layers 20 can be selected from a range of 1 mm or more and 10 mm or less, more preferably 1.5 mm or more and 5 mm or less. FIG. 29 illustrates a shape in the case where the mesh wiring layers 20 function as a monopole antenna, but this is not a limitation. The shape may be the shape of a dipole antenna, a loop antenna, a slot antenna, a microstrip antenna, or a patch antenna.

According to the present embodiment, the mesh wiring layers 20 have an aperiodic planar structure. Metal wires are formed in an irregular lattice shape or an irregular mesh shape on the mesh wiring layers 20.

Figure 30:
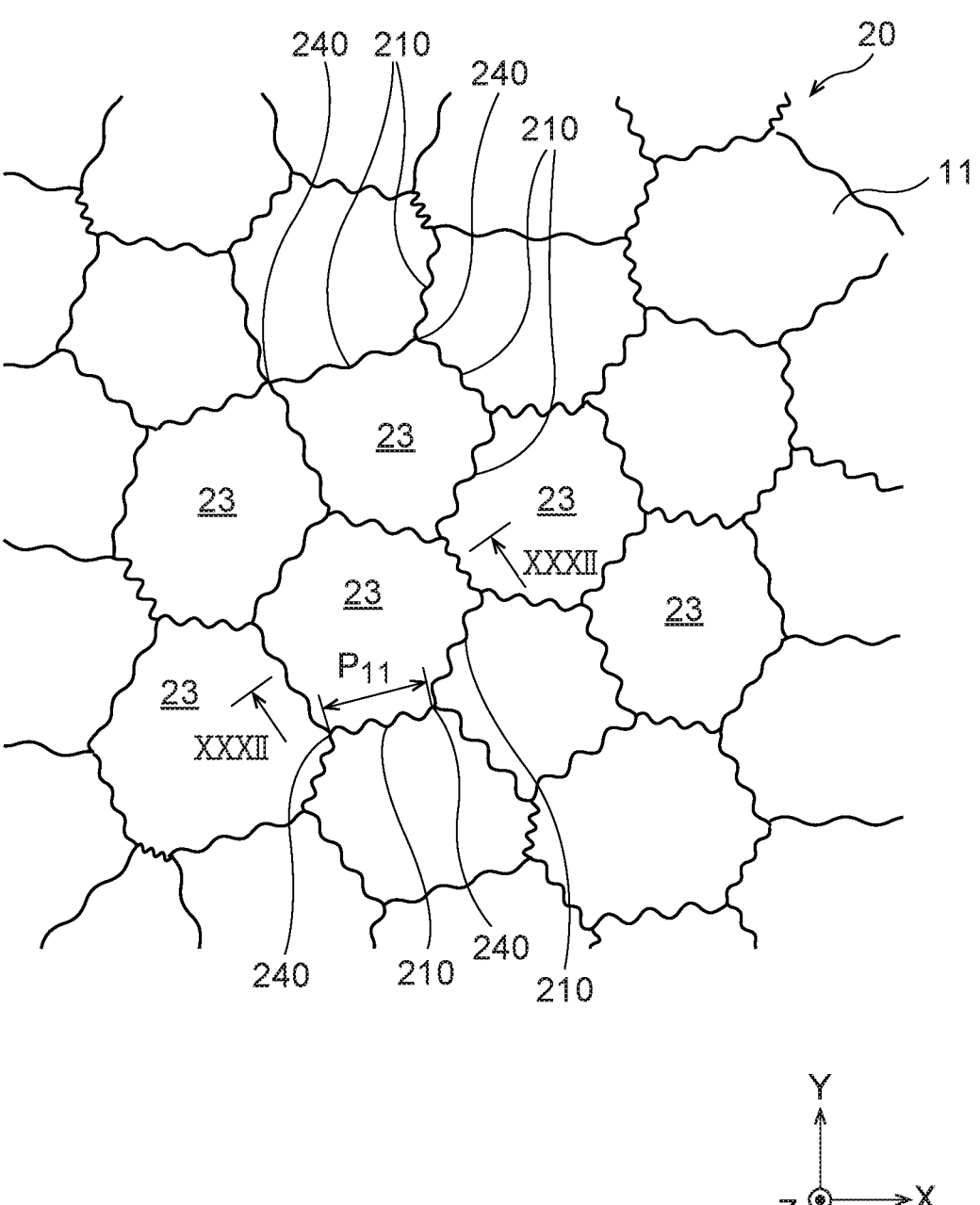
FIG. 30 is an enlarged plan view (an enlarged view of a portion XXX in FIG. 29) of a mesh wiring layer of the wiring board according to the third embodiment.

As illustrated in FIG. 30, the mesh wiring layers 20 include multiple intersection points 240 and multiple wiring lines 210. The wiring lines 210 are located between the intersection points 240. The wiring lines 210 connect respective pairs of the intersection points 240 to each other. The intersection points 240 are located at ends of the respective wiring lines 210 in the longitudinal direction. The multiple intersection points 240 and the multiple wiring lines 210 integrally form the irregular lattice shape or the irregular mesh shape as a whole. The wiring lines 210 extend in irregular directions that have no predetermined regularity. Three or more and five or less wiring lines 210 may be connected to one of the intersection points 240.

The mesh wiring layers 20 include the multiple opening portions 23. The opening portions 23 are formed by being surrounded by the multiple wiring lines 210. The opening portions 23 may be surrounded by three or more and ten or less wiring lines 210. In this case, the arrangement pattern of the opening portions 23 is a random pattern. The random pattern does not have directions that have predetermined regularity in a repetition period. The arrangement pattern of the multiple intersection points 240 is irregular and does not have predetermined regularity. The pitches $P_{11}$ of the intersection points 240 are not uniform in the mesh wiring layers 20 and correspond to various distances. For example, the pitches $P_{11}$ of the intersection points 240 may be various distances in a range of 0.01 mm or more and 1 mm or less. The substrate 11 that is transparent is exposed from the opening portions 23.

As for the mesh wiring layers 20, the opening portions 23 do not have directions that have the repetition period. The opening portions 23 of the mesh wiring layers 20 thus do not have the directions that have the predetermined regularity in the repetition period, and consequently, the moire pattern that can be formed when the wiring board 10 and the display device 91 of the image display apparatus 90, for example, are stacked can be inconspicuous. In order to more effectively inhibit the moire pattern from being formed, the opening portions 23 preferably do not have directions that have the repetition period over the entire region of each mesh wiring layer 20.

In FIG. 30, the aperiodic planar structure that the mesh wiring layers 20 have may be a Voronoi pattern. The Voronoi pattern (Voronoi diagram) described herein means, when multiple freely selected points (sites) are located on a plane, a pattern obtained by dividing the points in the plane depending on the nearest point. Strictly, the wiring lines 210 do not linearly connect the intersection points 240 to each other as described later. In the present specification, however, having the Voronoi pattern in the case where the wiring lines 210 are assumed to linearly connect the intersection points 240 to each other is referred to as the "aperiodic planar structure having the Voronoi pattern".

Figure 31A:
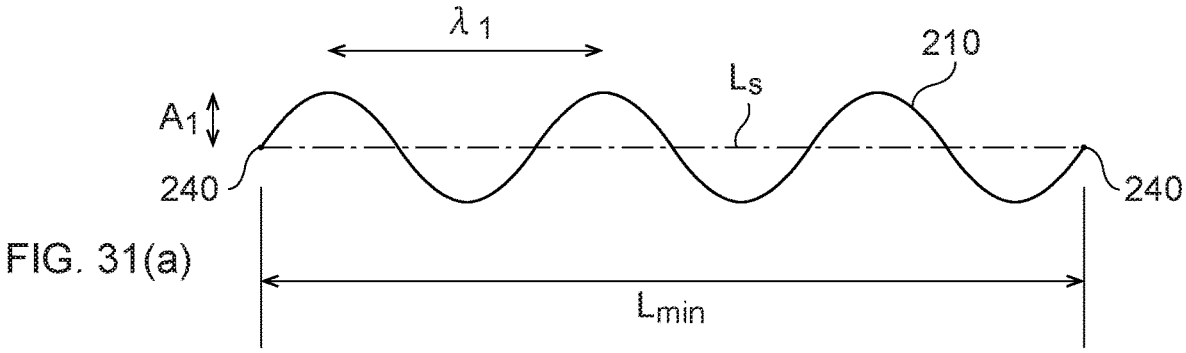
FIG. 31(*a*) to FIG. 31(*c*) are enlarged plan views of wiring lines.
Figure 31B:
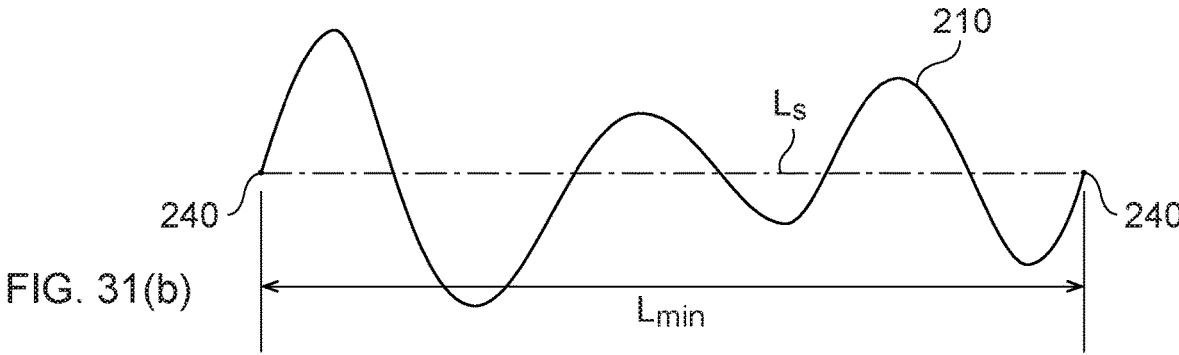
Figure 31C:
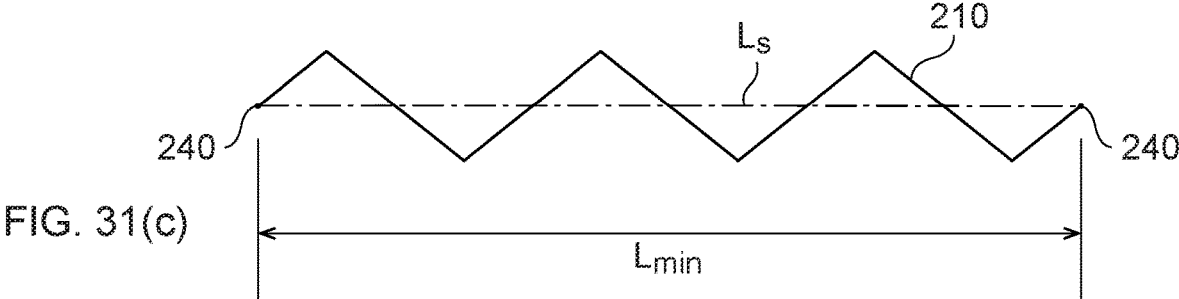

FIG. 31(*a*) is an enlarged view of one of the wiring lines 210 that connects a pair of the intersection points 240 to each other. As illustrated in FIG. 31(*a*), the wiring line 210 does not linearly connect the pair of the intersection points 240 to each other (at the minimum distance). Regarding each of the multiple wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less. The average value is preferably 1.05 times or more and 1.30 times or less. The length of the wiring line 210 described herein means a length obtained by measuring, in the direction of the length of the wiring line 210, a line that passes through the center of the wiring line 210 in the width direction. The planar shape of each wiring line 210 may be a wavy curve. That is, the wiring line 210 intersects with a line $L_s$ that connects the pair of the intersection points 240 to each other at least at a single point between the intersection points 240, preferably at two or more and ten or less points. The wiring line 210 preferably does not intersect with the other wiring lines 210.

For example, it is assumed that one of the opening portions 23 is surrounded by N wiring lines 210. Here, N may be three or more and ten or less as described above. At this time, as for the N wiring lines 210, the ratio $(L_c/L_{min})$ of the length L of each wiring line 210 between the intersection points 240 to the minimum distance $L_{min}$ between the intersection points 240 is obtained. The average value $((M_1+M_2+\ldots+MN)/N)$ of the obtained ratio $(M_1, M_2, \ldots M_N)$ of the N wiring lines is 1.01 times or more and 1.82 times or less. As for the N wiring lines 210 that surround the one of the opening portions 23, the ratio $(L_c/L_{min})$ described above is preferably 1.01 times or more and 1.82 times or less. As for some of the wiring lines 210 among the N wiring lines 210, however, the ratio $(L_c/L_{min})$ described above may not be 1.01 times or more and 1.82 times or less provided that the average value of the ratio of the N wiring lines is 1.01 times or more and 1.82 times or less. As for all of the opening portions 23 that are included in the mesh wiring layers 20, the average value described above is preferably 1.01 times or more and 1.82 times or less. However, this is not a limitation. As for some of the opening portions 23 that are included in the mesh wiring layers 20, the average value described above may not be 1.01 times or more and 1.82 times or less. Specifically, as for 80% or more, 90% or more, 95% or more, or 99% or more opening portions 23 among the multiple opening portions 23 that are included in the mesh wiring layers 20, the average value described above is preferably 1.01 times or more and 1.82 times or less.

In FIG. 31(*a*), the planar shape of each wiring line 210 is a sine curve. In this case, the amplitude A1 of the sine curve that each wiring line 210 has may be equal to or more than 0.02 times and equal to or less than 0.06 times, preferably equal to or more than 0.03 times and equal to or less than 0.05 times the minimum distance $L_{min}$ between the intersection points 240. The wavelength $\lambda_1$ of the sine curve that each wiring line 210 has may be equal to or more than 0.16 times and equal to or less than 0.5 times, preferably equal to or more than 0.2 times and equal to or less than 0.33 times the minimum distance $L_{min}$ between the intersection points 240. The value of the minimum distance $L_{min}$/the wavelength $\lambda_1$ may be uniform among the multiple wiring lines 210 in the mesh wiring layers 20. The value of the minimum distance $L_{min}$/the wavelength $\lambda_1$ may be a natural number of 2 or more and 10 or less. In FIG. 31(*a*), the value of the minimum distance $L_{min}$/the wavelength $\lambda_1$ is 3. The amplitude $A_1$ of each wiring line 210 may be uniform among the multiple wiring lines 210 in the mesh wiring layers 20. The amplitude $A_1$ and wavelength $\lambda_1$ of each wiring line 210 may be uniform among the multiple wiring lines 210 in the mesh wiring layers 20.

As illustrated in FIG. 31(*b*), the planar shape of each wiring line 210 may be a wavy curve the amplitude and the wavelength of which are inconstant. The amplitude or the wavelength of the wavy curve may be constant and the other of the amplitude or the wavelength may be inconstant. As illustrated in FIG. 31(*c*), the planar shape of each the wiring line 210 may be a sawtooth-shaped or jagged line that has no curve. The planar shape of each wiring line 210 may be a Bezier curve or a curve into which multiple arcs are connected although this is not illustrated.

Regarding each of the multiple wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less as described above. This enables flicker when the mesh wiring layers 20 reflect light to be reduced.

Figure 32:
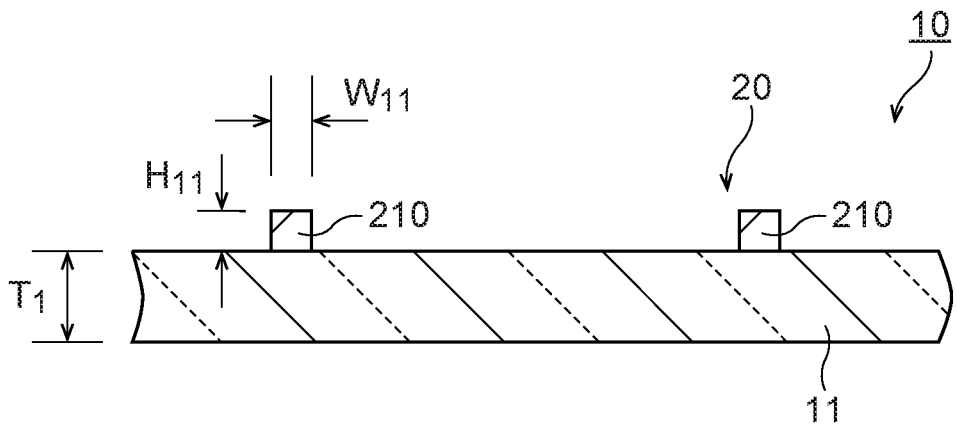
FIG. 32 is a sectional view (a sectional view taken along line XXXII-XXXII in FIG. 30) of the wiring board according to the third embodiment.

As illustrated in FIG. 32, a section of each wiring line 210 perpendicular to the longitudinal direction thereof has a substantially rectangular shape or a substantially square shape. In this case, the shape of the section of each wiring line 210 is substantially uniform in the longitudinal direction of the wiring line 210. The shape of the section of each wiring line 210 may be the same as the other multiple wiring lines 210 that are included in the mesh wiring layers 20. The shape of the section of each wiring line 210 may not necessarily be a substantially rectangular shape or a substantially square shape but may be, for example, a substantially trapezoid shape a front surface (that is, in the positive Z-direction) of which is narrower than a back surface (that is, in the negative Z-direction) or a shape in which both side surfaces in the width direction are curved.

According to the present embodiment, the linewidths $W_{11}$ (see FIG. 32) of the wiring lines 210 are not particularly limited but may be appropriately selected depending on use. For example, the linewidths $W_{11}$ of the wiring lines 210 can be selected from a range of 0.1 μm or more and 5.0 μm or less and may be 0.5 μm or more and 3.0 μm or less. The heights $H_{11}$ (lengths in the Z-direction, see FIG. 32) of the wiring lines 210 are not particularly limited but can be appropriately selected depending on use. For example, the heights $H_{11}$ of the wiring lines 210 may be 0.1 μm or more and 5.0 μm or less or may be 0.2 μm or more and 2.0 μm or less.

The materials of the wiring lines 210 are conductive metal materials. According to the present embodiment, the materials of the wiring lines 210 are copper but are not limited thereto. Examples of the materials of the wiring lines 210 can include metal materials (including alloys) such as gold, silver, copper, platinum, tin, aluminum, iron, and nickel. The wiring lines 210 may be plating layers that are formed by using the electroplating method.

Referring to FIG. 29 again, the power supply portions 40 are electrically connected to the mesh wiring layers 20. The power supply portions 40 are electrically connected to a wireless communication circuit 92 of the image display apparatus 90 when the wiring board 10 is incorporated into the image display apparatus 90 (see FIG. 34). The power supply portions 40 are provided on the front surface of the substrate 11 but are not limited thereto. Some or all of the power supply portions 40 may be located outside the periphery of the substrate 11. The power supply portions 40 may be flexible such that the power supply portions 40 extend to the side surface or back surface of the image display apparatus 90 and may be electrically connected at the side surface or back surface.

[Method of Manufacturing Wiring Board]

A method of manufacturing the wiring board according to the present embodiment will now be described with reference to FIG. 33(a) to FIG. 33(f). FIG. 33(a) to FIG. 33(f) illustrate a sectional view for the method of manufacturing the wiring board according to the present embodiment.

Figure 33A:
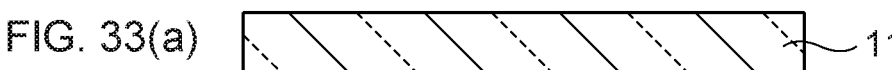
FIG. 33(*a*) to FIG. 33(*f*) are sectional views for a method of manufacturing the wiring board according to the third embodiment.

As illustrated in FIG. 33(a), the substrate 11 that is transparent is prepared.

Subsequently, the mesh wiring layers 20 that have an aperiodic planar structure and that include the multiple wiring lines 210 are formed on the substrate 11.

Figure 33B:
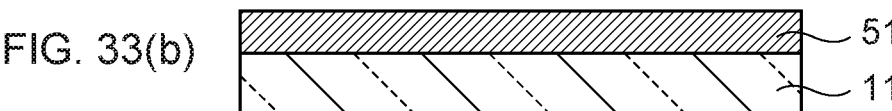

At this time, as illustrated in FIG. 33(b), the metal foil 51 is first stacked substantially over the entire region of the front surface of the substrate 11. According to the present embodiment, the thickness of the metal foil 51 may be 0.1 μm or more and 5.0 μm or less. According to the present embodiment, the metal foil 51 may contain copper.

Figure 33C:
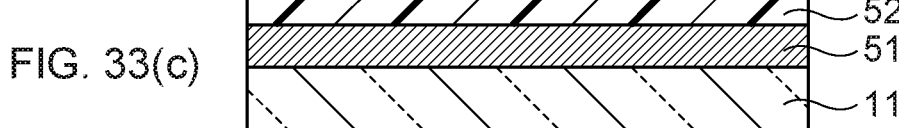

Subsequently, as illustrated in FIG. 33(c), the photocurable insulating resist 52 is applied to the entire region of the front surface of the metal foil 51. Examples of the photocurable insulating resist 52 include organic resin such as acrylic resin and epoxy resin.

Figure 33D:
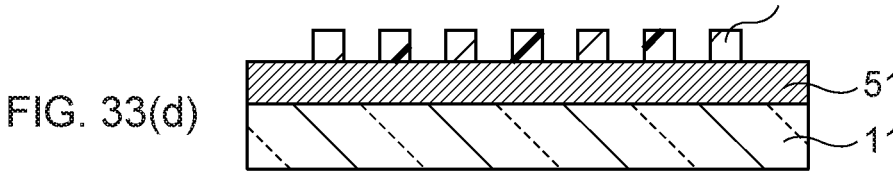

Subsequently, as illustrated in FIG. 33(d), the insulating layer 54 is formed by using the photolithography method. In this case, the photocurable insulating resist 52 is patterned by using the photolithography method, and the insulating layer 54 (the resist pattern) is formed. At this time, the insulating layer 54 is formed such that the metal foil 51 that corresponds to the wiring lines 210 is exposed.

Figure 33E:
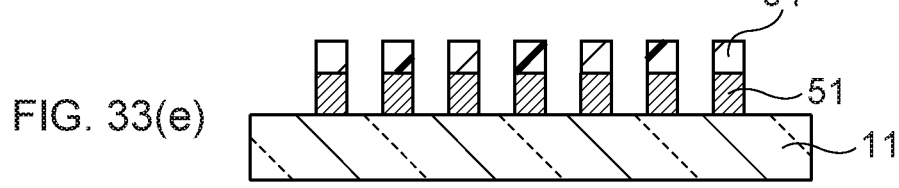

Subsequently, as illustrated in FIG. 33(e), a portion of the metal foil 51 on the front surface of the substrate 11 that is not covered by the insulating layer 54 is removed. At this time, wet processing is performed by using strong acid such as ferric chloride, cupric chloride, sulfuric acid or hydrochloric acid, persulfate, hydrogen peroxide, an aqueous solution thereof, or a combination thereof, and consequently, the metal foil 51 is etched such that the front surface of the substrate 11 is exposed.

Figure 33F:
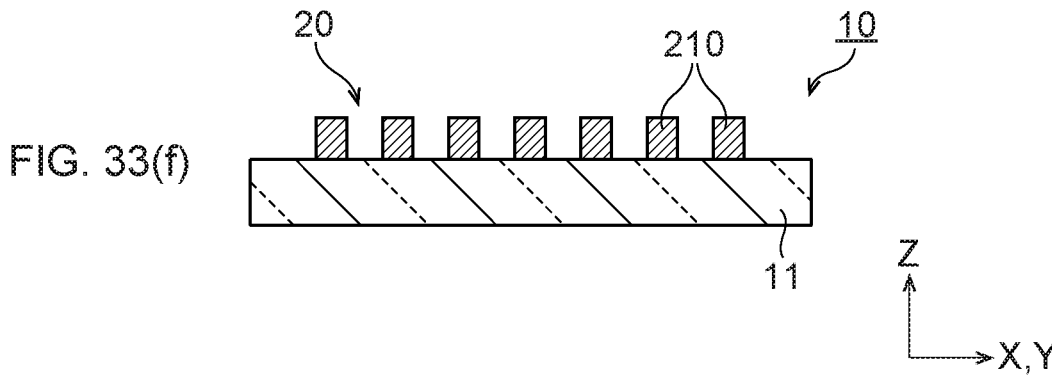

Subsequently, as illustrated in FIG. 33(f), the insulating layer 54 is removed. In this case, wet processing is performed by using a permanganate solution, N-methyl-2-pyrrolidone, an acid or alkali solution, or dry processing is performed by using oxygen plasma, and consequently, the insulating layer 54 on the metal foil 51 is removed.

In this way, the wiring board 10 that includes the substrate 11 and the mesh wiring layers 20 that are provided on the substrate 11 is obtained. In this case, the mesh wiring layers 20 have an aperiodic planar structure. The mesh wiring layers 20 include the multiple wiring lines 210. At this time, the power supply portions 40 may be formed by using a portion of a conductor 55. Alternatively, the power supply portions 40 that have a plate shape may be prepared, and the power supply portions 40 may be electrically connected to the mesh wiring layers 20.

Actions According to Present Embodiment

The actions of the wiring board that is thus configured will now be described.

Figure 34:
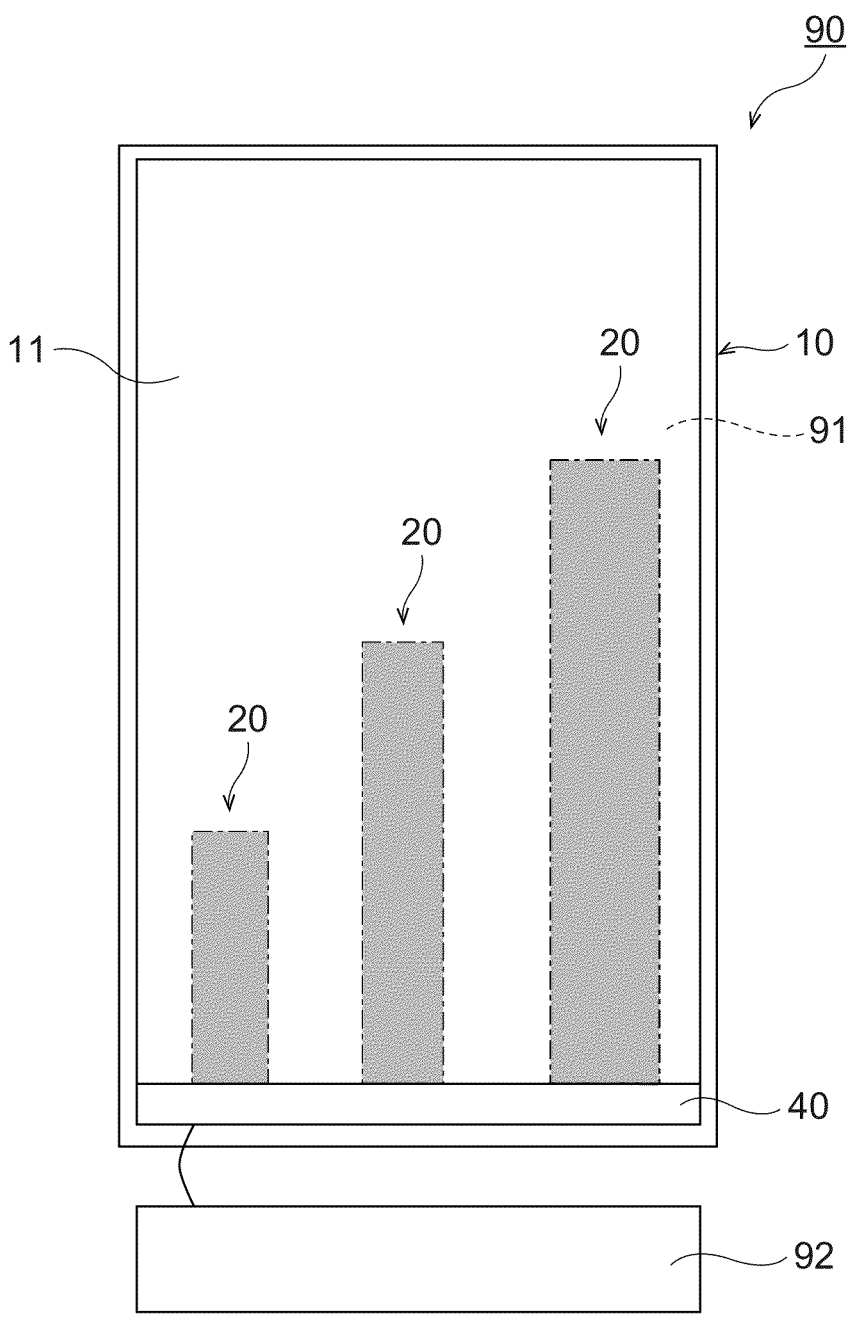
FIG. 34 is a plan view of an image display apparatus according to the third embodiment.

As illustrated in FIG. 34, the wiring board 10 is incorporated into the image display apparatus 90 that includes the display device (display) 91. An example of the display device 91 may be an organic EL (Electro Luminescence) display device. For example, the display device 91 may include a metal layer, a support base material, a resin base material, a thin film transistor (TFT), and an organic EL layer, not illustrated. A touch sensor, not illustrated, may be disposed on the display device 91. The display device 91 is not limited to an organic EL display device. For example, the display device 91 may be another display device that has a function of exhibiting luminescence itself. The display device 91 may be a micro LED display device that includes a micro LED element (a light-emitting body). The display device 91 may be a liquid-crystal display device that contains liquid crystal. The wiring board 10 is directly or indirectly disposed along the display device 91. Examples of the image display apparatus 90 can include mobile terminal devices such as a smart phone and a tablet. The mesh wiring layers 20 of the wiring board 10 are electrically connected to the wireless communication circuit 92 of the image display apparatus 90 with the power supply portions 40 interposed therebetween. In this way, a radio wave at a predetermined frequency can be transmitted and received by using the mesh wiring layers 20, and the use of the image display apparatus 90 enables communication. According to the present embodiment, the image display apparatus 90 that includes the display device 91 and the wiring board 10 that is disposed on the display device 91 is also provided.

As for the image display apparatus 90, the mesh wiring layers 20 of the wiring board 10 overlap pixels (not illustrated) of the display device 91 of the image display apparatus 90 in the Z-direction. In this case, if the wiring lines 210 of the mesh wiring layers 20 have regularity (periodicity), there is a possibility that a stripe pattern (the moire pattern, or the interference stripes) is formed due to the regularity (periodicity) of the wiring lines 210 and the regularity (periodicity) of the pixels of the display device 91.

According to the present embodiment, however, the mesh wiring layers 20 have an aperiodic planar structure. Consequently, the wiring lines 210 of the mesh wiring layers 20 and the pixels of the display device 91 are irregularly arranged when viewed in the Z-direction. For this reason, the moire pattern is inhibited from being formed due to the regularity (periodicity) of the wiring lines 210 and the regularity (periodicity) of the pixels.

In particular, according to the present embodiment, the aperiodic planar structure that the mesh wiring layers 20 have may be a Voronoi pattern. This enables the moire pattern to be more effectively inhibited from being formed when the wiring board 10 is stacked with the display device 91 that includes the pixels that are regularly (periodically) arranged.

The mesh wiring layers 20 have an aperiodic planar structure, and consequently, the wiring lines 210 extend in various directions. In this case, there is a possibility that a phenomenon called the flicker occurs when light that is emitted to the wiring board 10 is reflected. It is thought that the flicker occurs because the light is reflected to the wiring lines 210 in some directions with the multiple wiring lines 210 that have certain lengths or more linearly extending.

According to the present embodiment, however, the wiring lines 210 do not linearly connect the intersection points 240 of the mesh wiring layers 20 to each other. That is, regarding each of the multiple wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less. The length of the wiring line 210 between the intersection points 240 is thus more than the minimum distance $L_{min}$, and consequently, the directions of reflection are more densely dispersed. This enables the flicker described above to be reduced.

In particular, according to the present embodiment, the planar shape of each wiring line 210 may be a sine curve. In this case, the directions of reflection of the light due to the wiring lines 210 can be more densely dispersed, and the flicker can be further reduced.

According to the present embodiment, the mesh wiring layers 20 have an aperiodic planar structure as described above. Regarding each of the multiple wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less. Consequently, the wiring board 10 that reduces both of the formation of the moire pattern and the occurrence of the flicker is obtained.

According to the present embodiment, the linewidths of the wiring lines 210 may be 0.1 μm or more and 5.0 μm or less. This enables the wiring lines 210 to be unlikely to be visible by the naked eye and enables the visibility of the display device 91 to be inhibited from reducing.

According to the present embodiment, the mesh wiring layers 20 may function as antenna. In this case, the mesh wiring layers 20 that serve as the antenna can be disposed along the front surface of the image display apparatus 90. For this reason, the performance of communication can be enhanced unlike the case where an antenna is contained in the image display apparatus 90. The multiple mesh wiring layers 20 that serve as the antenna can be disposed inside the surface of the image display apparatus 90, and accordingly, the performance of communication can be further enhanced.

In an example described according to the present embodiment, the mesh wiring layers 20 function as an antenna but are not limited thereto. For example, the mesh wiring layers 20 may fulfill the hovering function (the function of enabling the user to operate the display without a direct touch), or another function such as fingerprint authentication, heating, or noise cutting (shielding).

[Modification]

Modifications to the wiring board will now be described.

(First Modification)

Figure 35:
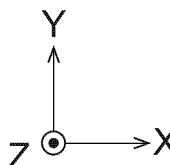
FIG. 35 is an enlarged plan view of a mesh wiring layer of a wiring board according to a first modification.

FIG. 35 illustrates a first modification to the wiring board. The modification illustrated in FIG. 35 differs therefrom in that the aperiodic planar structure that the mesh wiring layers 20 have is changed, and the other components are substantially the same as those according to the embodiment illustrated in FIG. 29 to FIG. 34 described above. In FIG. 35, components like to those according to the embodiment illustrated in FIG. 29 to FIG. 34 are designated by using like reference signs, and a detailed description is omitted.

As for the wiring board 10 illustrated in FIG. 35, the mesh wiring layers 20 have an aperiodic planar structure (random intersection point mesh). In the aperiodic planar structure, intersection points that are periodically arranged are randomly shifted in various directions at a distance shorter than a predetermined distance. Regarding each of the multiple (four) wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less.

The patterns of the mesh wiring layers 20 illustrated in FIG. 35 are obtained in the following manner. For example, wiring lines 210a are first temporarily arranged such that multiple intersection points 24a are temporarily arranged so as to be periodic in predetermined directions (for example, the X-direction and the Y-direction). Subsequently, the intersection points 24a temporarily arranged are randomly shifted in various directions at a distance shorter than a predetermined distance (for example, the minimum distance between the intersection points 24a that are adjacent to each other and that are temporarily arranged). The distance at which the intersection points 24a temporarily arranged are shifted is randomly changed.

Consequently, the patterns of the mesh wiring layers 20 illustrated in FIG. 35 are formed. In FIG. 35, the mesh wiring layers 20 include the multiple intersection points 240 and the wiring lines 210 that are located between the intersection points 240. Regarding each of the multiple (four) wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less. According to the present modification, the planar shape of each wiring line 210 is a sine curve, but the planar shape of each wiring line 210 may be any one of the various shapes described above. The wiring lines 210 are thus arranged such that the multiple intersection points 240 are irregularly arranged, and consequently, the moire pattern can be reduced.

According to the present modification, the mesh wiring layers 20 have an aperiodic planar structure. Regarding each of the multiple (four) wiring lines 210 that surround the opening portions 23, when the ratio of the length of the wiring line 210 between the intersection points 240 to the minimum distance $L_{min}$ between the intersection points 240 is obtained, the average value thereof is 1.01 times or more and 1.82 times or less. Consequently, the wiring board 10 that reduces both of the formation of the moire pattern and the occurrence of the flicker is obtained.

(Second Modification)

Figure 36:
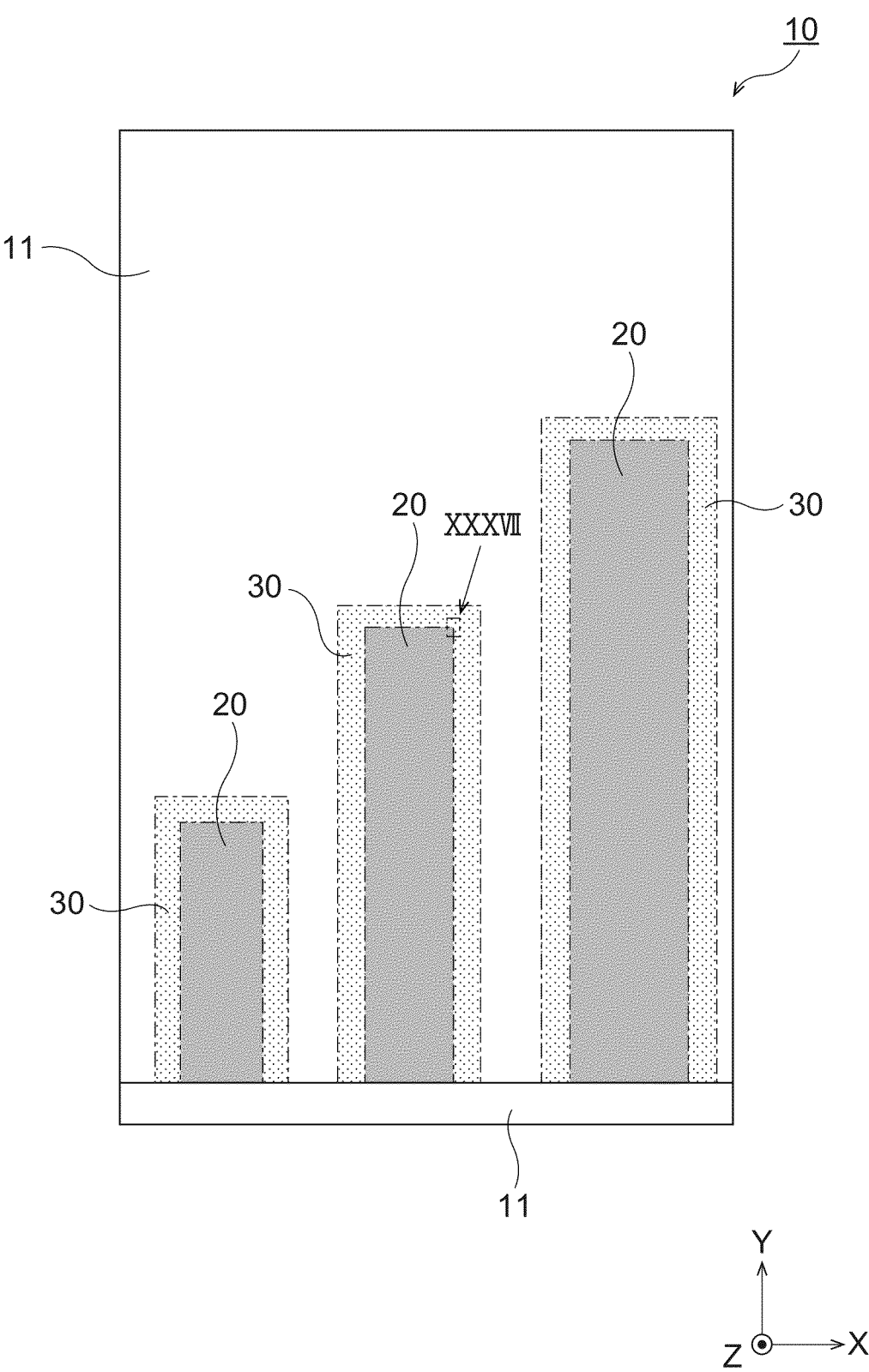
FIG. 36 is a plan view of a wiring board according to a second modification.
Figure 37:
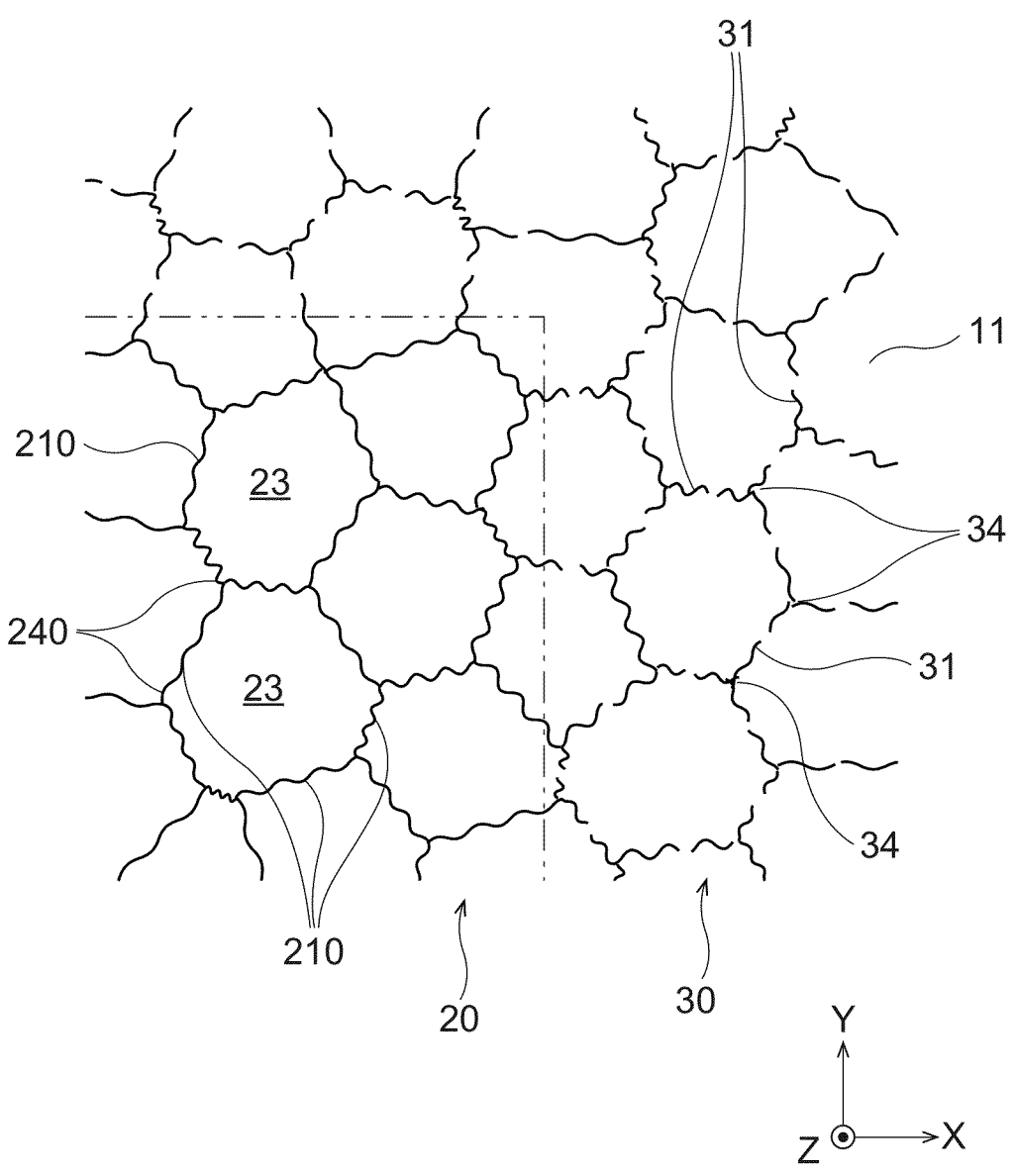
FIG. 37 is an enlarged plan view (an enlarged view of a portion XXXVII in FIG. 36) of a mesh wiring layer of the wiring board according to the second modification.

FIG. 36 and FIG. 37 illustrate a second modification to the wiring board. The modification illustrated in FIG. 36 and FIG. 37 differs therefrom in including the dummy wiring layers 30 that are provided around the mesh wiring layers 20, and the other components are substantially the same as those according to the embodiment illustrated in FIG. 29 to FIG. 34 described above. In FIG. 36 and FIG. 37, components like to those according to the embodiment illustrated in FIG. 29 to FIG. 34 are designated by using like reference signs, and a detailed description is omitted.

As for the wiring board 10 illustrated in FIG. 36, the dummy wiring layers 30 are provided around the mesh wiring layers 20. The dummy wiring layers 30 are provided around the mesh wiring layers 20 except for edges facing the power supply portions 40. The peripheries of the mesh wiring layers 20 may be entirely surrounded by the dummy wiring layers 30. The dummy wiring layers 30 do not function as an antenna substantially unlike the mesh wiring layers 20.

As illustrated in FIG. 37, the dummy wiring layers 30 have an aperiodic planar structure that is substantially the same as that of the mesh wiring layers 20 and have a shape obtained by removing a portion of the planar structure. For example, in FIG. 37, the dummy wiring layers 30 have the same Voronoi pattern as the mesh wiring layers 20. The dummy wiring layers 30 have multiple intersection points 34 and wiring lines 31 that are located between the intersection points 34. In this case, the wiring lines 31 do not continuously connect the intersection points 34 to each other, and portions of the wiring lines 31 are removed unlike the wiring lines 210 of the mesh wiring layers 20. Consequently, the wiring lines 31 are electrically separated from the mesh wiring layers 20, the power supply portions 40, and the other wiring lines 31. If the removed portions described above are not present, regarding each of the multiple wiring lines 31 that surround the opening portions, when the ratio of the length of the wiring line 31 between the intersection points 34 to the minimum distance between the intersection points 34 is obtained, the average value thereof is 1.01 times or more and 1.82 times or less. Portions of the intersection points 34 may be removed.

The dummy wiring layers 30 have a shape obtained by removing a portion of the aperiodic planar structure that is substantially the same as that of the mesh wiring layers 20, and consequently, differences between the mesh wiring layers 20 and the dummy wiring layers 30 are unlikely to be visually recognized. This enables the mesh wiring layers 20 that are disposed on the substrate 11 to be unlikely to be visible. The aperture ratios of the dummy wiring layers 30 may be higher than the aperture ratios of the mesh wiring layers 20.

The dummy wiring layers 30 that are electrically separated from the mesh wiring layers 20 are thus disposed, and consequently, the outer edges of the mesh wiring layers 20 can be more unclear. Consequently, the mesh wiring layers 20 are unlikely to be visible on the front surface of the image display apparatus 90, and the mesh wiring layers 20 can be unlikely to be recognized by the naked eye of the user of the image display apparatus 90.

EXAMPLES

Specific examples according to the embodiment described above will now be described.

Example C1

A wiring board (an example C1) that included a substrate and mesh wiring layers was manufactured. The aperiodic planar structure of the mesh wiring layers was random intersection point mesh. The average value of the minimum distance between intersection points of the mesh wiring layers was 100 µm. The planar shape of each of wiring lines was a sine curve. The average amplitude of the sine curve of each wiring line was 2 µm, and the average wavelength was 50 µm. Regarding each of the multiple wiring lines that surrounded the opening portions, when the ratio of the length (line length) of the wiring line between the intersection points to the minimum distance between the intersection points was obtained, the average value thereof was 1.016 times.

Example C2

A wiring board (an example C2) was manufactured in the same manner as in the example C1 except that the average amplitude of the sine curve of each wiring line was 4 µm. Regarding each of the multiple wiring lines that surrounded the opening portions, when the ratio of the length (line length) of the wiring line between the intersection points to the minimum distance between the intersection points was obtained, the average value thereof was 1.060 times.

Example C3

A wiring board (an example C3) was manufactured in the same manner as in the example C1 except that the average wavelength of the sine curve of each wiring line was 25 µm. Regarding each of the multiple wiring lines that surrounded the opening portions, when the ratio of the length (line length) of the wiring line between the intersection points to the minimum distance between the intersection points was obtained, the average value thereof was 1.060 times.

Example C4

A wiring board (an example C4) was manufactured in the same manner as in the example C1 except that the average amplitude of the sine curve of each wiring line was 4 µm, and the average wavelength was 25 µm. Regarding each of the multiple wiring lines that surrounded the opening portions, when the ratio of the length (line length) of the wiring line between the intersection points to the minimum distance between the intersection points was obtained, the average value thereof was 1.217 times.

Example C5

A wiring board (an example C5) was manufactured in the same manner as in the example C1 except that the average amplitude of the sine curve of each wiring line was 6 μm, and the average wavelength was 16.7 μm. Regarding each of the multiple wiring lines that surrounded the opening portions, when the ratio of the length (line length) of the wiring line between the intersection points to the minimum distance between the intersection points was obtained, the average value thereof was 1.811 times.

Example C6

A wiring board (an example C6) was manufactured in the same manner as in the example C1 except that the average value of the minimum distance between the intersection points of the mesh wiring layers was 200 μm, and the average amplitude of the sine curve of each wiring line was 4 μm. Regarding each of the multiple wiring lines that surrounded the opening portions, when the ratio of the length (line length) of the wiring line between the intersection points to the minimum distance between the intersection points was obtained, the average value thereof was 1.016 times.

Example C7

A wiring board (an example C7) was manufactured in the same manner as in the example C1 except that the aperiodic planar structure of the mesh wiring layers was a Voronoi pattern, the average value of the minimum distance between the intersection points of the mesh wiring layers was 200 μm, and the average amplitude of the sine curve of each wiring line was 4 μm. Regarding each of the multiple wiring lines that surrounded the opening portions, when the ratio of the length (line length) of the wiring line between the intersection points to the minimum distance between the intersection points was obtained, the average value thereof was 1.016 times.

Comparative Example C1

A wiring board (a comparative example C1) was manufactured in the same manner as in the example C1 except that the average amplitude of the sine curve of each wiring line was 1 μm. Regarding each of the multiple wiring lines that surrounded the opening portions, when the ratio of the length (line length) of the wiring line between the intersection points to the minimum distance between the intersection points was obtained, the average value thereof was 1.004 times.

Comparative Example C2

A wiring board (a comparative example C2) was manufactured in the same manner as in the example C1 except that the average wavelength of the sine curve of each wiring line was 100 μm. Regarding each of the multiple wiring lines that surrounded the opening portions, when the ratio of the length (line length) of the wiring line between the intersection points to the minimum distance between the intersection points was obtained, the average value thereof was 1.004 times.

Comparative Example C3

A wiring board (a comparative example C3) was manufactured in the same manner as in the example C1 except that the average value of the minimum distance between the intersection points of the mesh wiring layers was 200 μm, and the average wavelength of the sine curve of each wiring line was 100 μm. Regarding each of the multiple wiring lines that surrounded the opening portions, when the ratio of the length (line length) of the wiring line between the intersection points to the minimum distance between the intersection points was obtained, the average value thereof was 1.004 times.

Comparative Example C4

A wiring board (a comparative example C4) was manufactured in the same manner as in the example C1 except that the aperiodic planar structure of the mesh wiring layers was a Voronoi pattern, and the average wavelength of the sine curve of each wiring line was 100 μm. Regarding each of the multiple wiring lines that surrounded the opening portions, when the ratio of the length (line length) of the wiring line between the intersection points to the minimum distance between the intersection points was obtained, the average value thereof was 1.004 times.

Subsequently, as for the wiring boards in the examples C1 to C7 and the comparative examples C1 to C4, whether both of the formation of the moire pattern and the occurrence of the flicker were reduced was visually checked. A wiring board that effectively reduced both of the formation of the moire pattern and the occurrence of the flicker was evaluated as "High", and a wiring board that less effectively reduced these was evaluated as "Low". The results of these are illustrated in Table 5.

TABLE 5

| Example | Type | Average minimum distance between intersection points (μm) | Average amplitude (μm) | Average wavelength (μm) | Average amplitude/ average minimum distance between intersection points | Average wavelength/ average minimum distance between intersection points | Average line length/ average minimum distance between intersection points | Reduction in moire pattern and flicker |
|---|---|---|---|---|---|---|---|---|
| Example C1 | Random intersection point | 100 | 2 | 50 | 0.02 | 0.50 | 1.016 | High |
| Example C2 | Random intersection point | 100 | 4 | 50 | 0.04 | 0.50 | 1.060 | High |
| Example C3 | Random intersection point | 100 | 2 | 25 | 0.02 | 0.25 | 1.060 | High |

TABLE 5-continued

| Example | Type | Average minimum distance between intersection points (μm) | Average amplitude (μm) | Average wavelength (μm) | Average amplitude/ average minimum distance between intersection points | Average wavelength/ average minimum distance between intersection points | Average line length/ average minimum distance between intersection points | Reduction in moire pattern and flicker |
|---|---|---|---|---|---|---|---|---|
| Example C4 | Random intersection point | 100 | 4 | 25 | 0.04 | 0.25 | 1.217 | High |
| Example C5 | Random intersection point | 100 | 6 | 16.7 | 0.06 | 0.17 | 1.811 | High |
| Example C6 | Random intersection point | 200 | 4 | 50 | 0.02 | 0.25 | 1.016 | High |
| Example C7 | Voronoi | 200 | 4 | 50 | 0.02 | 0.25 | 1.016 | High |
| Comparative example C1 | Random intersection point | 100 | 1 | 50 | 0.01 | 0.50 | 1.004 | Low |
| Comparative example C2 | Random intersection point | 100 | 2 | 100 | 0.02 | 1.00 | 1.004 | Low |
| Comparative example C3 | Random intersection point | 200 | 2 | 100 | 0.01 | 0.50 | 1.004 | Low |
| Comparative example C4 | Voronoi | 200 | 2 | 100 | 0.01 | 0.50 | 1.004 | Low |

In this way, it is proved that the wiring boards in the examples C1 to C7 more effectively reduce both of the formation of the moire pattern and the occurrence of the flicker than the wiring boards in the comparative examples C1 to C4.

Multiple components disclosed according to the embodiments and the modifications described above can be appropriately combined as needed. Among all of the components disclosed according to the embodiments and the modifications described above, some of the components may be removed.

The invention claimed is:

1. A wiring board comprising:
a substrate that has a first surface and a second surface that is opposite the first surface; and
a mesh wiring layer that is disposed on the first surface of the substrate,
wherein the wiring board has an electromagnetic wave transceiver function,
wherein the substrate is transparent,
wherein the mesh wiring layer serves as an antenna and includes a wiring line,
wherein two or more opening portions are formed by being surrounded by the wiring line,
wherein a planar shape of each of the opening portions is a polygonal shape that has opposing sides parallel with each other, and
wherein 95% or more opening portions among 100 opening portions or all of the opening portions
satisfy a relationship of
$0.70D \leq d \leq 0.98D$ or
satisfy a relationship of
$1.02D \leq d \leq 1.30D$, where
d is distances between sides that extend in a first direction regarding the opening portions, and
D is an average value of the distances between the sides that extend in the first direction regarding the 100 opening portions continuously adjacent to each other or all of the opening portions.

2. The wiring board according to claim 1, wherein the 95% or more opening portions among the 100 opening portions or all of the opening portions satisfy a relationship of
$0.85D \leq d \leq 0.98D$ or
satisfy a relationship of
$1.02D \leq d \leq 1.15D$.

3. The wiring board according to claim 1, wherein the 95% or more opening portions among the 100 opening portions or all of the opening portions
satisfy a relationship of
$0.90D \leq d \leq 0.98D$ or satisfy a relationship of
$1.02D \leq d \leq 1.10D$.

4. The wiring board according to claim 1, wherein the polygonal shape is a quadrilateral shape.

5. The wiring board according to claim 1, wherein the polygonal shape is a hexagonal shape.

6. The wiring board according to claim 1, wherein the average value D is 50 μm or more and 500 μm or less.

7. The wiring board according to claim 1, wherein a linewidth of the wiring line is 0.5 μm or more and 3 μm or less.

8. The wiring board according to claim 1, wherein an aperture ratio of the mesh wiring layer as a whole is 95% or more and less than 100%.

9. The wiring board according to claim 1, wherein a sheet resistance value of the mesh wiring layer is 4Ω/□ or less.

10. The wiring board according to claim 1, wherein the wiring board has a millimeter wave transceiver function, and the mesh wiring layer serves as an array antenna that includes two or more antenna elements.

11. The wiring board according to claim 10, wherein four or more of the antenna elements are provided, and distances between the antenna elements are 1 mm or more and 5 mm or less.

12. The wiring board according to claim 1, wherein a dummy wiring layer that is electrically separated from the mesh wiring layer is provided around the mesh wiring layer.

13. The wiring board according to claim 12, wherein the dummy wiring layer includes two or more dummy wiring lines, and the dummy wiring lines are parallel with the wiring line.

14. The wiring board according to claim 12, wherein two or more of the dummy wiring layers are provided, and aperture ratios of the mesh wiring layer and the dummy wiring layers increase stepwise in order from the mesh wiring layer to the dummy wiring layers far from the mesh wiring layer.

15. A module comprising: the wiring board according to claim 1; and a power supply line that is electrically connected to the wiring board.

16. An image display apparatus comprising: the module according to claim 15; and a display device that is stacked with the wiring board of the module.

17. A wiring board comprising:

a substrate that has a first surface and a second surface that is opposite the first surface;

a mesh wiring layer that is disposed on the first surface of the substrate; and a power supply portion that is electrically connected to the mesh wiring layer, wherein the substrate is transparent, wherein the mesh wiring layer includes a transmission portion that is connected to the power supply portion and a transceiver portion that is connected to the transmission portion, wherein the mesh wiring layer includes a wiring line that serves as the transmission portion and the transceiver portion, wherein two or more opening portions are formed by being surrounded by the wiring line, wherein a planar shape of each of the opening portions is a polygonal shape that has opposing sides parallel with each other, and wherein 95% or more opening portions among 100 opening portions or all of the opening portions satisfy a relationship of $0.70D \leq d \leq 0.98D$ or satisfy a relationship of $1.02D \leq d \leq 1.30D$, where d is distances between sides that extend in a first direction regarding the opening portions, and D is an average value of the distances between the sides that extend in the first direction regarding the 100 opening portions continuously adjacent to each other or all of the opening portions.

18. A module comprising: the wiring board according to claim 17; and a power supply line that is electrically connected to the wiring board.

19. An image display apparatus comprising: the module according to claim 18; and a display device that is stacked with the wiring board of the module.

* * * * *